(12) United States Patent  (10) Patent No.: US 9,553,271 B2
Lim et al.  (45) Date of Patent: Jan. 24, 2017

(54) COMPOUND AND ORGANIC LIGHT-EMITTING DEVICE INCLUDING THE SAME

(71) Applicant: SAMSUNG DISPLAY CO., LTD., Yongin, Gyeonggi-do (KR)

(72) Inventors: Jin-O Lim, Yongin (KR); Hye-Jin Jung, Yongin (KR); Sang-Hyun Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 327 days.

(21) Appl. No.: 14/242,163

(22) Filed: Apr. 1, 2014

(65) Prior Publication Data

US 2015/0162540 A1   Jun. 11, 2015

(30) Foreign Application Priority Data

Dec. 11, 2013 (KR) .................. 10-2013-0154002

(51) Int. Cl.
*H01L 51/00* (2006.01)
*H01L 51/50* (2006.01)

(52) U.S. Cl.
CPC ....... *H01L 51/0058* (2013.01); *H01L 51/0054* (2013.01); *H01L 51/0072* (2013.01);
(Continued)

(58) Field of Classification Search
None
See application file for complete search history.

(56) References Cited

U.S. PATENT DOCUMENTS 7,053,255 B2   5/2006 Ikeda et al.
7,233,019 B2   6/2007 Ionkin et al.
(Continued)

FOREIGN PATENT DOCUMENTS

KR   10-2005-0038634 A   4/2005
KR   10-2006-0006760 A   1/2006
KR   10-2011-0034984 A   4/2011

OTHER PUBLICATIONS

Machine English translation of Je et al. (KR 10-2011-0034984 A). Aug. 20, 2016.*

(Continued)

*Primary Examiner* — J. L. Yang
(74) *Attorney, Agent, or Firm* — Lee & Morse, P.C.

(57) ABSTRACT

A compound and an organic light-emitting device including the same, the compound being represented by Formula 1, below:

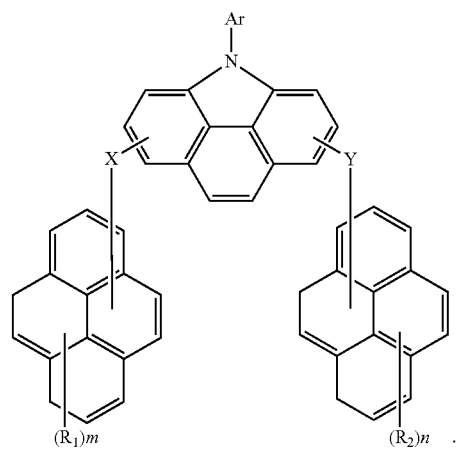

<Formula 1>

23 Claims, 1 Drawing Sheet

(52) U.S. Cl.
CPC ...... *H01L 51/0094* (2013.01); *H01L 51/0081* (2013.01); *H01L 51/5016* (2013.01)

(56) References Cited

U.S. PATENT DOCUMENTS

| | | |
|---|---|---|
| 2004/0253389 A1 | 12/2004 | Suzuki et al. |
| 2005/0002857 A1 | 1/2005 | Pez et al. |
| 2005/0156164 A1 | 7/2005 | Sotoyama |
| 2009/0019768 A1 | 1/2009 | Toseland et al. |
| 2013/0328021 A1* | 12/2013 | Lim .................. C07C 211/54 257/40 |
| 2014/0124748 A1* | 5/2014 | Kim .................. C07D 403/12 257/40 |

OTHER PUBLICATIONS

"A Novel Conjugated Polymer Based on 4H-Benzo[Def]Carbazole Backbone for OLED", 2009 Fall Assembly and Symposium, vol. 34, No. 2, 2009.

\* cited by examiner

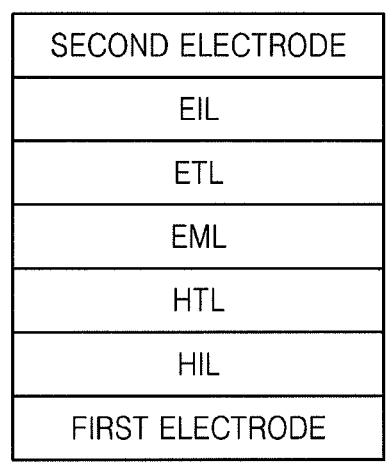

COMPOUND AND ORGANIC LIGHT-EMITTING DEVICE INCLUDING THE SAME

CROSS-REFERENCE TO RELATED APPLICATION

Korean Patent Application No. 10-2013-0154002, filed on Dec. 11, 2013, in the Korean Intellectual Property Office, and entitled: "Compound And Organic Light-Emitting Device Including The Same," is incorporated by reference herein in its entirety.

BACKGROUND

1. Field

Embodiments relate to a compound and an organic light-emitting device including the same.

2. Description of the Related Art

Organic light emitting devices are self-emission devices that have wide viewing angles, high contrast ratios, short response times, and excellent brightness, driving voltage, and response speed characteristics, and produce full-color images.

An organic light-emitting device may have a structure including a substrate, an anode on a substrate, and a hole transport layer, an emission layer, an electron transport layer, and a cathode, which are sequentially stacked on the anode. The hole transport layer, the emission layer, and the electron transport layer may be organic thin films formed of organic compounds.

An operating principle of an organic light-emitting device having such a structure is as follows.

When a voltage is applied between the anode and the cathode, holes injected from the anode may pass through the hole transport layer and migrate toward the emission layer, and electrons injected from cathode may pass through the electron transport layer and migrate toward the emission layer. Carriers, such as holes and electrons, may be recombined in the emission layer to produce excitons. Then, the excitons may be transitioned from an excited stated to a ground state, thereby generating light.

SUMMARY

Embodiments are directed to a compound and an organic light-emitting device including the same.

The embodiments may be realized by providing a compound represented by Formula 1, below:

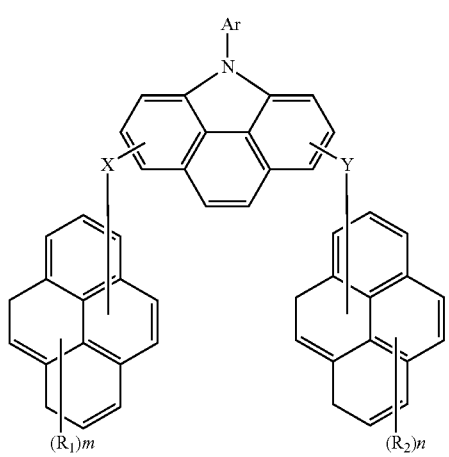

<Formula 1> wherein in Formula 1, $R_1$ and $R_2$ are each independently a hydrogen; a deuterium; a halogen; a cyano group; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a substituted or unsubstituted $C_1$-$C_{60}$ heteroaryl group; an amino group substituted with a $C_6$-$C_{60}$ aryl group or a $C_1$-$C_{60}$ heteroaryl group; or a substituted or unsubstituted $C_6$-$C_{60}$ condensed polycyclic group, when a plurality of the $R_1$ groups are present, the $R_1$ groups are identical to or different from each other, when a plurality of the $R_2$ groups are present, the $R_2$ groups are identical to or different from each other, m and n are each independently an integer of 1 to 9, Ar is a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, and X and Y are each independently a direct bond, a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group.

The compound represented by Formula 1 may be represented by Formula 2:

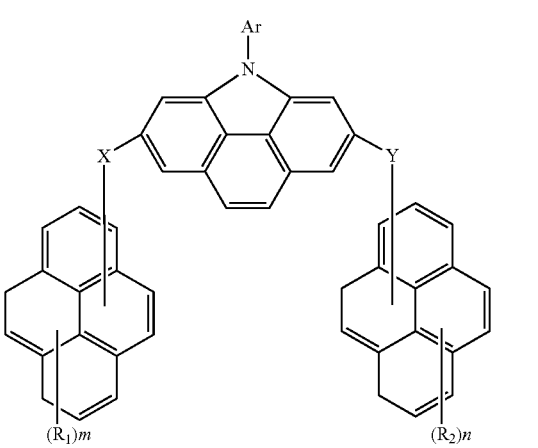

<Formula 2> in Formula 2, $R_1$, $R_2$, m, n, Ar, X, and Y are the same as defined with respect to Formula 1.

The compound represented by Formula 1 may be represented by Formula 3:

<Formula 3>

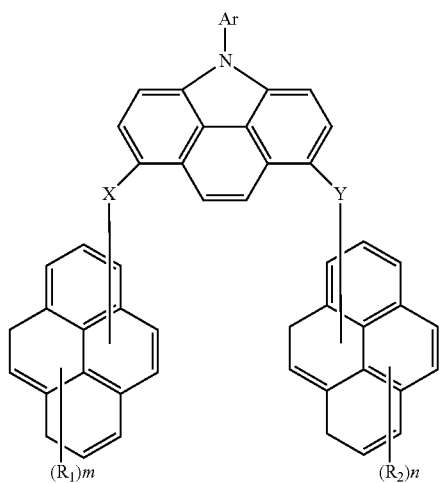

in Formula 3, $R_1$, $R_2$, m, n, Ar, X, and Y are the same as defined with respect to Formula 1.

$R_1$ and $R_2$ in Formula 1 are each independently a hydrogen or a deuterium.

Ar in Formula 1 is a group represented by one of Formulae 2a to 2h below:

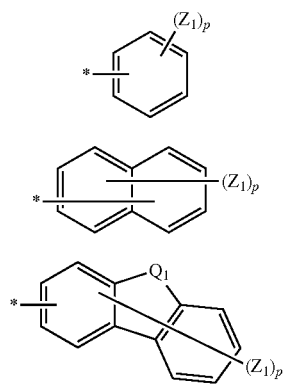

2a

2b

2c

2d

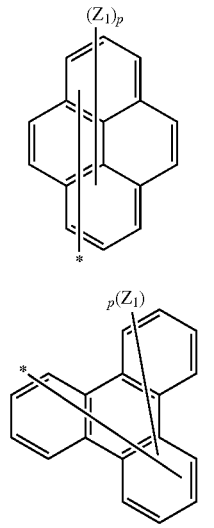

2e

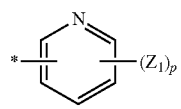

2f

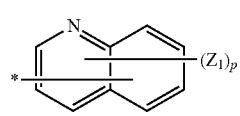

2g

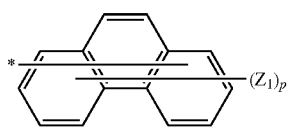

2h wherein in Formulae 2a to 2h, $Q_1$ is $—C(R_{31})(R_{32})—$; $Z_1$, $R_{31}$, and $R_{32}$ are each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, $—SiR_{41}R_{42}R_{43}$, a halogen atom, a cyano group, a nitro group, a hydroxyl group, or a carboxyl group; $R_{41}$, $R_{42}$, and $R_{43}$ are each independently a substituted or unsubstituted $C_1$-$C_{20}$ alkyl group or a substituted or unsubstituted $C_6$-$C_{20}$ aryl group; p is an integer of 1 to 11; and * indicates a binding site.

X and Y in Formula 1 are each independently a direct bond or a group represented by one of Formula 3a or Formula 3b, below:

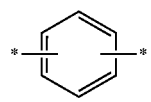

3a

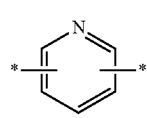

3b wherein in Formulae 3a and 3b, * indicates a binding site.

The compound represented by Formula 1 is any one of Compounds 1-68, below:

| | |
|---|---|
| 1 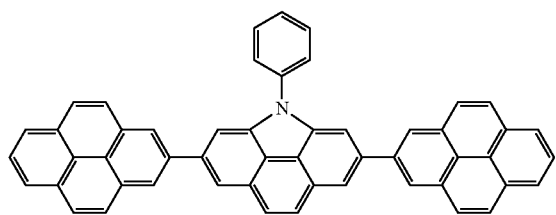 | 2 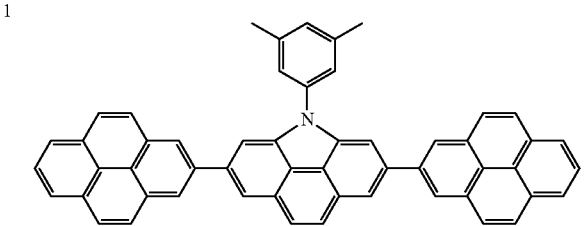 |
| 3 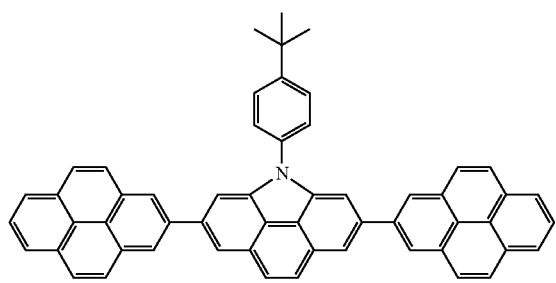 | 4 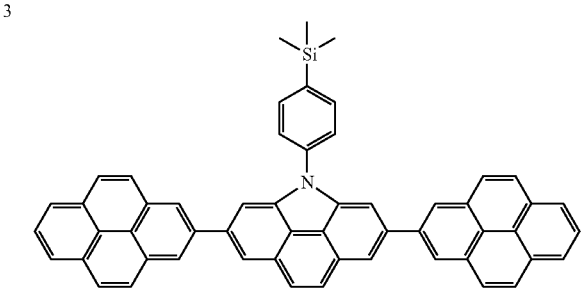 |
| 5 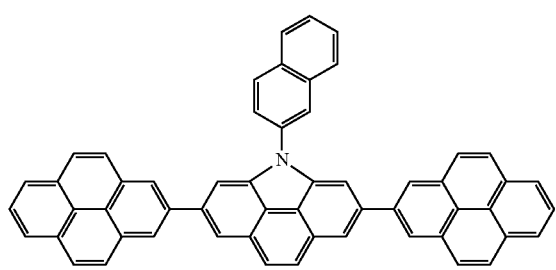 | 6 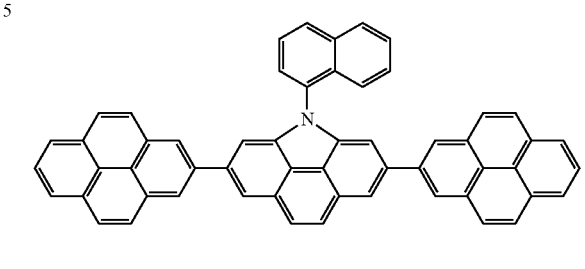 |
| 7 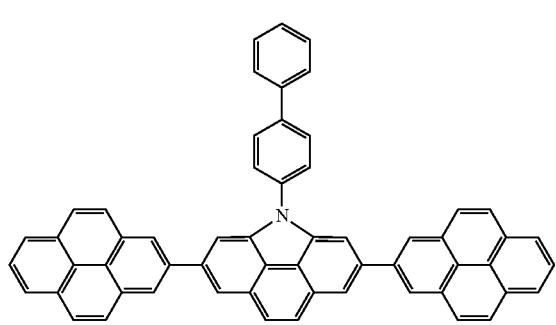 | 8 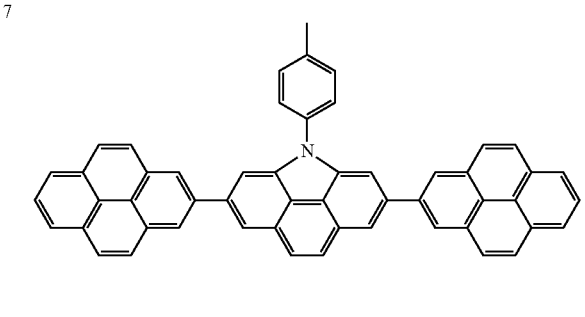 |
| 9 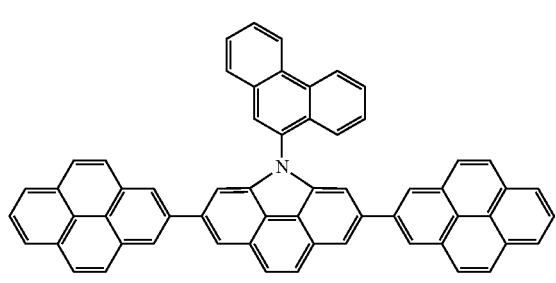 | 10 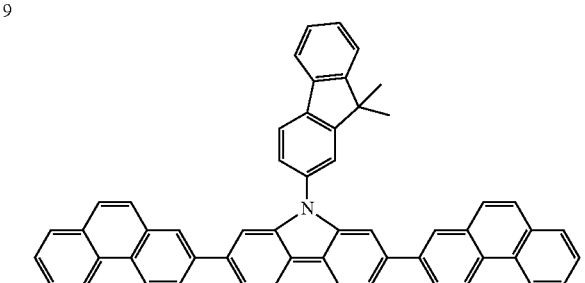 |

-continued
11
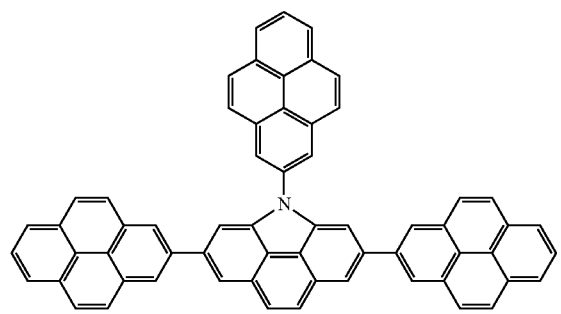
12
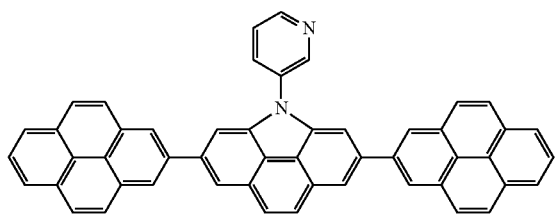
13
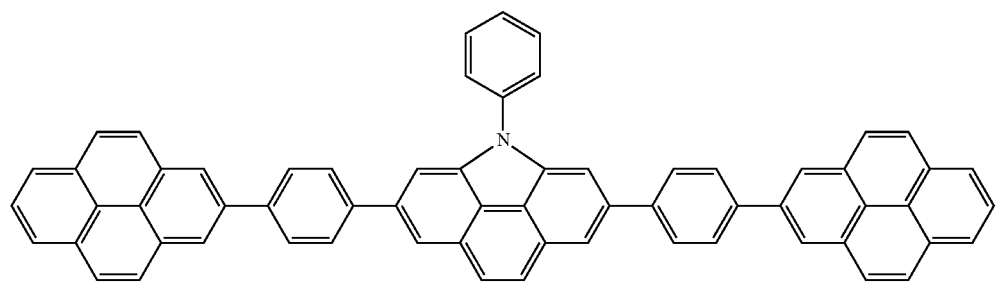
14
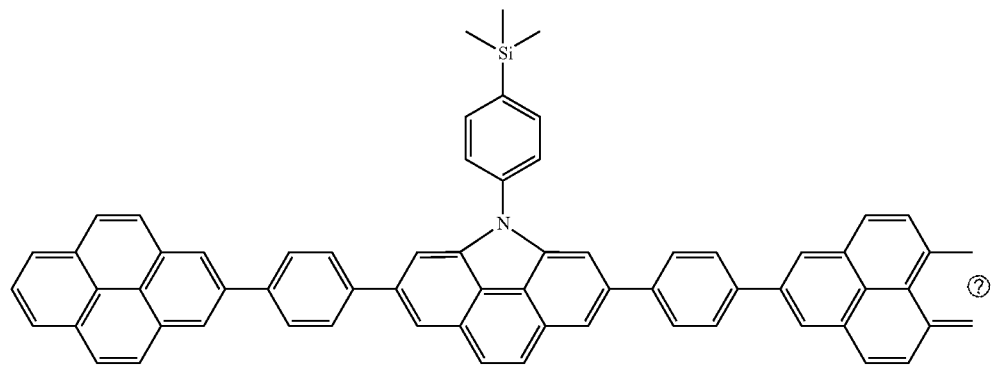
15
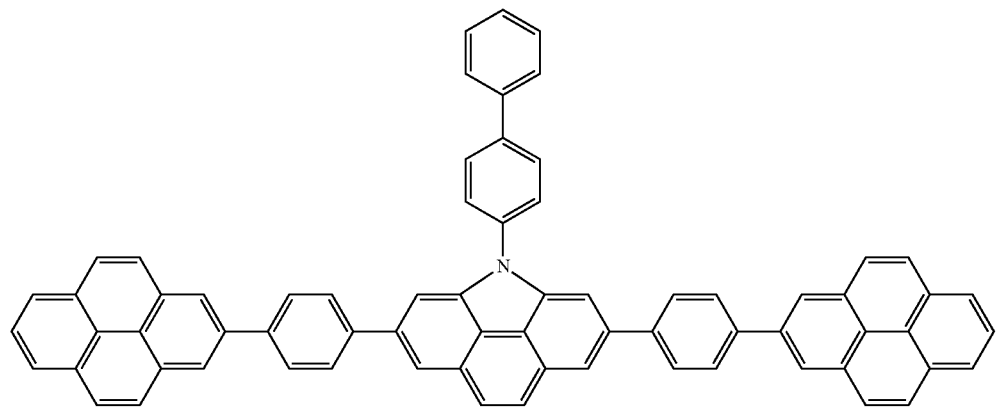

16
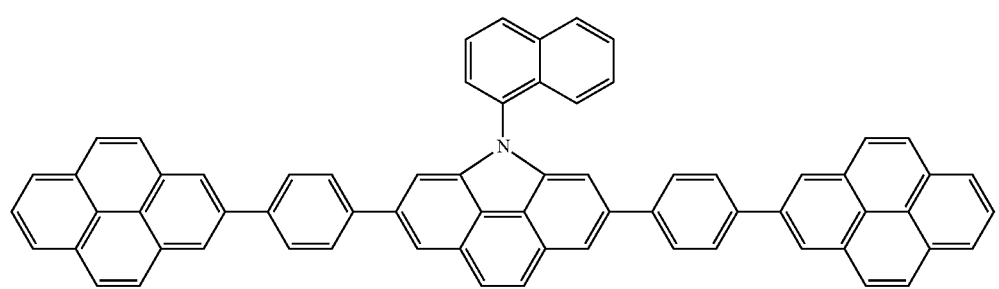
17
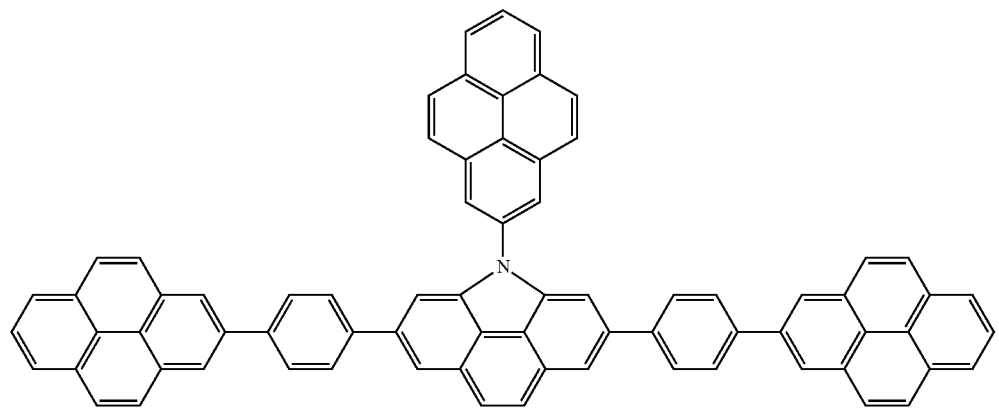
18
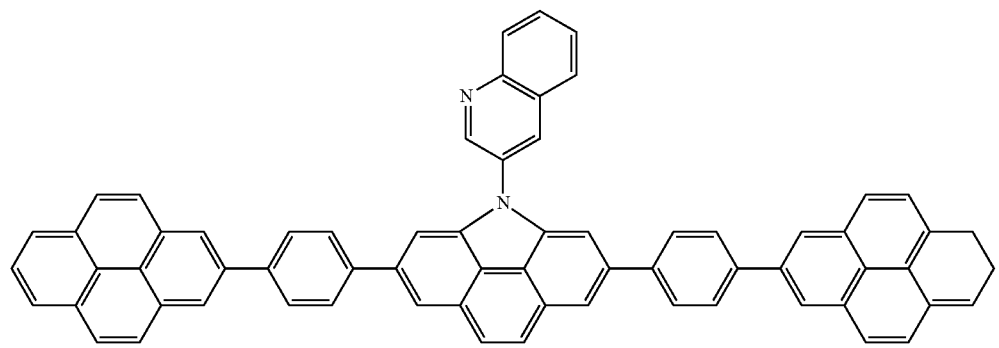
19
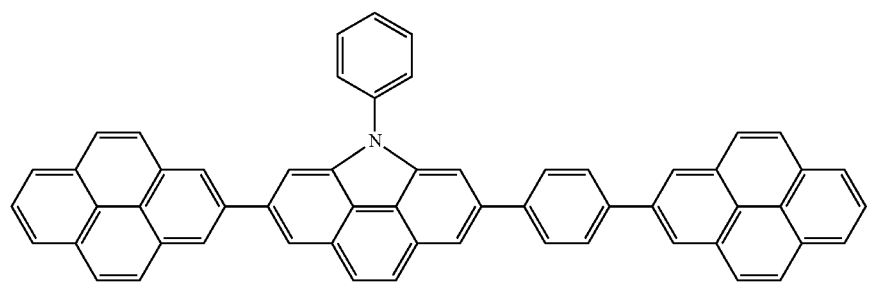

-continued
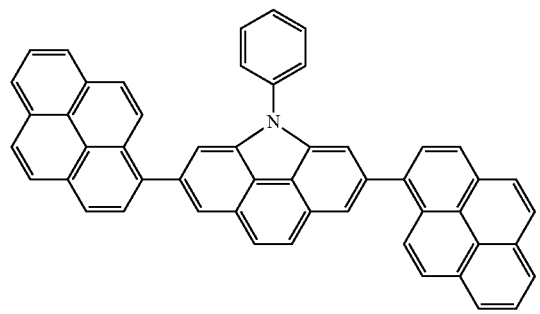
20
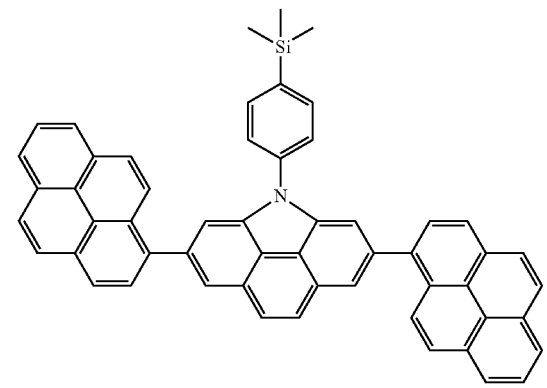
21
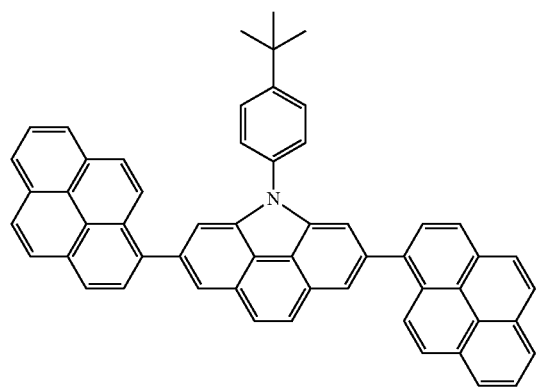
22
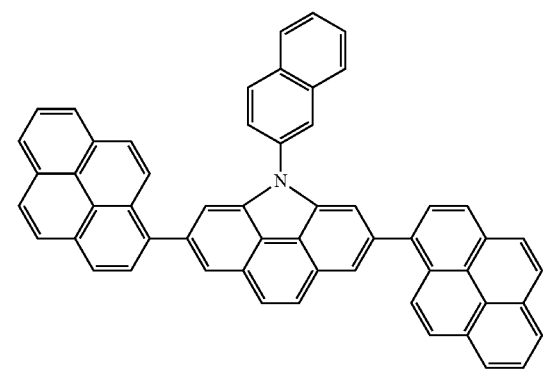
23
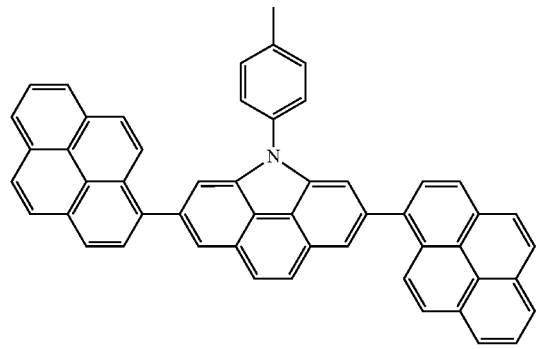
24
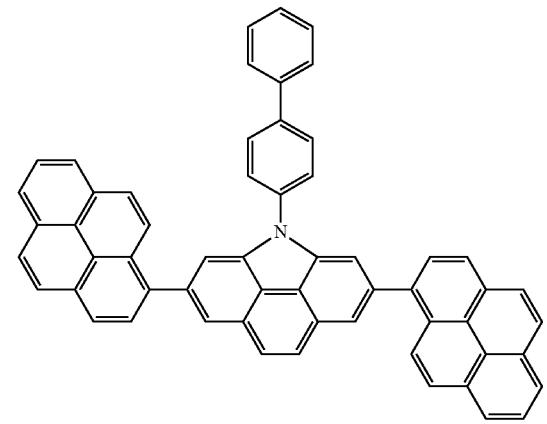
25
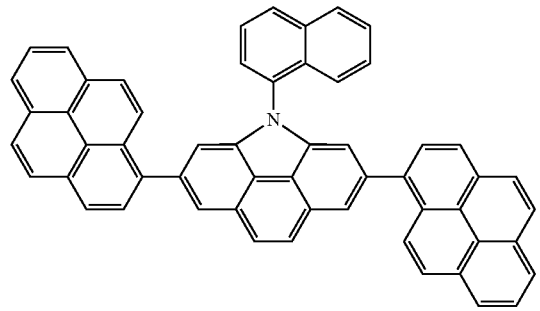
26
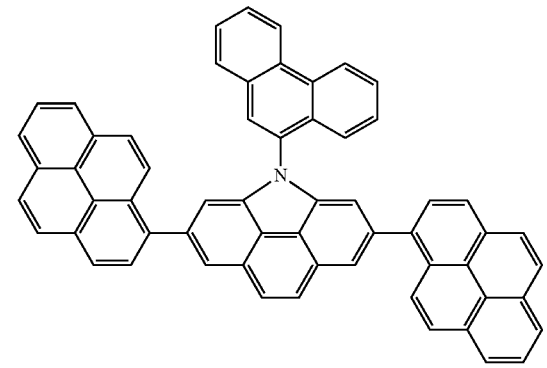
27

-continued
28
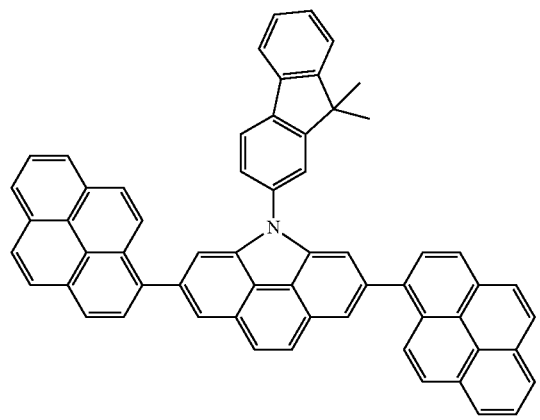
29
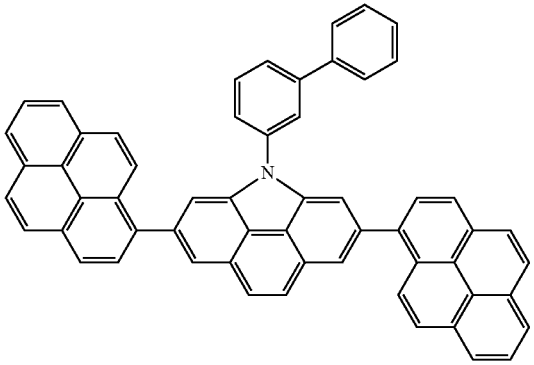
30
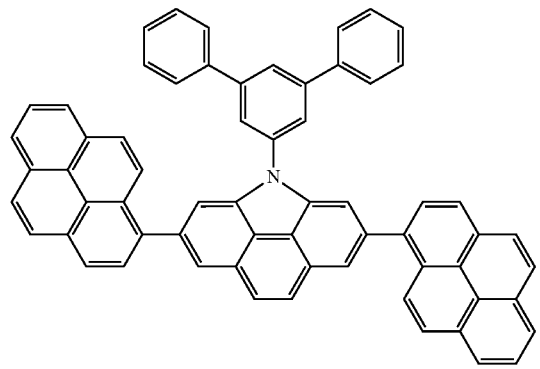
31
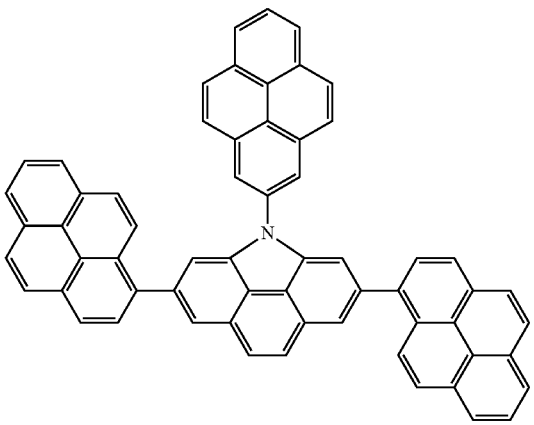
32
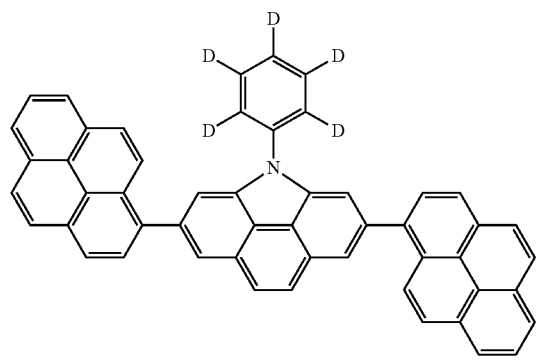
33
34
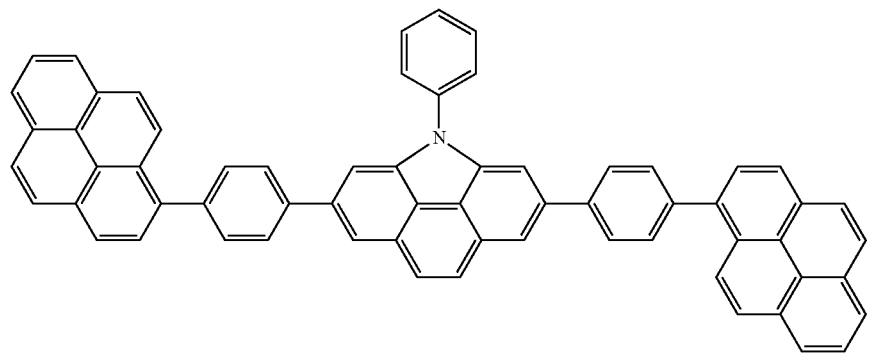

-continued
35
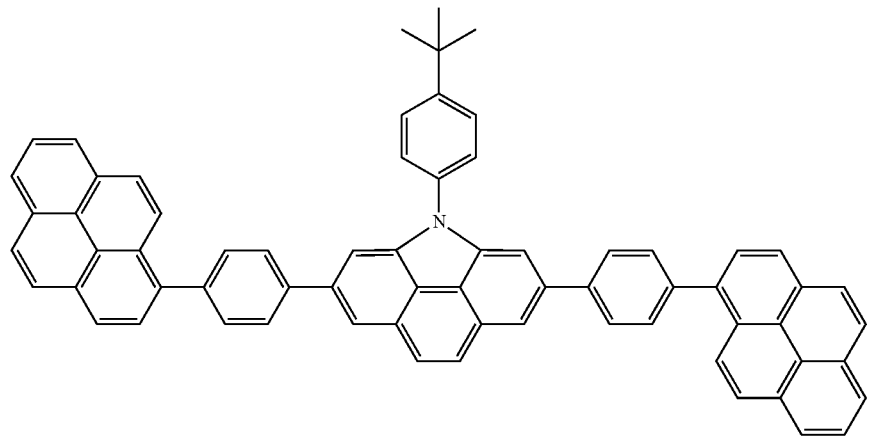
36
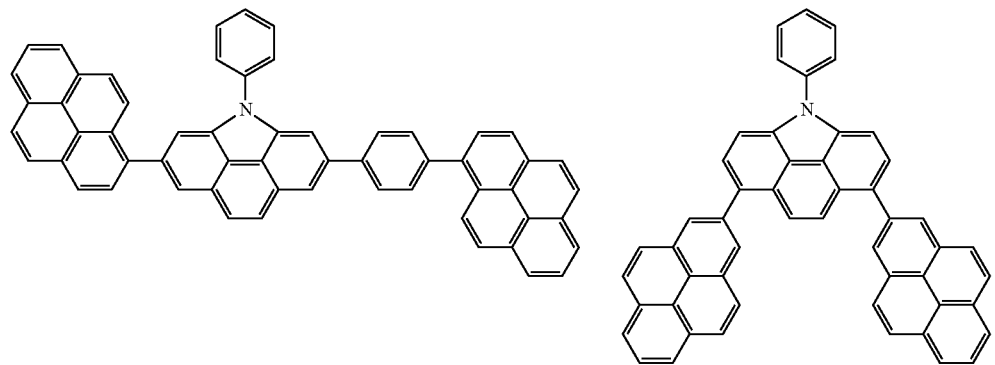
37
38
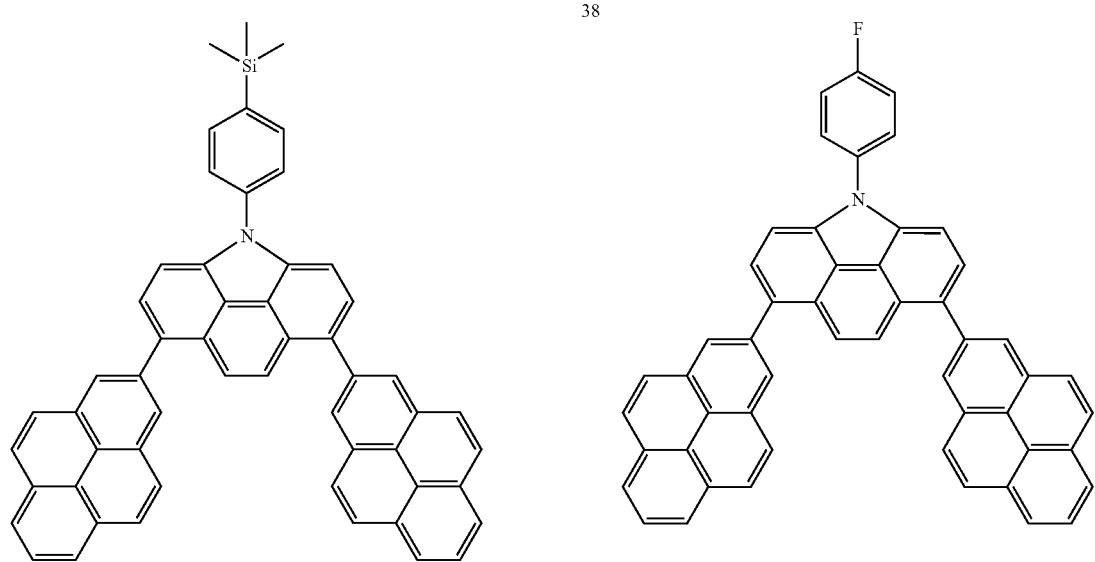
39

-continued
40
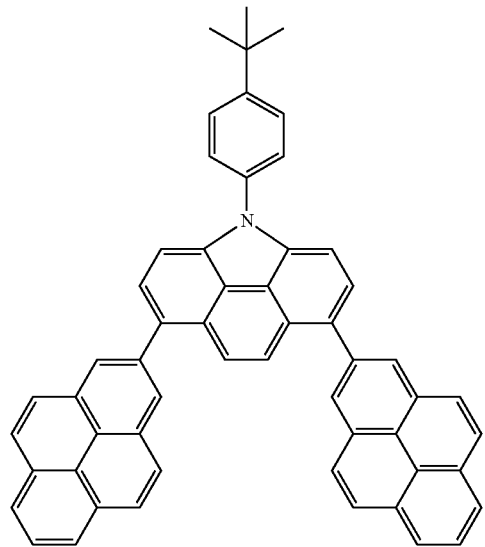
41
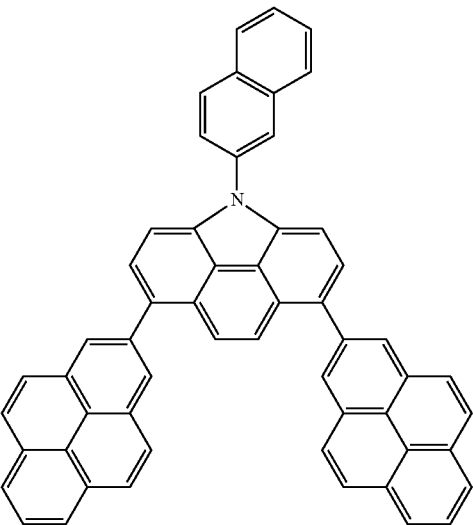
42
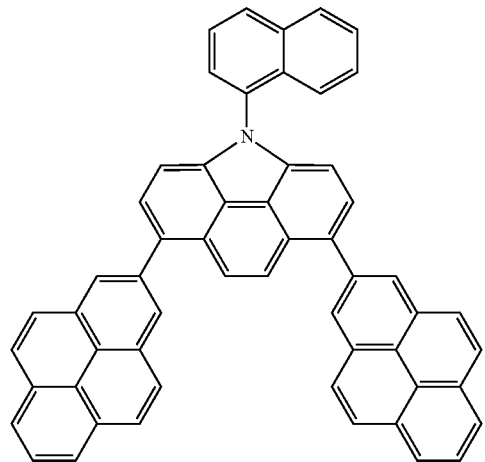
43
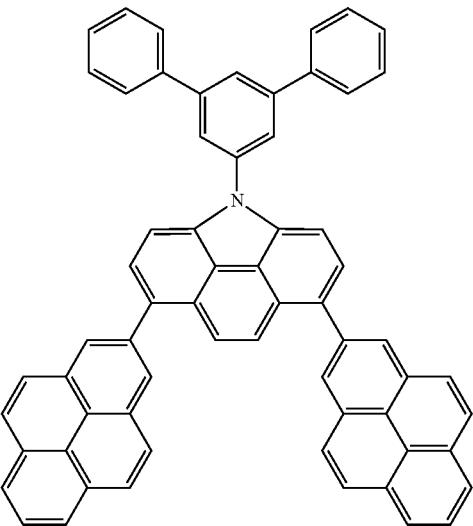
44
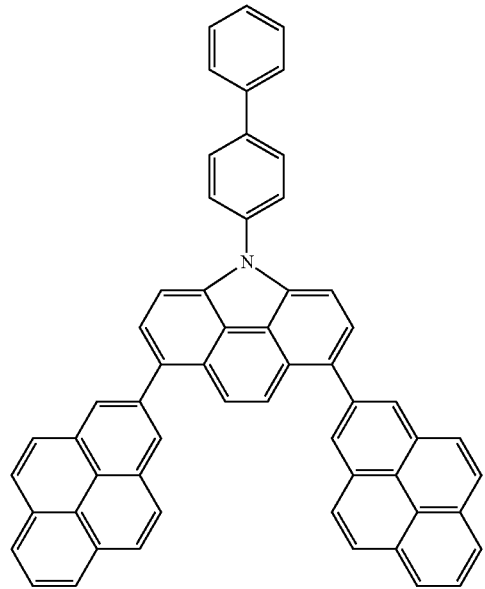
45
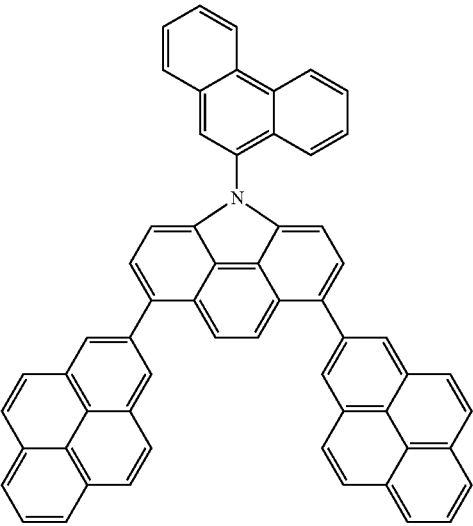

-continued
46
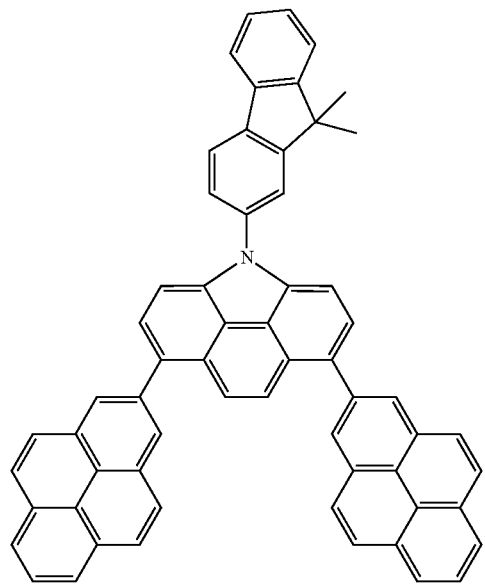
47
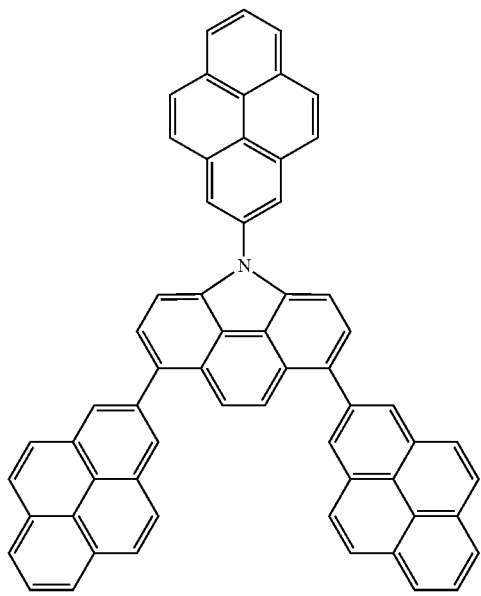
48
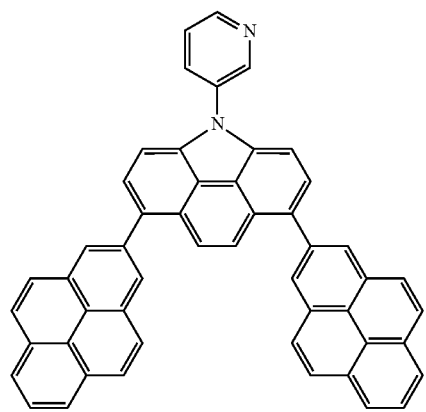
49
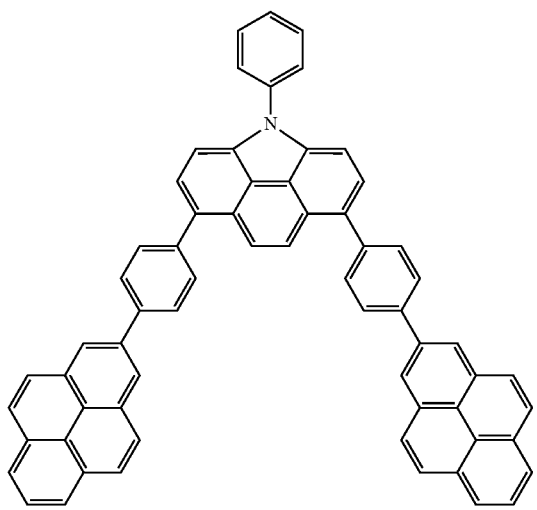

-continued
50
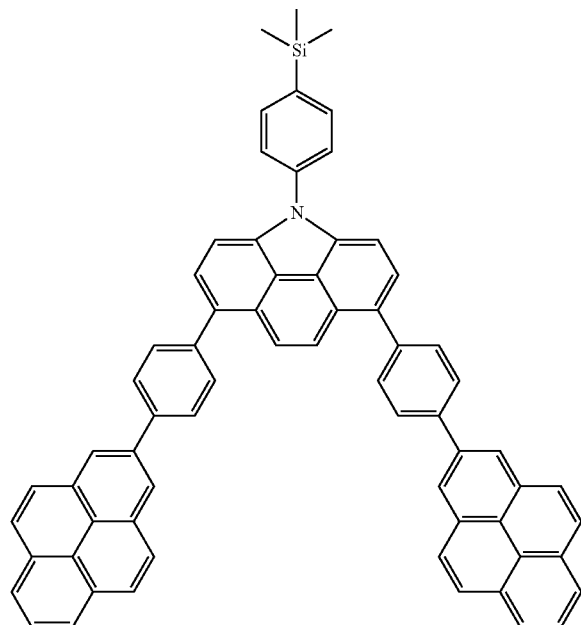
51
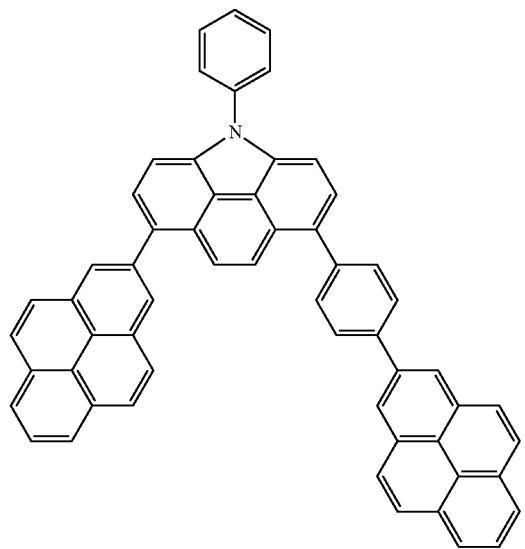
52
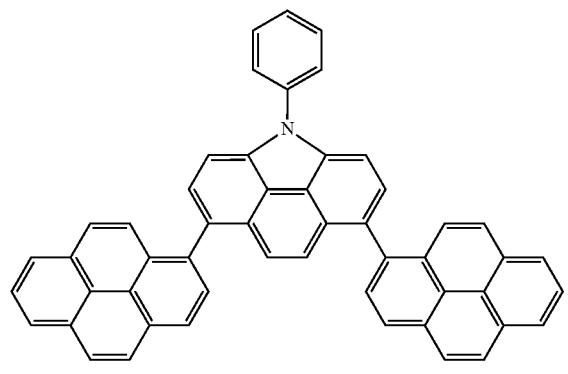
53
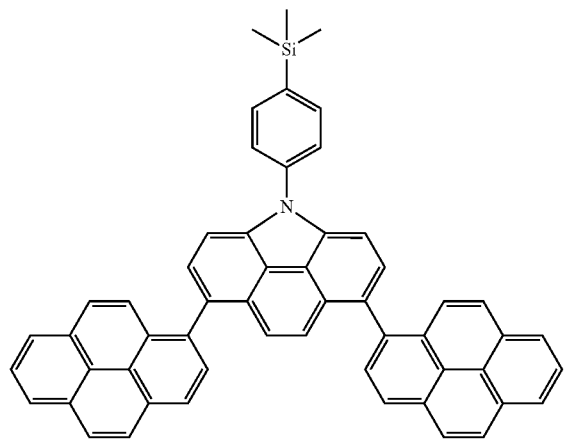
54
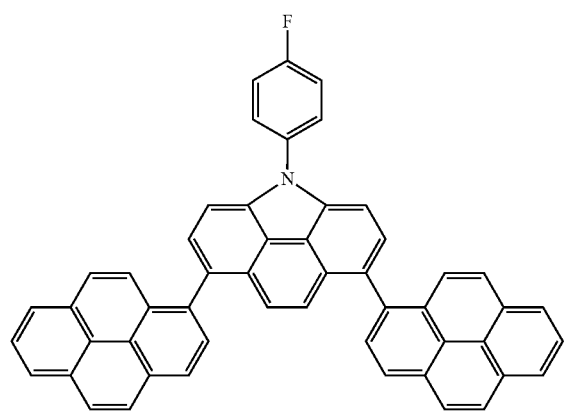
55
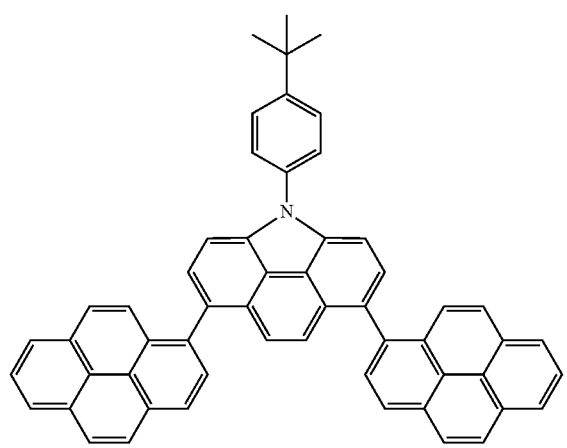

56
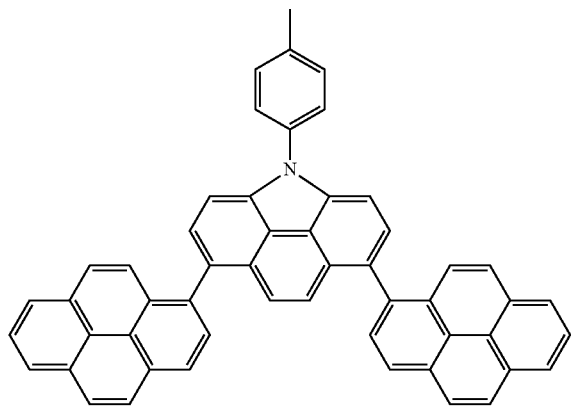
57
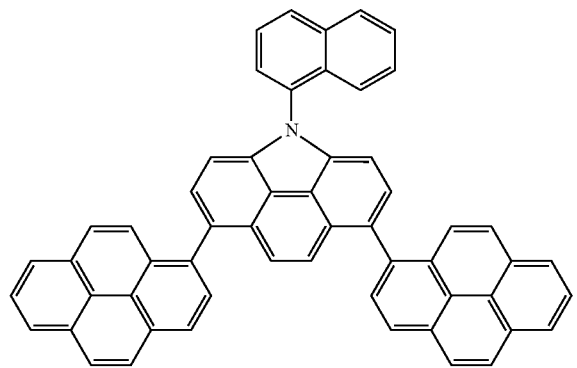
58
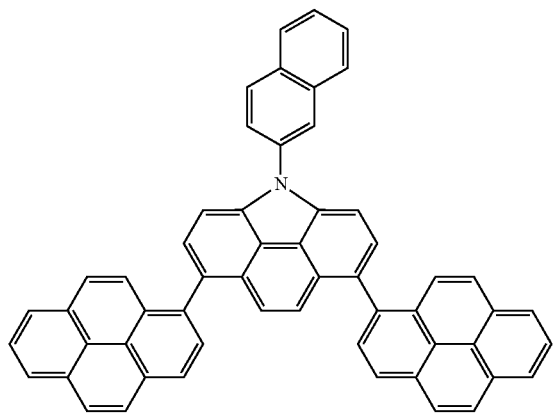
59
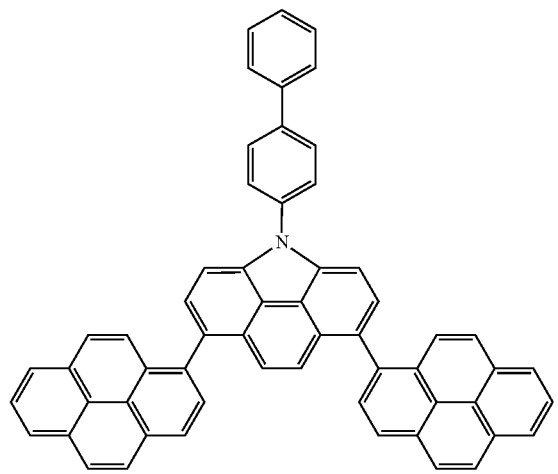
60
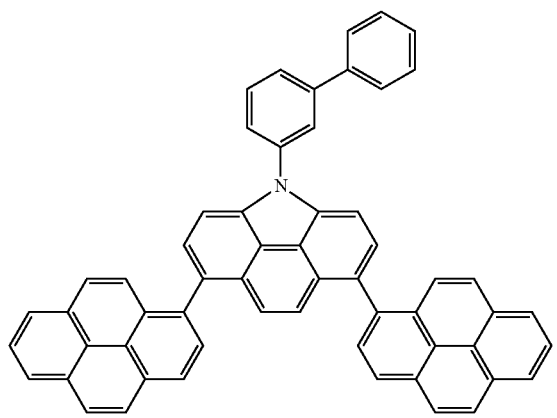
61
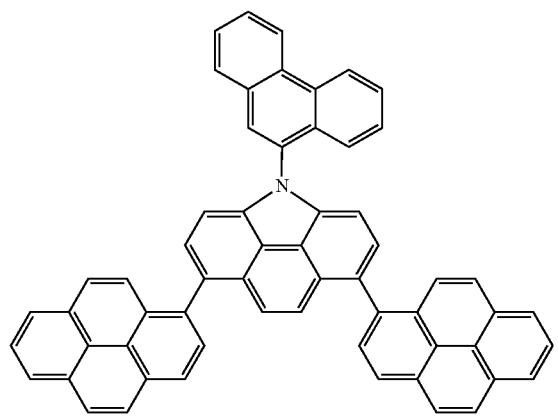

-continued
62
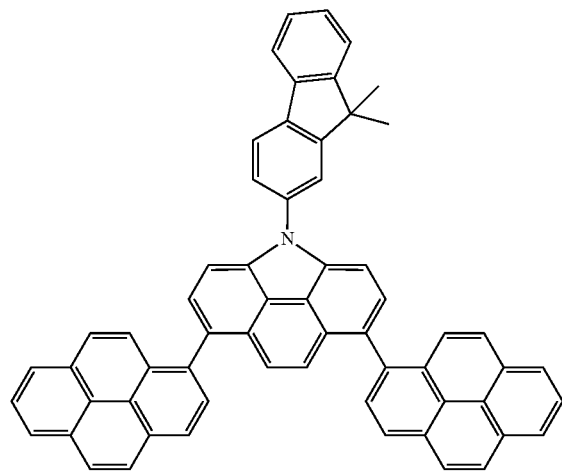
63
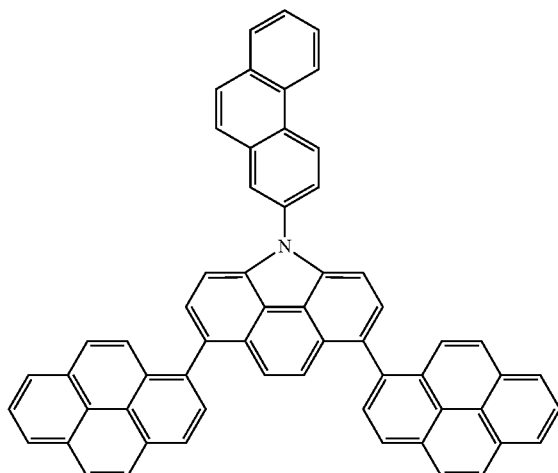
64
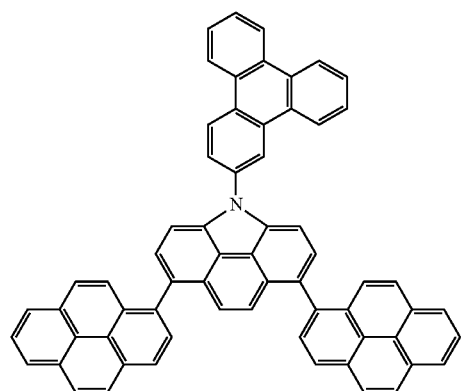
65
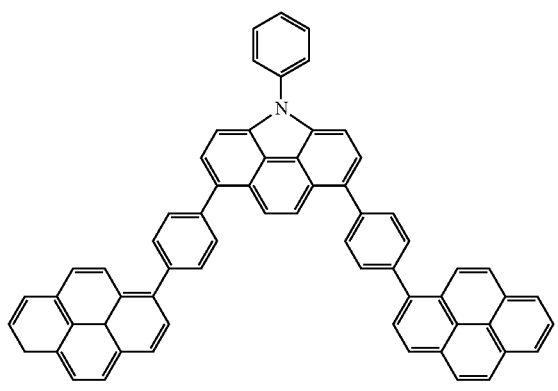
66
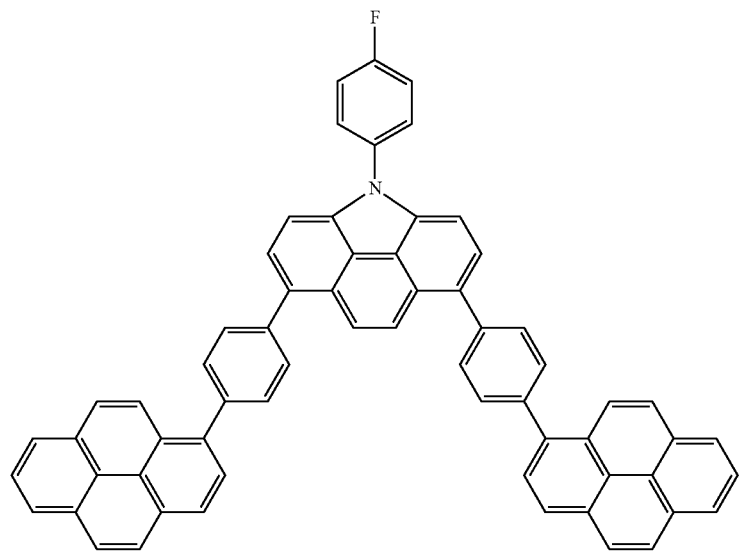

-continued

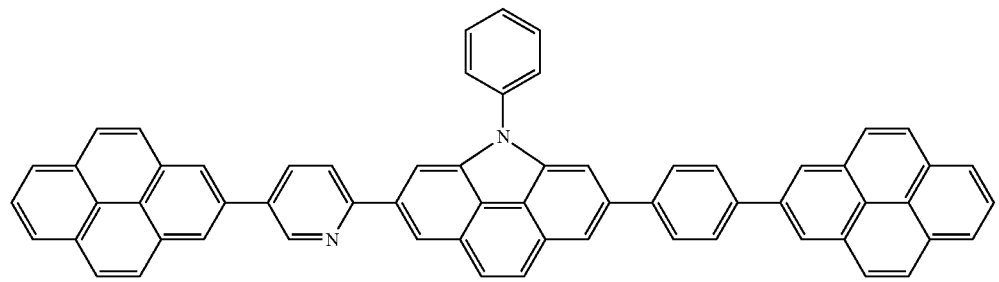

67

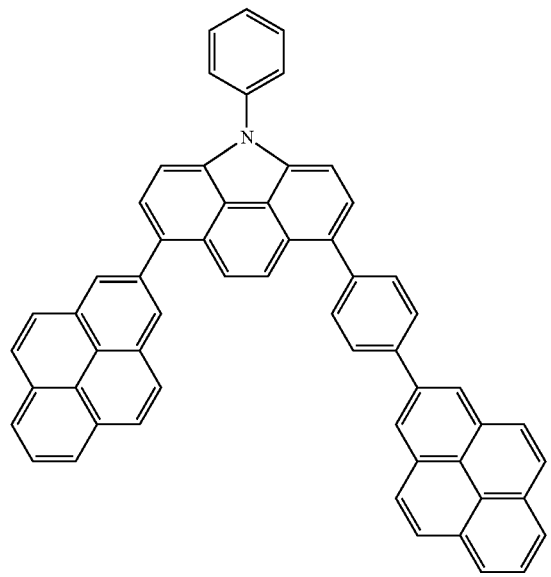

68

The embodiments may be realized by providing an organic light-emitting device including a first electrode; a second electrode; and an organic layer between the first electrode and the second electrode, wherein the organic layer includes the compound according to an embodiment.

The organic layer is an emission layer, and the compound is a host in the emission layer.

The organic layer is an emission layer, and the compound is a fluorescent host in the emission layer.

The organic layer includes an emission layer, and further includes one of an electron injection layer, an electron transport layer, a functional layer having both electron injection and electron transport capabilities, a hole injection layer, a hole transport layer, or a functional layer having both hole injection and hole transport capabilities, and the emission layer includes an anthracene-based compound, an aryamine-based compound, or a styryl-based compound.

The organic layer includes an emission layer, and further includes one of an electron injection layer, an electron transport layer, a functional layer having both electron injection and electron transport capabilities, a hole injection layer, a hole transport layer, or a functional layer having both hole injection and hole transport capabilities, the emission layer includes any one of a red emission layer, a green emission layer, a blue emission layer, or a white emission layer, and the any one of the red emission layer, the green emission layer, the blue emission layer, and the white emission layer of the emission layer includes a phosphorescent compound.

The organic layer includes one of the hole injection layer, the hole transport layer, or the functional layer having both hole injection and hole transport capabilities, and the one of the hole injection layer, the hole transport layer, or the functional layer having both hole injection and hole transport capabilities includes a charge-generation material.

The charge-generation material is a p-dopant.
The p-dopant is a quinone derivative.
The p-dopant is a metal oxide.
The p-dopant is a cyano group-containing compound.
The organic layer includes an electron transport layer, the electron transport layer including a metal complex.
The metal complex is a lithium (Li) complex.
The metal complex is lithium quinolate (LiQ).
The metal complex is Compound 203 below.

<Compound 203>

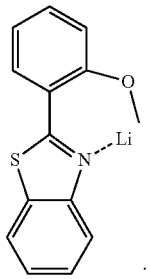

The organic layer is formed by a wet process.

The embodiments may be realized by providing a flat display apparatus including the organic light-emitting device according to an embodiment, wherein the first electrode of the organic light-emitting device is electrically connected to a source or a drain electrode of a thin film transistor.

BRIEF DESCRIPTION OF THE DRAWING

Features will be apparent to those of skill in the art by describing in detail exemplary embodiments with reference to the attached drawing in which:

FIG. 1 illustrates a schematic view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

A compound according to an embodiment may be represented by Formula 1, below.

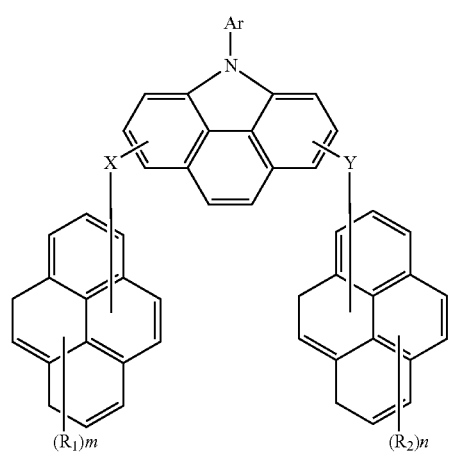

<Formula 1>

In Formula 1, $R_1$ and $R_2$ may be each independently a hydrogen; a deuterium; a halogen atom; a cyano group; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a substituted or unsubstituted $C_1$-$C_{60}$ heteroaryl group; an amino group substituted with a $C_6$-$C_{60}$ aryl group or a $C_1$-$C_{60}$ heteroaryl group; or a substituted or unsubstituted $C_6$-$C_{60}$ condensed polycyclic group.

In an implementation, $R_1$ and $R_2$ may be identical to or different from each other in case of a plurality of $R_1$ and $R_2$.

m and n may be each independently an integer of 1 to 9.

Ar may be a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group.

X and Y may be each independently a direct or single bond, a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group.

The compound of Formula 1 according to an embodiment may function as a light-emitting material for an organic light-emitting device. In addition, the compound of Formula 1 including the condensed ring may have a high glass transition temperature (Tg) due to the inclusion of the condensed ring. Therefore, in regard to electroluminescence, the compound of Formula 1 may increase its thermal resistance and high-temperature environment resistance against Joule heat that may be generated in an organic layer, between organic layers, or between an organic layer and a metal electrode. An organic light-emitting device manufactured using the compound including the condensed ring may have high durability during storage and operation, and may help improve characteristics thereof due to the inclusion of substituents including hetero atoms.

A substitution position of a pyrene group in the compound of Formula 1 may be varied. In an implementation, the compound represented by Formula 1 may be represented by, e.g., Formula 2 or Formula 3, below.

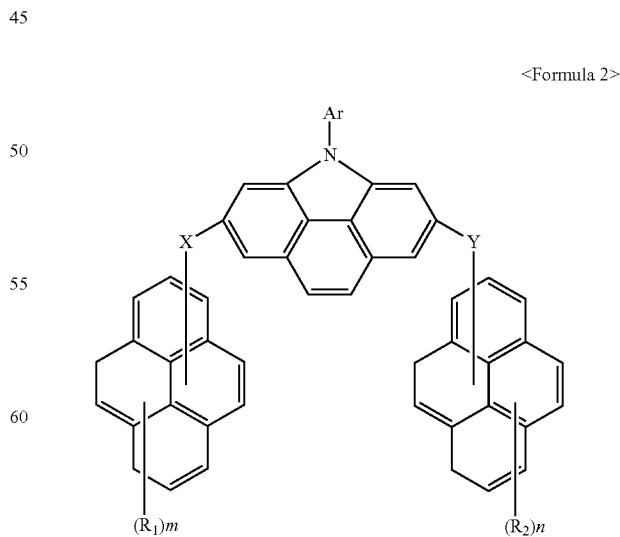

<Formula 2>

<Formula 3>

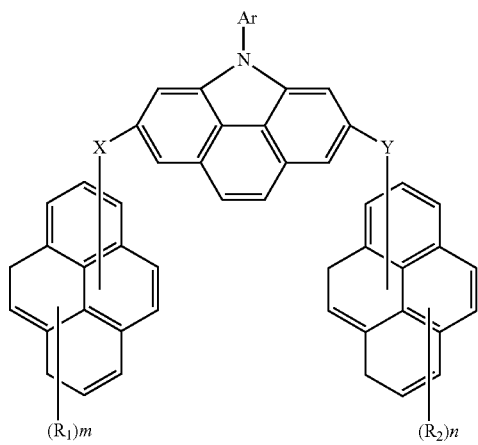

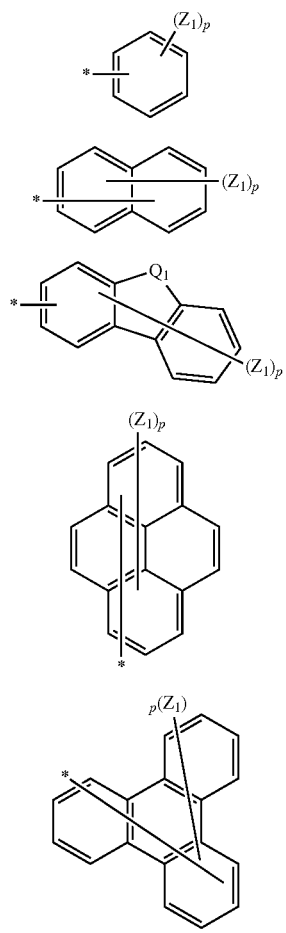

$R_1$, $R_2$, m, n, X, Y, and Ar in Formula 2 or Formula 3 may be the same as described above with respect to Formula 1.

A substituent in the compound of Formula 1 will now be described in detail.

In an implementation, $R_1$ and $R_2$ in Formula 1 may be each independently a hydrogen or a deuterium.

In an implementation, Ar in Formula 1 may be a group represented by one of Formulae 2a to 2h, below.

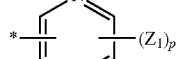

2f

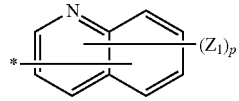

2g

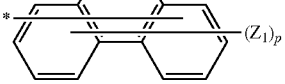

2h

In Formulae 2a to 2h:

$Q_1$ may be —$C(R_{31})(R_{32})$—;

$Z_1$, $R_{31}$, and $R_{32}$ may be each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, —$SiR_{41}R_{42}R_{43}$, a halogen atom, a cyano group, a nitro group, a hydroxyl group, or a carboxyl group;

$R_{41}$, $R_{42}$, and $R_{43}$ may be each independently a substituted or unsubstituted $C_1$-$C_{20}$ alkyl group or a substituted or unsubstituted $C_6$-$C_{20}$ aryl group;

p may be an integer of 1 to 11; and

* indicates a binding site.

In an implementation, X and Y in Formula 1 may be each independently a direct or single bond or a group represented by one of Formula 3a or Formula 3b below.

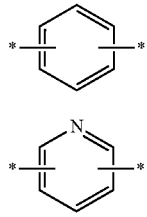

In Formulae 3a and 3b, * indicates a binding site.

Hereinafter, definitions of representative substituents used herein will be described (In this regard, the number of carbons restricting a substituent is not limited, and does not limit properties of the substituent, and unless defined otherwise, the definition of the substituent is consistent with a general definition thereof).

The unsubstituted $C_1$-$C_{60}$ alkyl group used herein may be a linear or branched alkyl group, and non-limiting examples thereof are a methyl group, an ethyl group, a propyl group, an isobutyl group, a sec-butyl group, a pentyl group, an iso-amyl group, a hexyl group, a heptyl group, an octyl group, a nonyl group, and a dodecyl group. At least one hydrogen atom of the unsubstituted alkyl group may be substituted with a deuterium, a halogen atom, a hydroxyl group, a nitro group, a cyano group, an amino group, an amidino group, a hydrazine group, a hydrazone group, a carboxyl group or a salt thereof, a sulfonic acid or a salt thereof, a phosphoric acid or a salt thereof, or a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, a $C_4$-$C_{16}$ heteroaryl group, or an organosilyl group.

The unsubstituted $C_2$-$C_{60}$ alkenyl group used herein refers to an unsubstituted alkyl group having one or more carbon double bonds at a center or end thereof. Examples of the unsubstituted $C_2$-$C_{60}$ alkenyl group are an ethenyl group, a propenyl group, and a butenyl group. At least one hydrogen atom of the unsubstituted alkenyl group may be substituted with the same substituents as used in the alkyl group described above.

The unsubstituted $C_2$-$C_{60}$ alkynyl group used herein refers to an unsubstituted alkyl group having one or more carbon triple bonds at a center or end thereof. Examples of the unsubstituted $C_2$-$C_{60}$ alkynyl group are an acetylene, a propyne, a phenylacetylene, a naphthylacetylene, an isopropylacetylene, a t-butylacetylene, a diphenylacetylene. At least one hydrogen atom of the unsubstituted alkynyl group may be substituted with the same substituent as used in the alkyl group described above.

The unsubstituted $C_3$-$C_{60}$ cycloalkyl group used herein refers to a $C_3$ to $C_{60}$ cyclic alkyl group, and at least one hydrogen atom of the cycloalkyl group may be substituted with the same substituents as used in the alkyl group described above.

The unsubstituted $C_1$-$C_{60}$ alkoxy group used herein refers to a group having —OA (wherein A is the unsubstituted $C_1$-$C_{60}$ alkyl group), and non-limiting examples thereof are a methoxy, an ethoxy, a propoxy, an isopropyloxy, a buthoxy, and a pentoxy. At least one hydrogen atom of the unsubstituted alkoxy may be substituted with the same substituents as used in the alkyl group described above.

The unsubstituted $C_6$-$C_{60}$ aryl group used herein refers to a carbocyclic aromatic system having at least aromatic ring. When the number of rings is two or more, the rings may be fused to each other or linked to each other via, for example, a single bond. The term 'aryl' includes an aromatic system, such as a phenyl, a naphthyl, and an anthracenyl. Also, at least one hydrogen atom of the unsubstituted aryl group may be substituted with the same substituents as used in the alkyl group described above.

Examples of the substituted or unsubstituted $C_6$-$C_{60}$ aryl group are a phenyl group, a $C_1$-$C_{10}$ alkylphenyl group (e.g., an ethylphenyl group), a halophenyl group (e.g., an o-, m-, and p-fluorophenyl group, and a dichlorophenyl group), a cyanophenyl group, a dicyanophenyl group, a trifluoromethoxyphenyl group, a biphenyl group, a halobiphenyl group, a cyanobiphenyl group, a $C_1$-$C_{10}$ alkylbiphenyl group, a $C_1$-$C_{10}$ alkoxybiphenyl group, an o-, m-, and p-toryl group, an o-, m-, and p-cumenyl group, a mesityl group, a phenoxyphenyl group, an (α,α-dimethylbenzene)phenyl group, an (N,N'-dimethyl)aminophenyl group, an (N,N'-diphenyl)aminophenyl group, a pentalenyl group, an indenyl group, a naphtyl group, a halonaphtyl group (e.g., a fluoronaphtyl group), a $C_1$-$C_{10}$ alkylnaphtyl group (e.g, a methylnaphtyl group), a $C_1$-$C_{10}$ alkoxynaphtyl group (e.g., a methoxynaphtyl group), a cyanonaphtyl group, an anthracenyl group, an azulenyl group, a heptalenyl group, an acenaphtylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphtylenyl group, a heptaphenyl group, a heptacenyl group, a pyranthrenyl group, and an ovalenyl group.

The unsubstituted $C_1$-$C_{60}$ heteroaryl group used herein includes 1, 2, 3, or 4 hetero atoms selected from nitrogen (N), oxygen (O), phosphorous (P), and sulfur (S). When the group has two or more rings, the rings may be fused to each other or linked to each other via, for example, a single bond. Examples of the unsubstituted $C_1$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. In addition, at least one hydrogen atom of the unsubstituted heteroaryl group may be substituted with the same substituents as used in the alkyl group described above.

The unsubstituted $C_6$-$C_{60}$ aryloxy group used herein refers to a group represented by —$OA_1$, wherein $A_1$ is the $C_6$-$C_{60}$ aryl group. An example of the unsubstituted $C_6$-$C_{60}$ aryloxy group is a phenoxy group. At least one hydrogen atom of the unsubstituted aryloxy group may be substituted with the same substituents as used in the alkyl group described above.

The unsubstituted $C_6$-$C_{60}$ arylthio group used herein refers to a group represented by —$SA_1$, wherein $A_1$ is the $C_6$-$C_{60}$ aryl group. Examples of unsubstituted $C_6$-$C_{60}$ arylthio group are a benzenethio group and a naphthylthio group. At least one hydrogen atom of the unsubstituted arylthio group may be substituted with the same substituents as used in the alkyl group described above.

The unsubstituted $C_6$-$C_{60}$ condensed polycyclic group used herein refers to a substituent having two or more rings formed by fusing at least one aromatic ring and at least one non-aromatic ring or a substituent in which an unsaturated group is present in a ring but a conjugated system does not, and condensed polycyclic group overall does not have an orientation, which is why the condensed polycyclic group is distinguished from the aryl group or the heteroaryl group.

Examples of the compound represented by Formula 1 may include compounds 1-68 below.

1

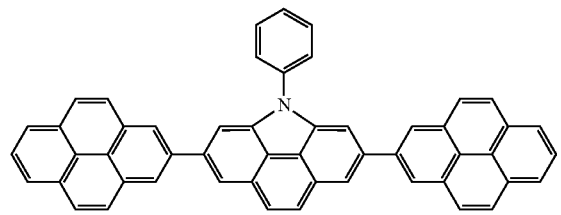

2

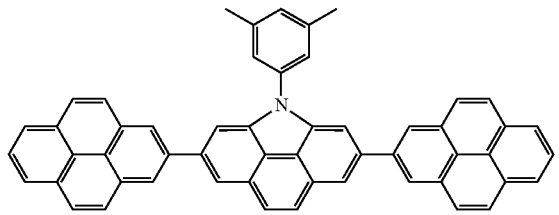

-continued
3
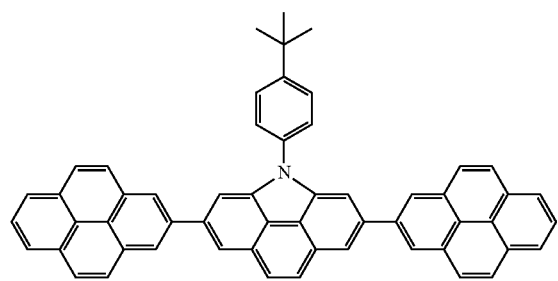
4
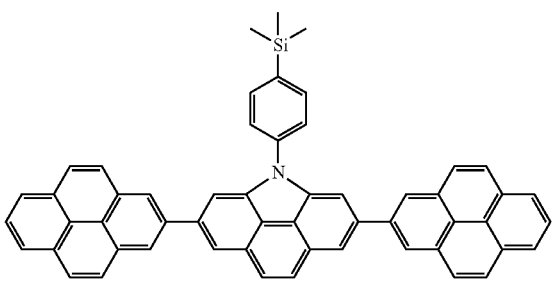
5
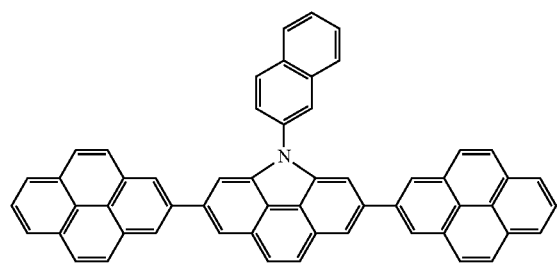
6
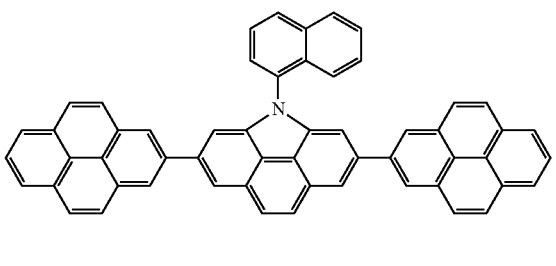
7
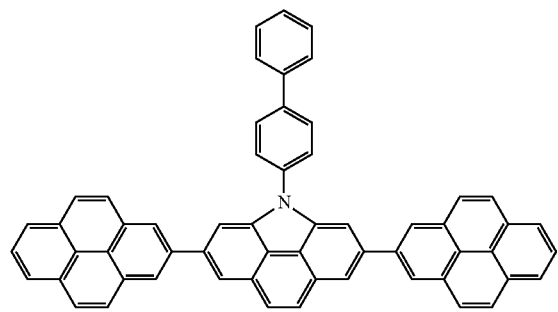
8
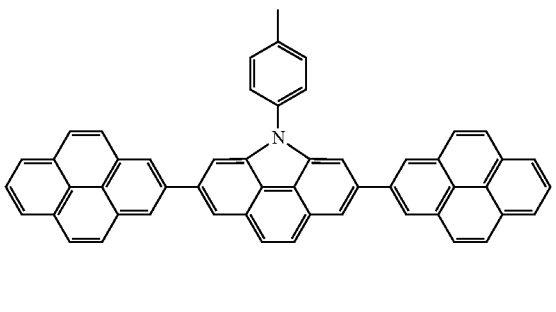
9
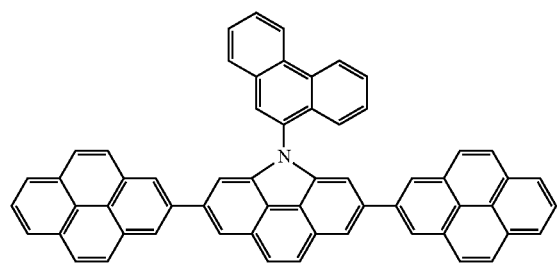
10
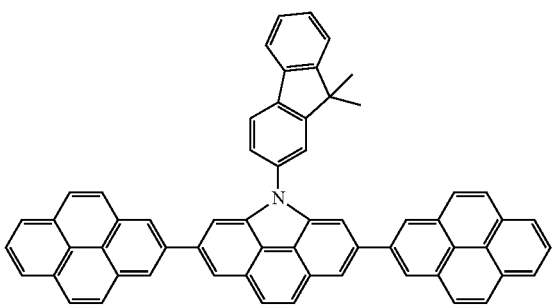
11
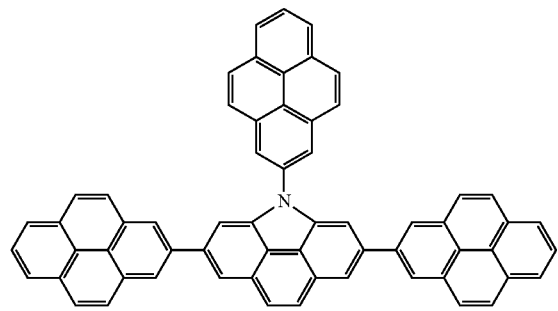
12
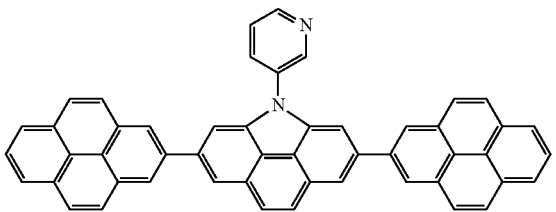

13
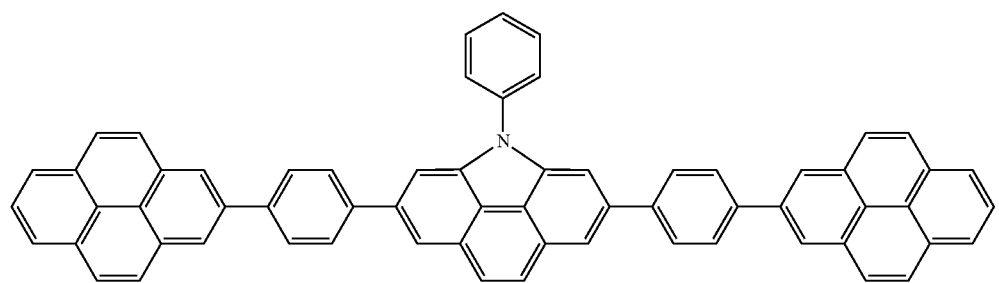
14
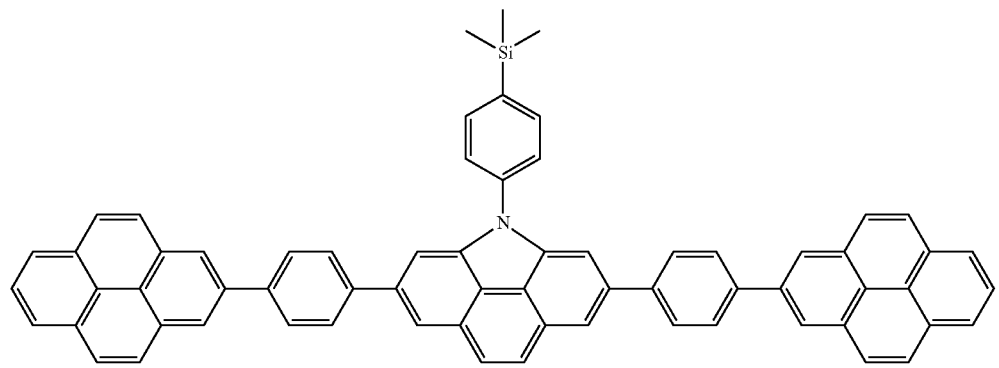
15
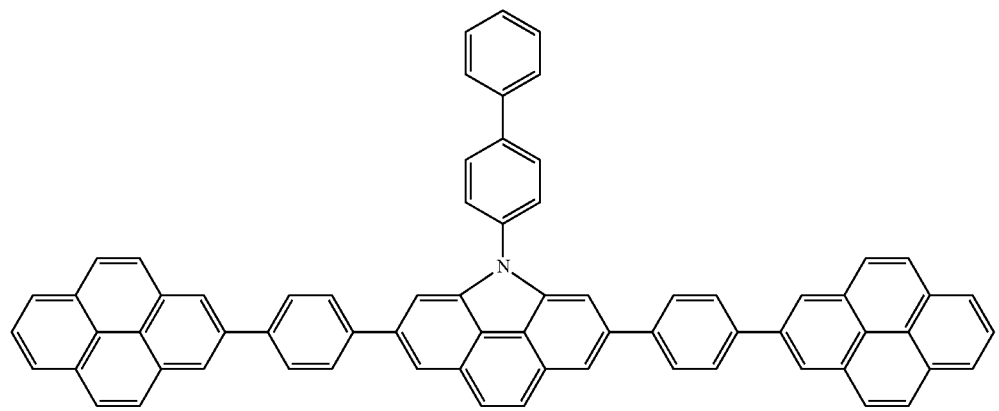
16
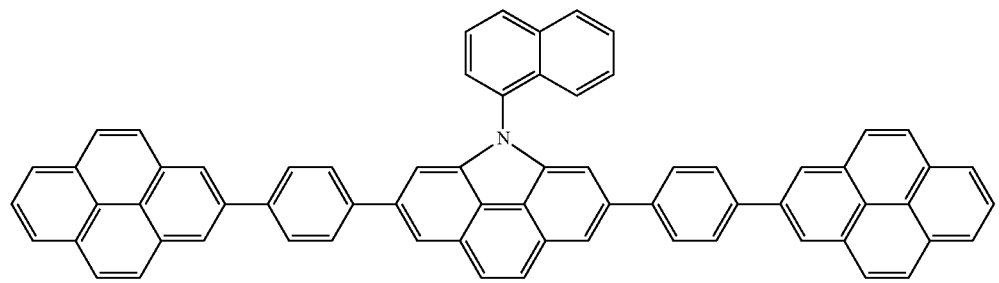

17
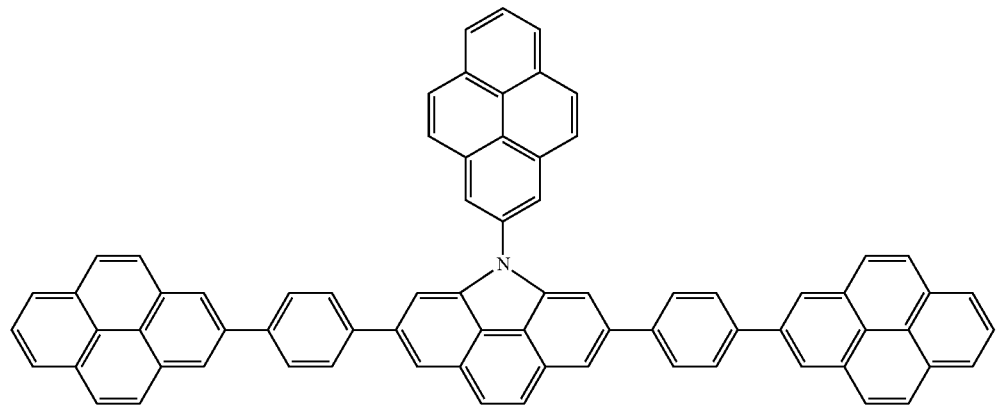
18
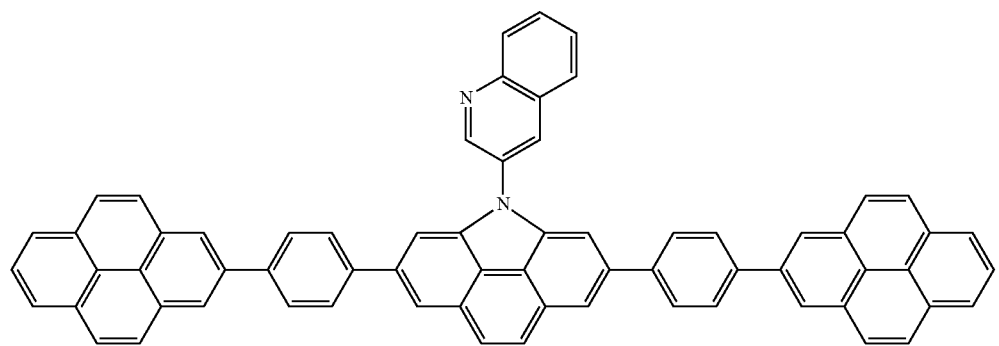
19
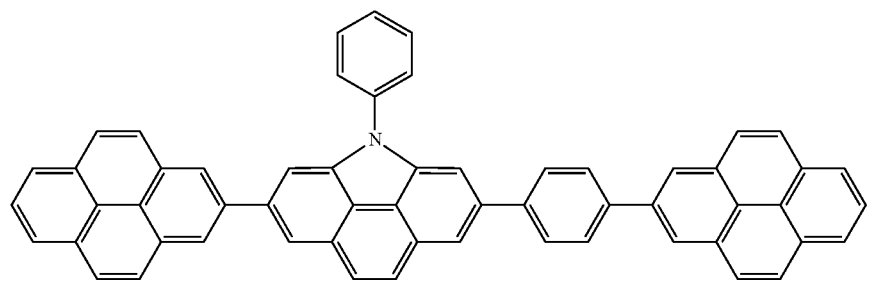
20 21
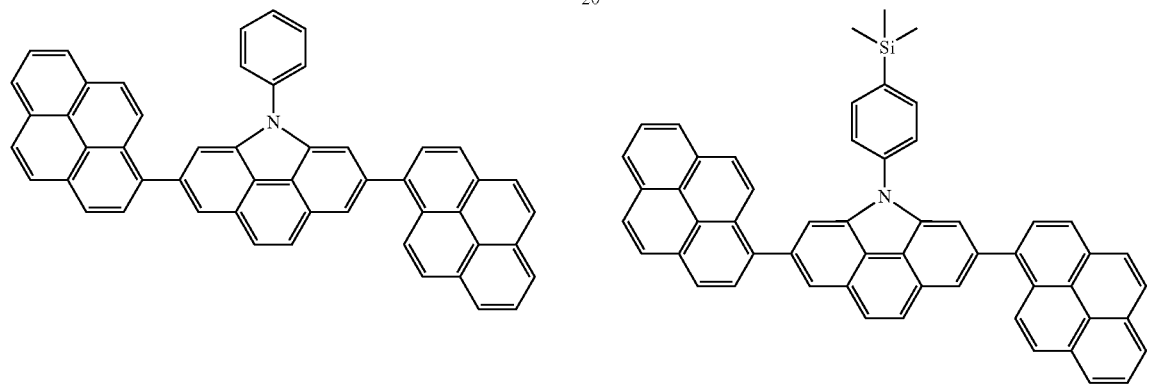

-continued
| 22 | 23 |
|---|---|
| 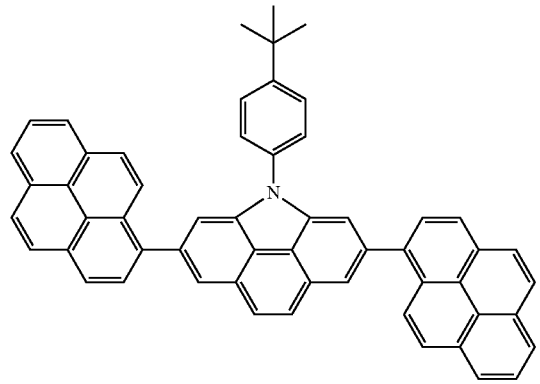 | 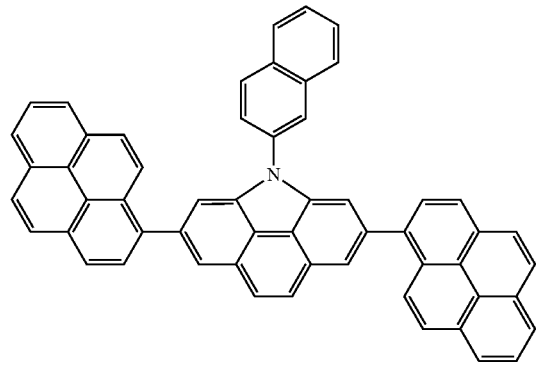 |
| 24 | 25 |
| 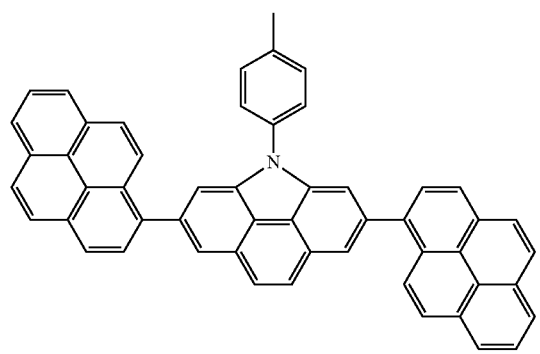 | 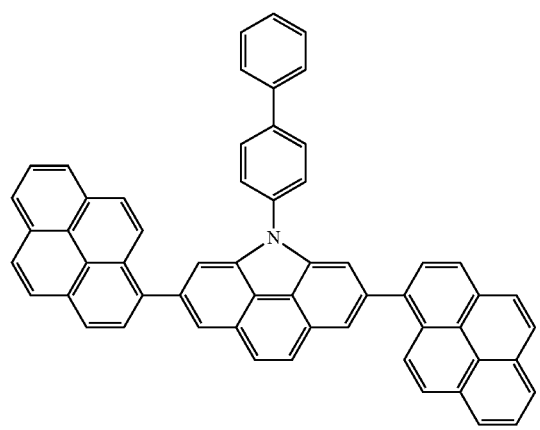 |
| 26 | 27 |
| 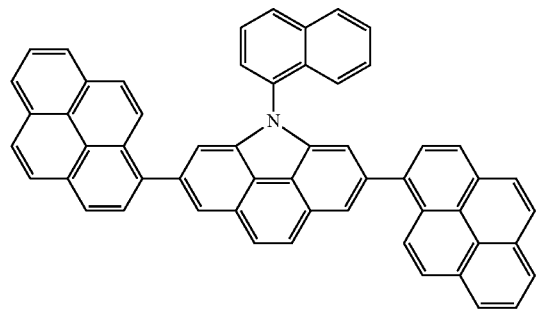 | 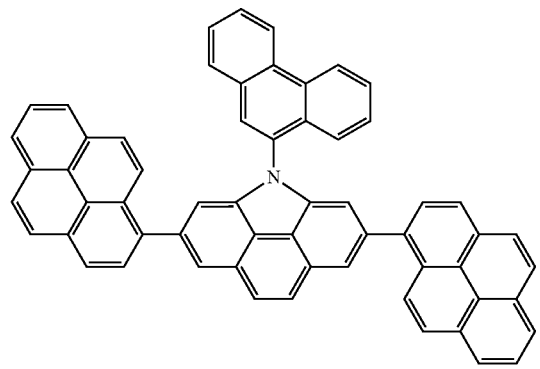 |
| 28 | 29 |
| 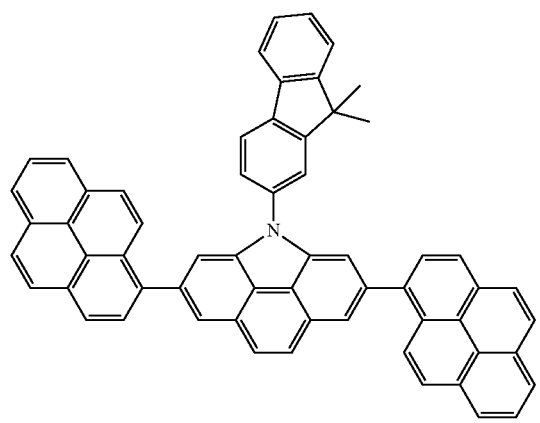 | 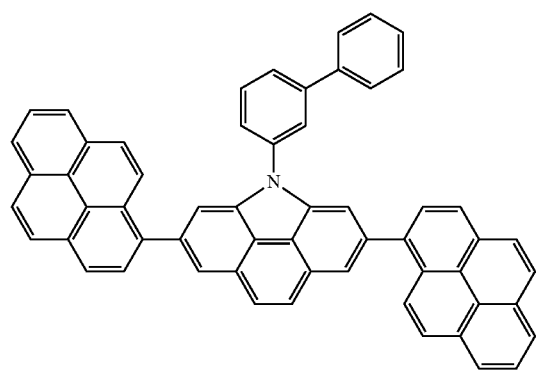 |

-continued
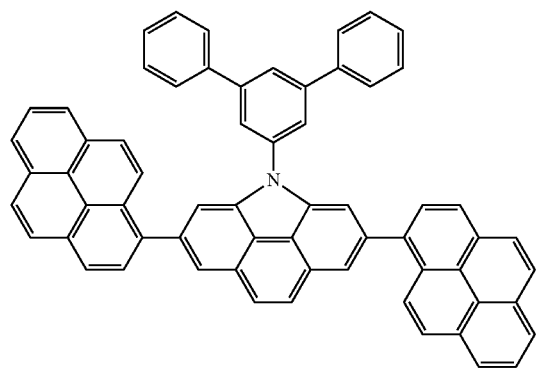
30
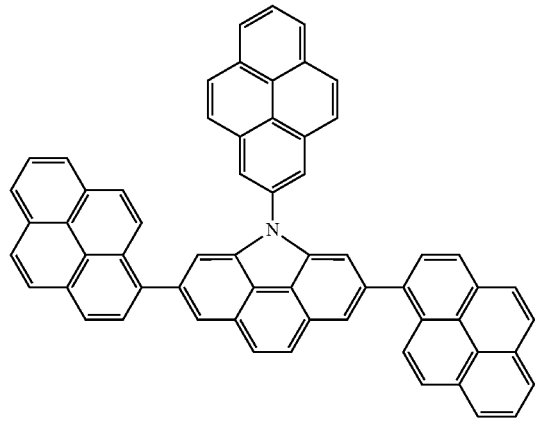
31
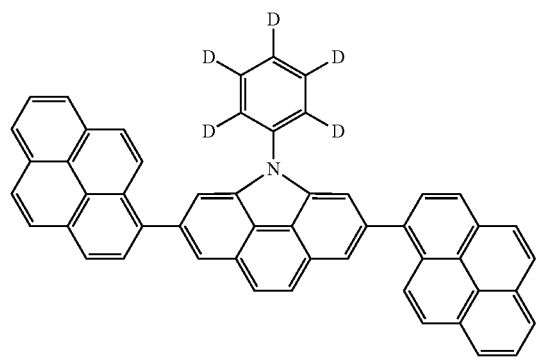
32
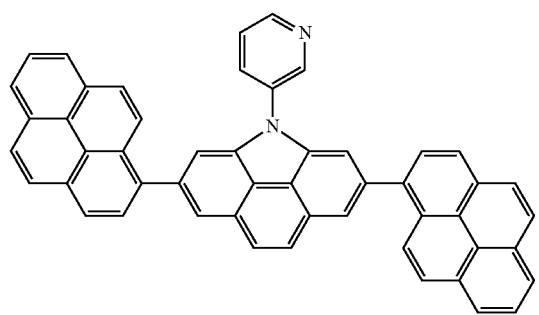
33
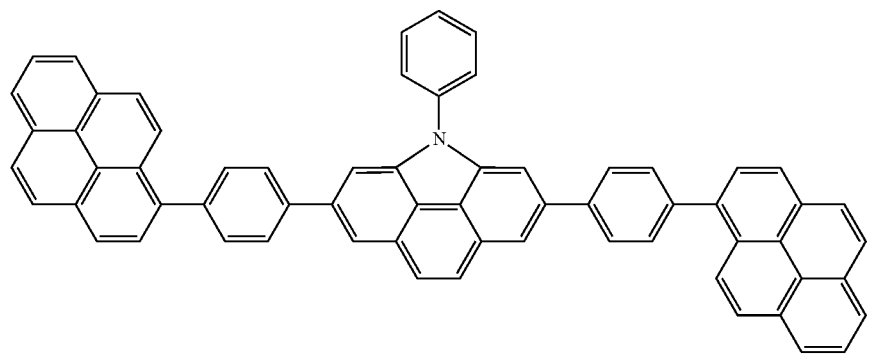
34
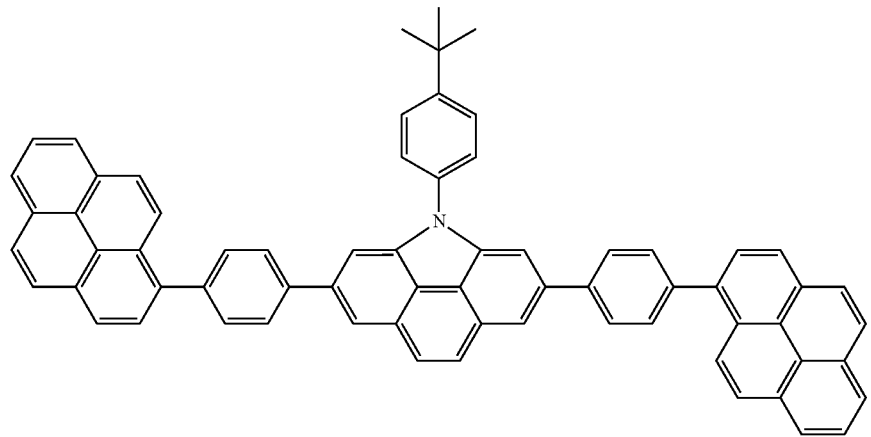
35

-continued
36
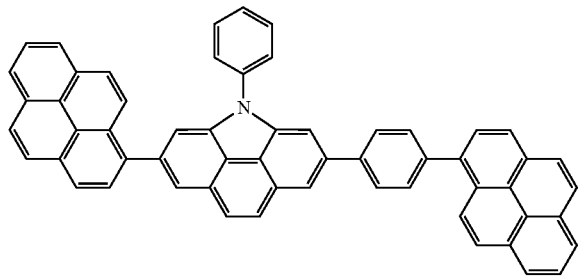
37
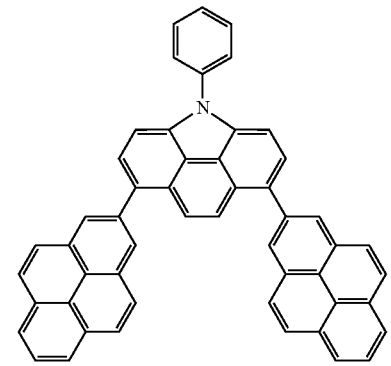
38
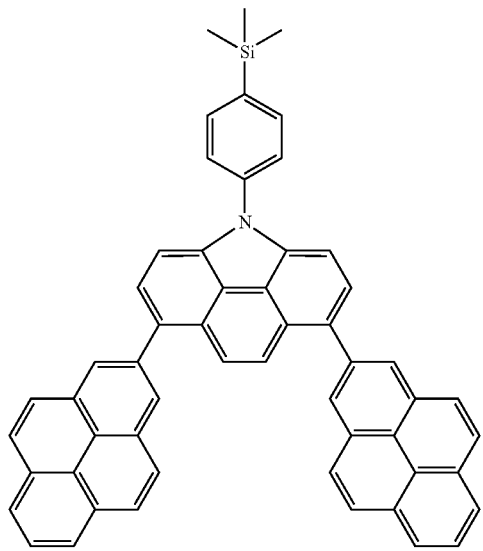
39
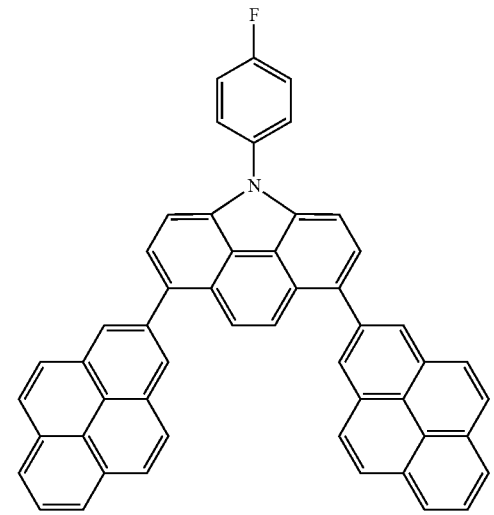
40
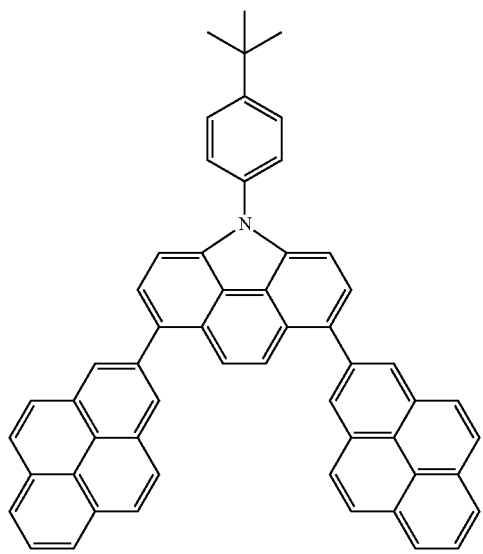
41
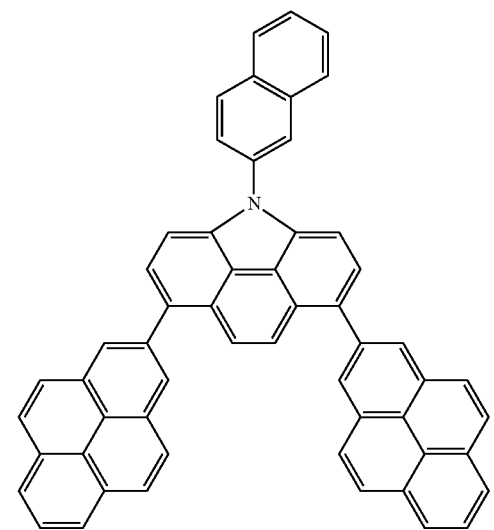

-continued
42
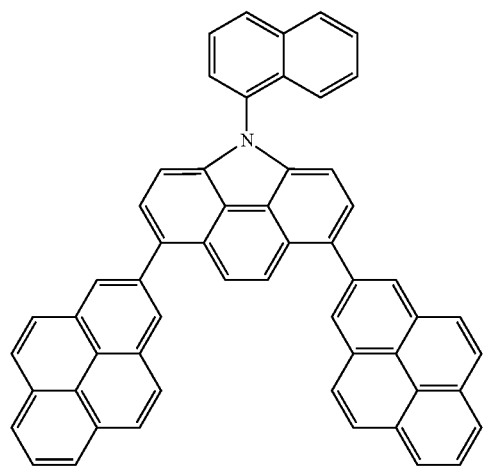
43
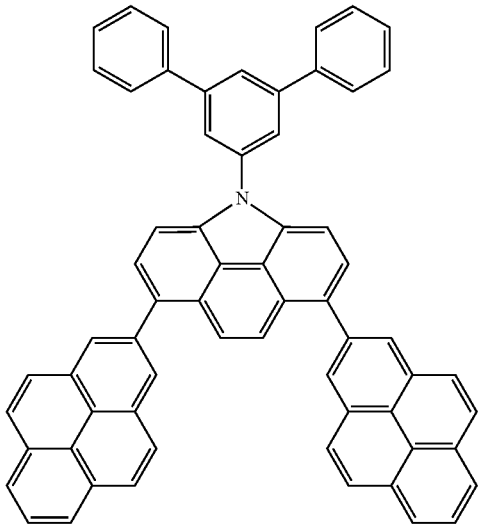
44
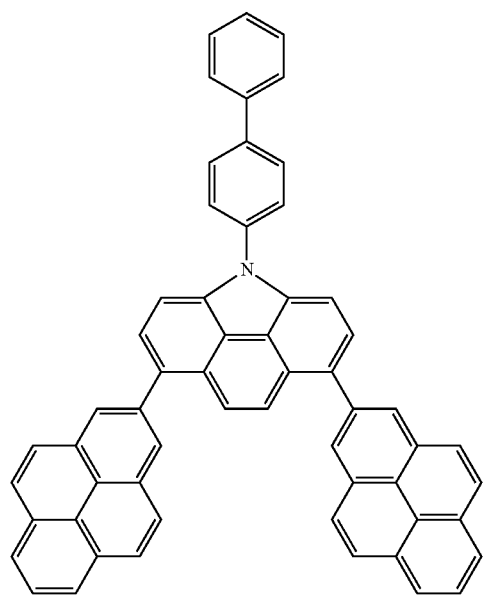
45
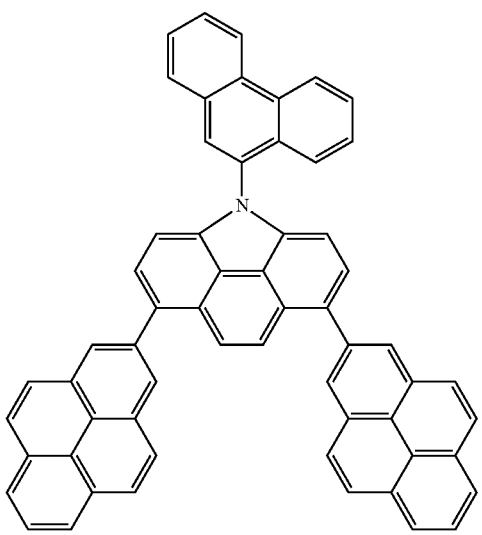

46
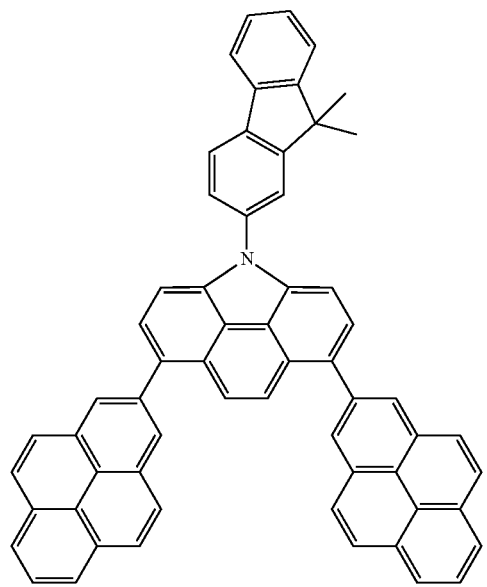
47
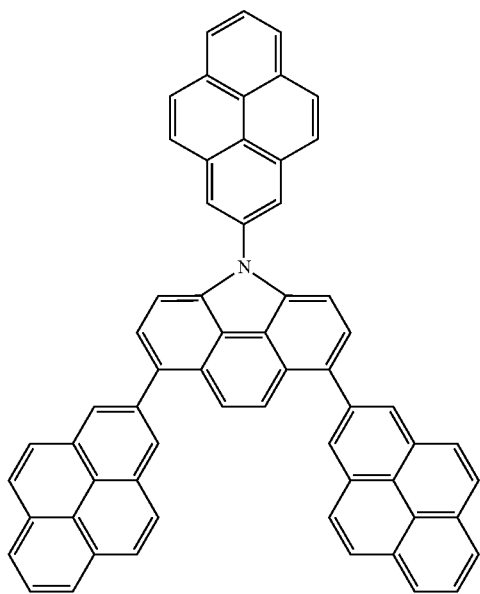
48
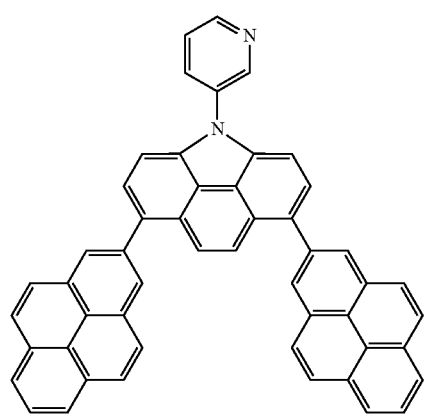
49
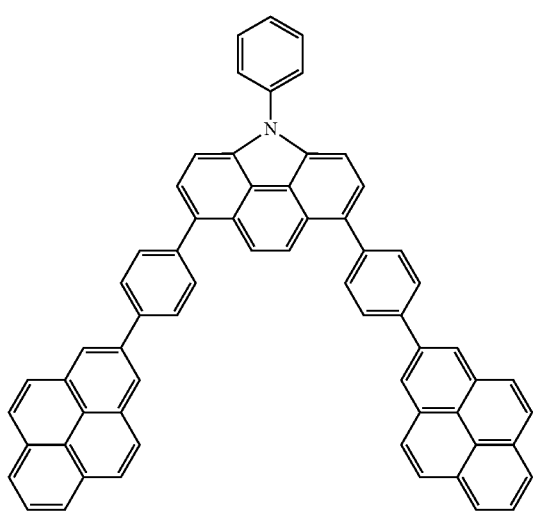

50
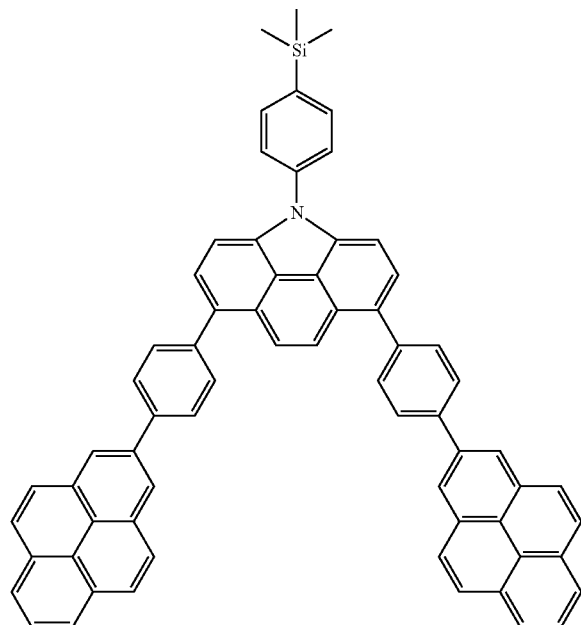
51
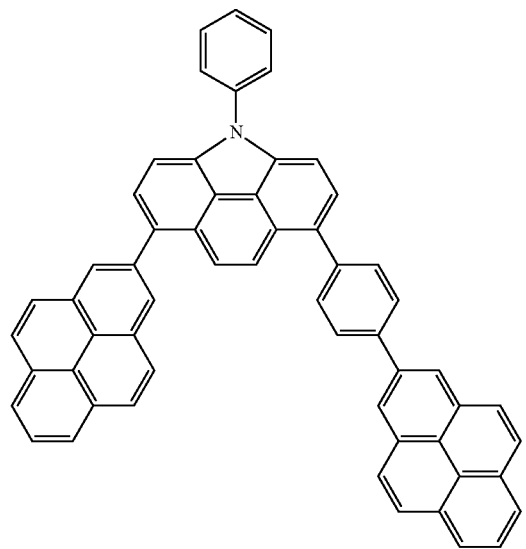
52
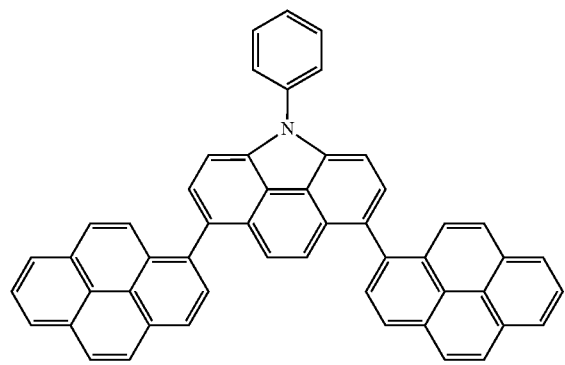
53
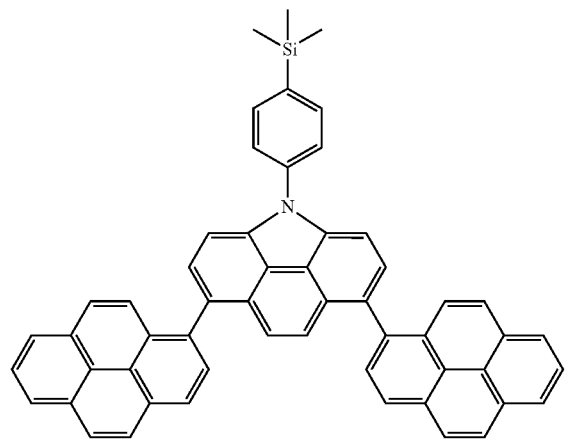
54
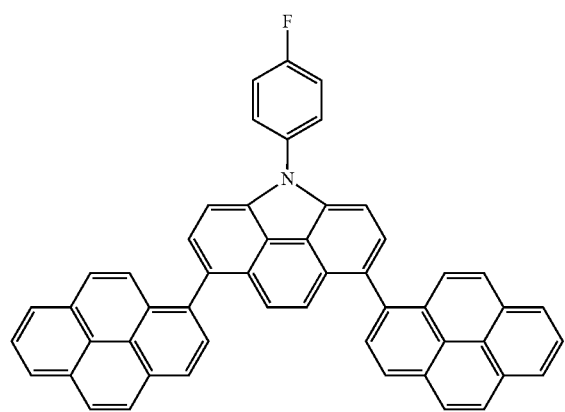
55
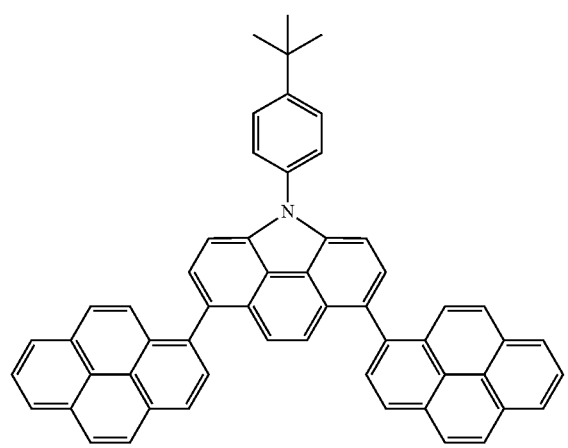

-continued
56
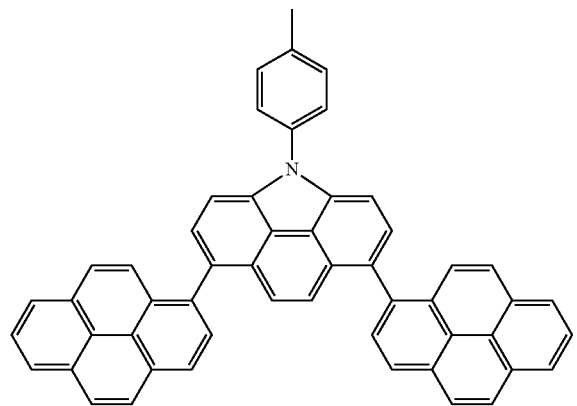
57
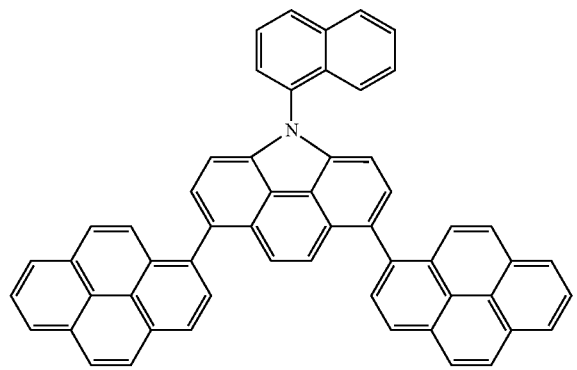
58
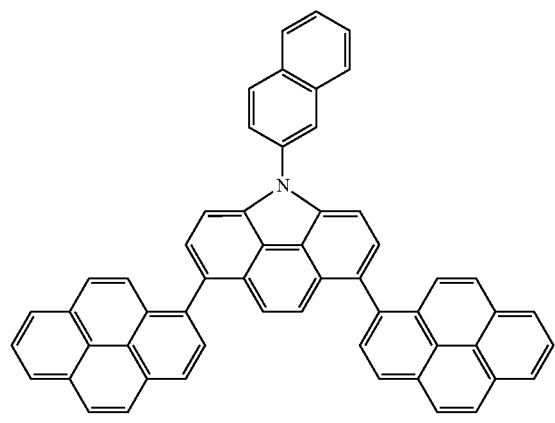
59
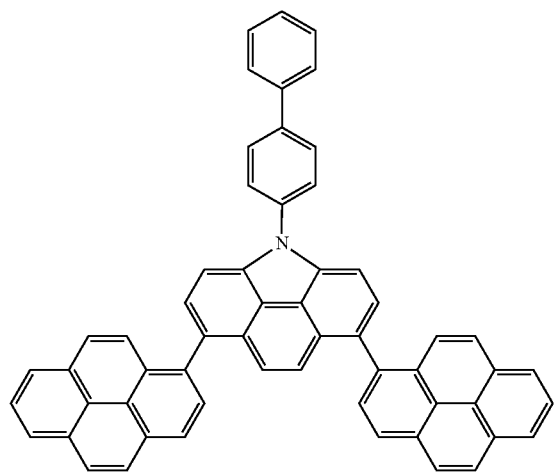
60
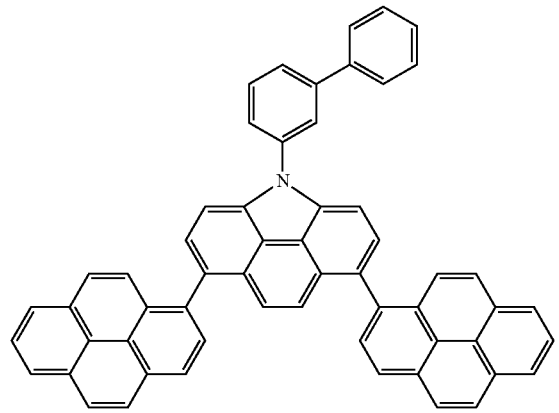
61
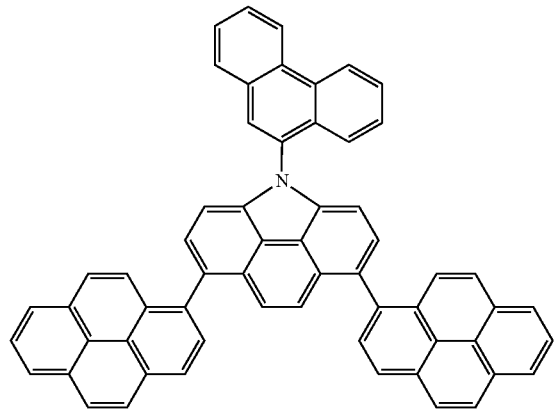

-continued
62
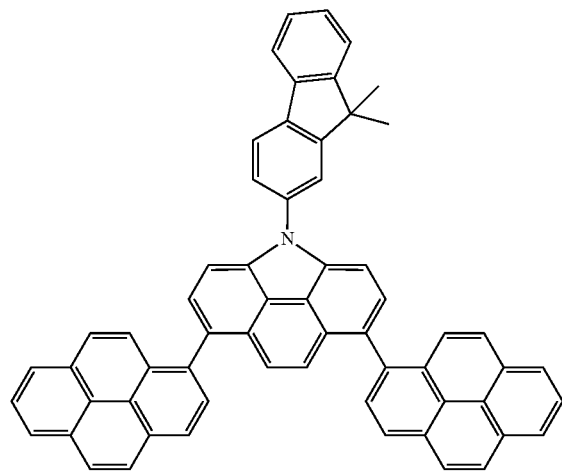
63
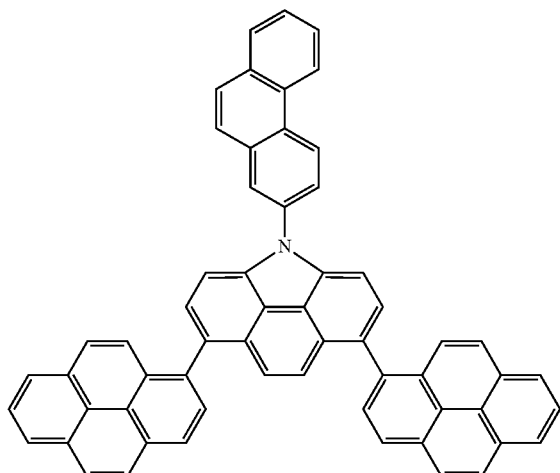
64
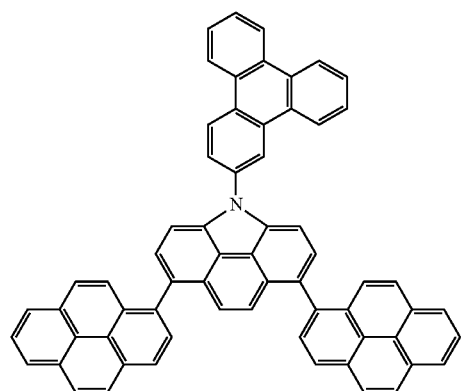
65
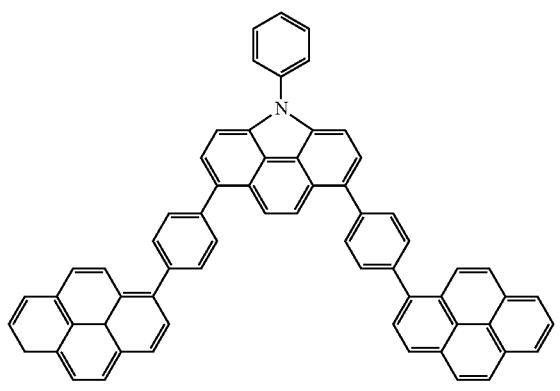
66
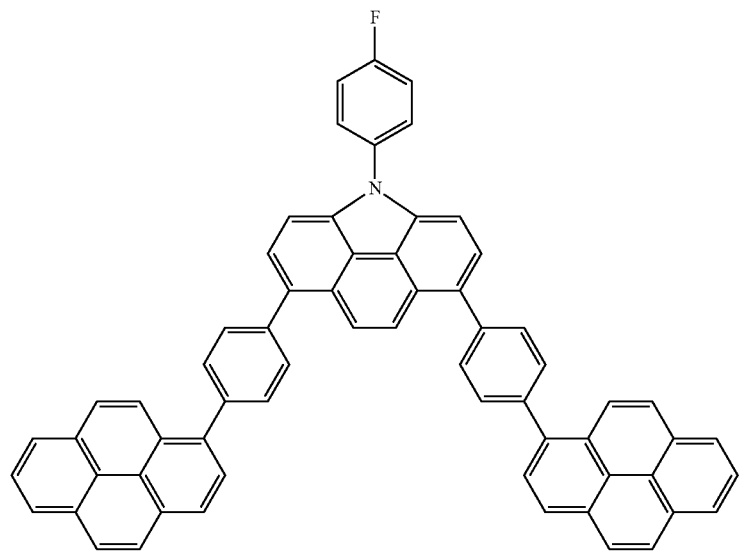

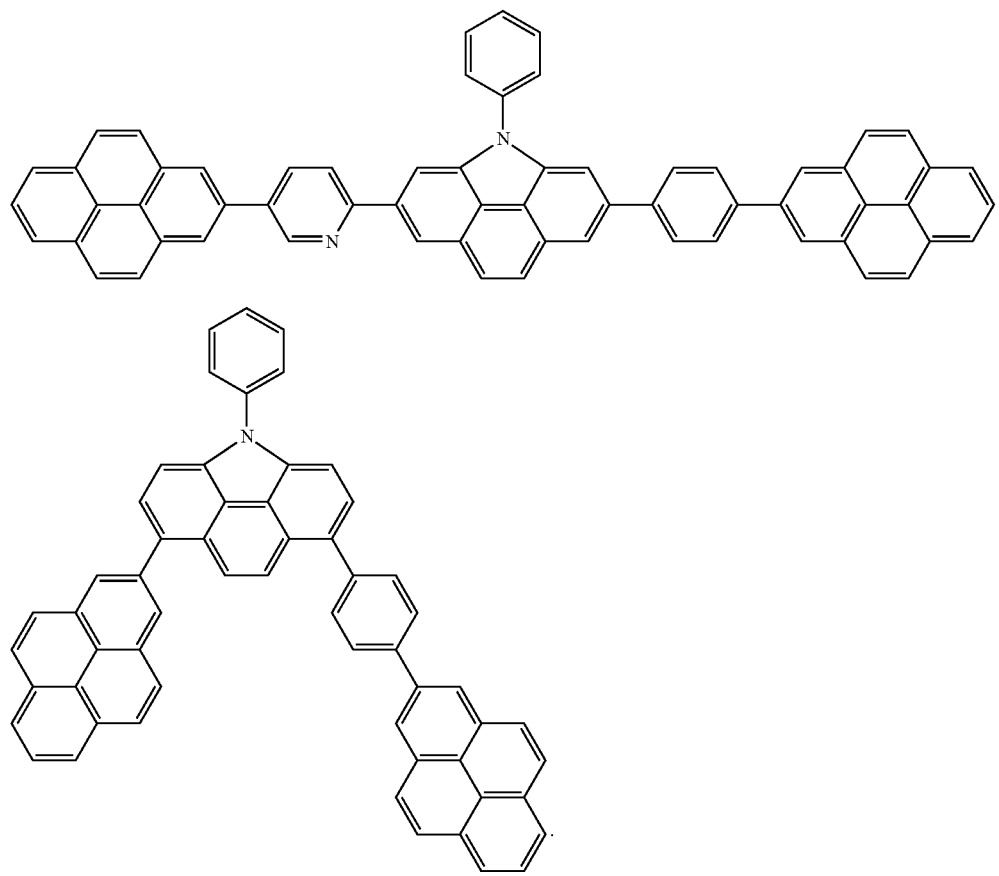

According to an embodiment, an organic light-emitting device may include a first electrode; a second electrode; and an organic layer between the first electrode and the second electrode. The organic layer may include the compound represented by Formula 1, above.

The organic layer may include at least one layer selected from a hole injection layer, a hole transport layer, a functional layer having both hole injection and hole transport capabilities (hereinafter, referred to as a "H-functional layer"), a buffer layer, an electron blocking layer, an emission layer, a hole blocking layer, an electron transport layer, an electron injection layer, and a functional layer having both electron injection and electron transport capabilities (hereinafter, referred to as an "E-functional layer").

In an implementation, the organic layer may be an emission layer. The compound according to an embodiment may be a fluorescent host in the emission layer.

According to another embodiment, the organic light-emitting device may include an emission layer and at least one of an electron injection layer, an electron transport layer, a hole injection layer, a hole transport layer, or a H-functional layer. The emission layer may include, e.g., an anthracene-based compound, an arylamine-based compound, or a styryl-based compound.

According to another embodiment, the organic light-emitting device may include an emission layer and at least one of an electron injection layer, an electron transport layer, a hole injection layer, a hole transport layer, or a H-functional layer. The emission layer may include, e.g., a red layer, a green layer, a blue layer, and/or a white layer, and any one of these layers may include a phosphorescent compound. The hole injection layer, the hole transport layer, or the H-functional layer may include a charge-generation material. In an implementation, the charge-generation material may be a p-dopant. The p-dopant may include, e.g., a quinone derivative, a metal oxide, or a cyano group-containing compound.

According to another embodiment, the organic layer may include an electron transport layer that includes a metal complex. The metal complex may be a lithium (Li) complex.

The term "organic layer" used herein may refer to a single and/or a plurality of layers disposed between the first electrode and the second electrode of the organic light-emitting device.

The organic layer may include an emission layer, and the emission layer may include the compound represented by Formula 1, above. In an implementation, the organic layer may include at least one layer selected from a hole injection layer, a hole transport layer, a functional layer having both hole injection and hole transport capabilities. At least one layer selected from the hole injection layer, the hole transport layer, and the H-functional layer may include the compound represented by Formula 1, above.

The compound included in the emission layer may act as a host. For example, the compound may act as a blue fluorescent host for emitting blue light.

FIG. 1 illustrates a cross-sectional view schematically illustrating an organic light-emitting device according to an embodiment. Hereinafter, the structure of an organic light-emitting device according to an embodiment and a method of manufacturing an organic light-emitting device according to an embodiment will be described in connection with FIG. 1.

A substrate (not illustrated) may be a suitable substrate for an organic light-emitting device, e.g., may be a glass substrate or a transparent plastic substrate, with excellent mechanical strength, thermal stability, transparency, surface smoothness, ease of handling, and water repellency.

The first electrode may be formed by, e.g., depositing or sputtering a material for forming a first electrode on the substrate. When the first electrode is an anode, the material for the first electrode may be selected from materials with a high work function to facilitate hole injection. The first electrode may be a reflective electrode or a transmission electrode. The material for the first electrode may include, e.g., a transparent and highly conductive material, and examples of such a material may include indium tin oxide (ITO), indium zinc oxide (IZO), tin oxide ($SnO_2$), and zinc oxide (ZnO). In an implementation, to form the first electrode as a reflective electrode, magnesium (Mg), aluminum (Al), aluminum-lithium (Al—Li), calcium (Ca), magnesium-indium (Mg—In), or magnesium-silver (Mg—Ag) may be used.

The first electrode may have, e.g., a single-layered structure, or a multi-layered structure including two or more layers. For example, the first electrode may have a three-layered structure of ITO/Ag/ITO.

An organic layer may be disposed on the first electrode.

The organic layer may include, e.g., a hole injection layer, a hole transport layer, a buffer layer (not shown), an emission layer, an electron transport layer, or an electron injection layer.

A hole injection layer (HIL) may be formed on the first electrode by using various methods, e.g., vacuum deposition, spin coating, casting, and a Langmuir-Blodgett (LB) method.

When the HIL is formed using vacuum deposition, the deposition conditions may vary according to the compound that is used to form the HIL, and the desired structure and thermal properties of the HIL to be formed. For example, the deposition may be performed at a temperature of about 100° C. to about 500° C., a pressure of about $10^{-8}$ torr to about $10^{-3}$ torr, and a deposition rate of about 0.01 Å/sec to about 100 Å/sec.

When the HIL is formed using spin coating, the coating conditions may vary according to the compound that is used to form the HIL, and the desired structure and thermal properties of the HIL to be formed. For example, the coating may be performed at a coating rate of about 2,000 rpm to about 5,000 rpm, and a temperature at which heat treatment is performed to remove a solvent after coating may be in the range of about 80° C. to about 200° C.

The hole injection material may include, e.g., N,N'-diphenyl-N,N'-bis-[4-(phenyl-m-tolyl-amino)-phenyl]-biphenyl-4,4'-diamine (DNTPD), a phtalocyanine compound such as copper phthalocyanine, 4,4',4"-tris(3-methylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), polyaniline/poly(4-styrenesulfonate) (PANI/PSS), or the like.

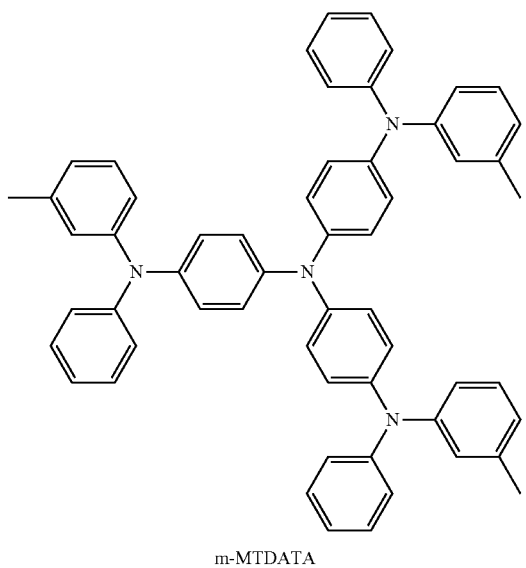

m-MTDATA

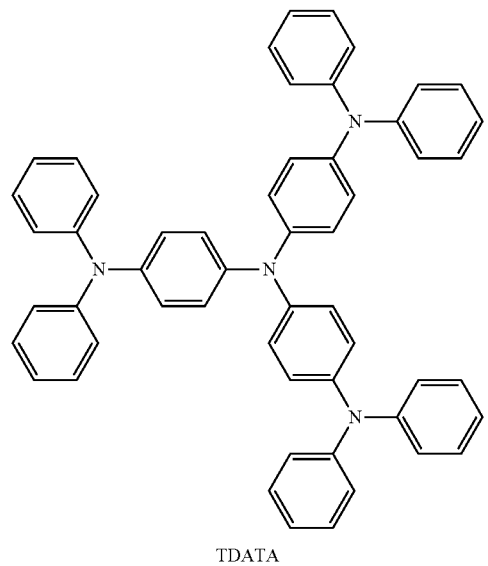

TDATA

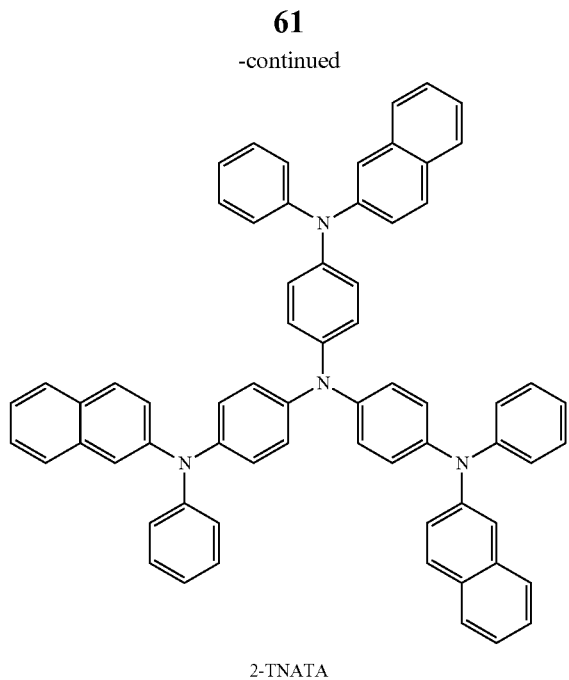

2-TNATA

A thickness of the HIL may be in a range of about 100 Å to about 10,000 Å, e.g., about 100 Å to about 1,000 Å. When the thickness of the HIL is within these ranges, satisfactory hole injecting characteristics may be obtained without a substantial increase in driving voltage.

Next, a hole transport layer (HTL) may be formed on the HIL by using various methods, e.g., vacuum deposition, spin coating, casting, and a LB method. When the HTL is formed using vacuum deposition and/or spin coating, the deposition and coating conditions may be similar to those applied to form the HIL, although the deposition and coating conditions may vary according to the material that is used to form the HTL.

The HTL material may include, e.g., a carbazole derivative, such as N-phenylcarbazole or polyvinylcarbazole, N,N'-bis(3-methylphenyl)-N,N-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB), or the like.

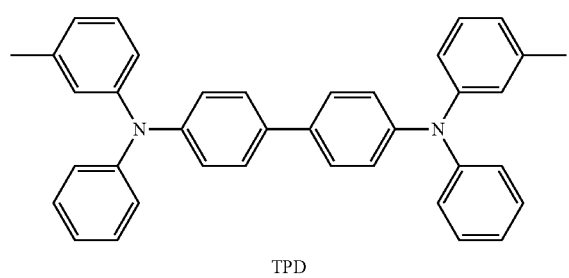

TPD

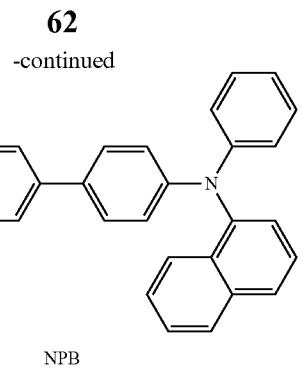

NPB

A thickness of the HTL may be in a range of about 50 Å to about 2,000 Å, e.g., about 100 Å to about 1,500 Å. When the thickness of the HTL is within these ranges, satisfactory hole transporting characteristics may be obtained without a substantial increase in driving voltage.

The H-functional layer may include at least one material selected from the materials used to form a HIL and the materials used to form a HTL, and a thickness of the H-functional layer may be in a range of about 100 Å to about 10,000 Å, e.g., about 100 Å to about 1,000 Å. When the thickness of the H-functional layer is within these ranges, satisfactory hole injecting and transporting characteristics may be obtained without a substantial increase in driving voltage.

In an implementation, at least one layer of the HIL, the HTL, and the H-functional layer may include at least one of a compound represented by Formula 300 below or a compound represented by Formula 350 below.

<Formula 300>

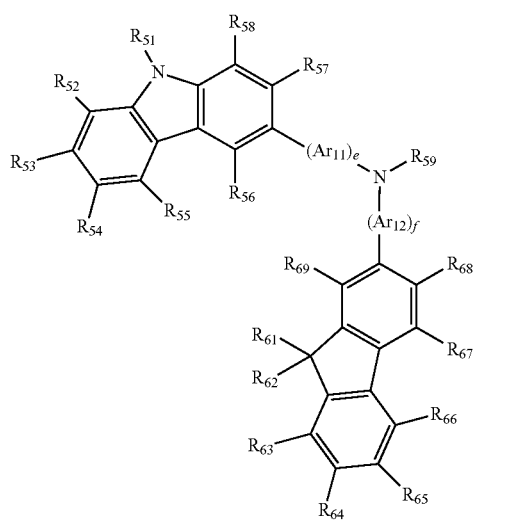

<Formula 350>

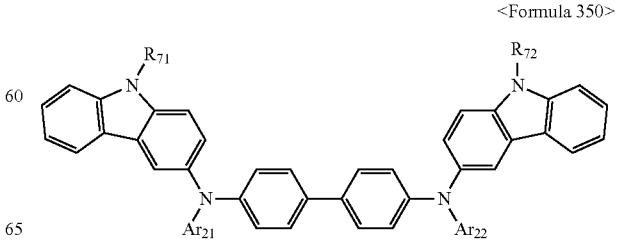

In Formulae 300 and 350, $Ar_{11}$, $Ar_{12}$, $Ar_{21}$, and $Ar_{22}$ may be each independently a substituted or unsubstituted $C_5$-$C_{60}$ arylene or aryl group.

e and f in Formula 300, may be each independently an integer of 0 to 5 or 0, 1, or 2. For example, e may be 1 and f may be 0.

$R_{51}$ to $R_{58}$, $R_{61}$ to $R_{69}$ and $R_{71}$, and $R_{72}$ in Formulae 300 and 350, may be each independently a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$ and $R_{71}$, and $R_{72}$ may be each independently one selected from a hydrogen; a deuterium; a halogen atom; a hydroxyl group; a cyano group; a nitro group; an amino group; an amidino group; a hydrazine group; a hydrazone group; a carboxyl group or a salt thereof; a sulfonic acid or a salt thereof; a phosphoric acid or a salt thereof; a $C_1$-$C_{10}$ alkyl group (e.g., a methyl group, an ethyl group, a propyl group, a butyl group, a pentyl group, or a hexyl group); a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof;

a phenyl group; a naphtyl group; an anthryl group; a fluorenyl group; a pyrenyl group; and a phenyl group, a naphtyl group, an anthryl group, a fluorenyl group, and a pyrenyl group, each substituted with at least one selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group.

$R_{59}$ in Formula 300 may be one selected from:
a phenyl group; a naphtyl group; an anthryl group; a biphenyl group; a pyridyl group; and
a phenyl group, a naphtyl group, an anthryl group, a biphenyl group, and a pyridyl group, each substituted with at least one selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{20}$ alkyl group, and a substituted or unsubstituted $C_1$-$C_{20}$ alkoxy group.

In an implementation, the compound of Formula 300 may be represented by Formula 300A, below.

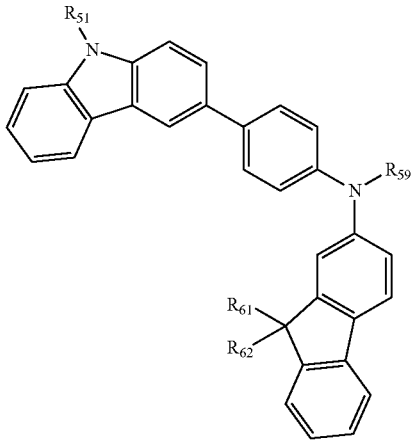

<Formula 300A>

$R_{51}$, $R_{60}$, $R_{61}$, and $R_{59}$ in Formula 300A may be the same as described above with respect to Formula 300.

In an implementation, at least one layer of the HIL, the HTL, or the H-functional layer may include at least one of Compounds 301 to 320 below.

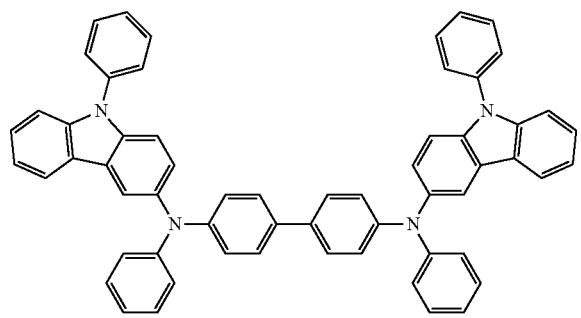

301

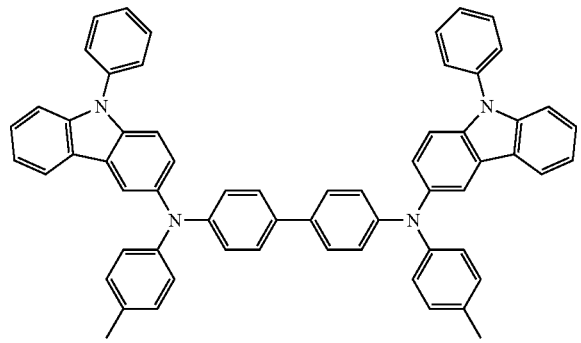

302

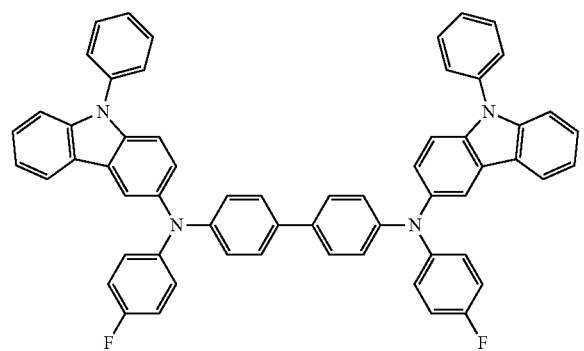
303
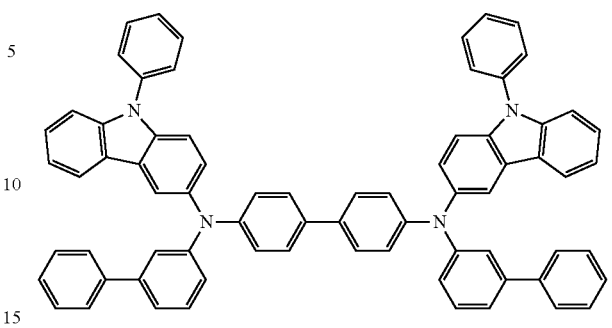
307
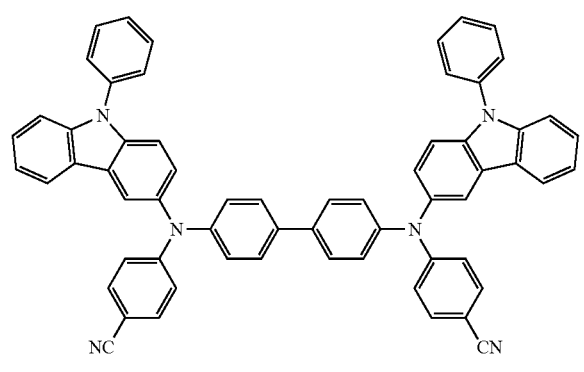
304
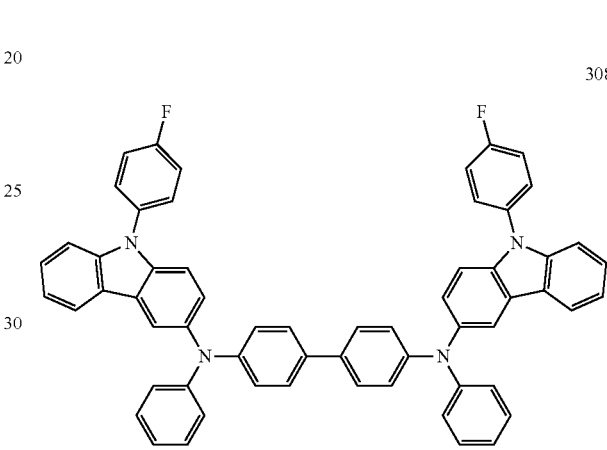
308
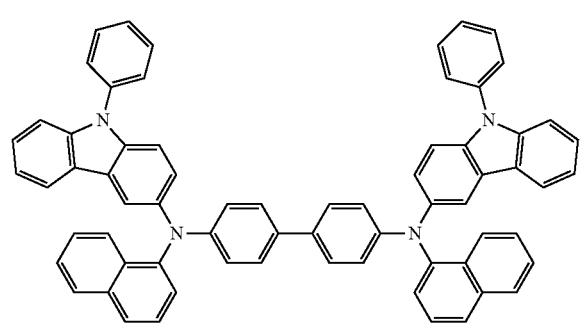
305
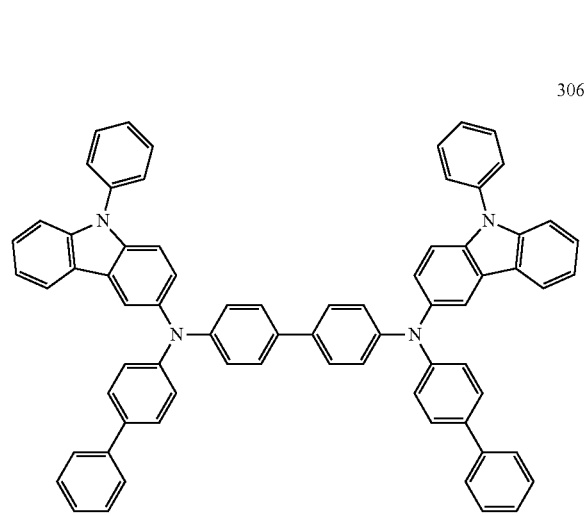
306
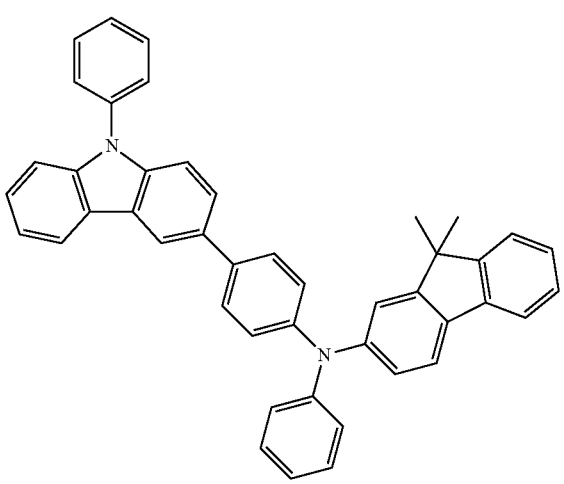
309

310
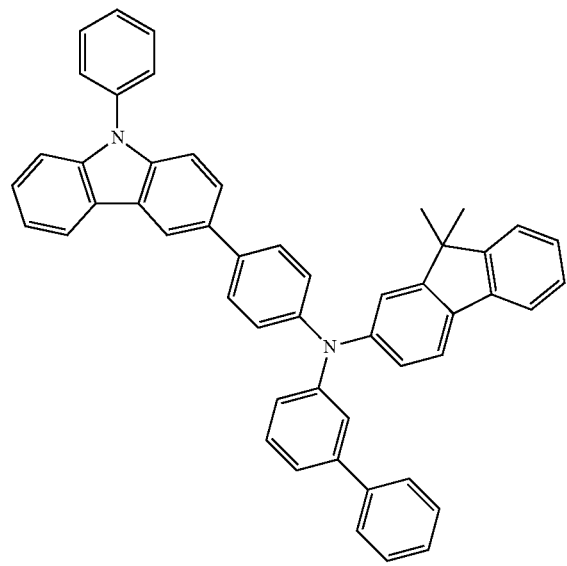
311
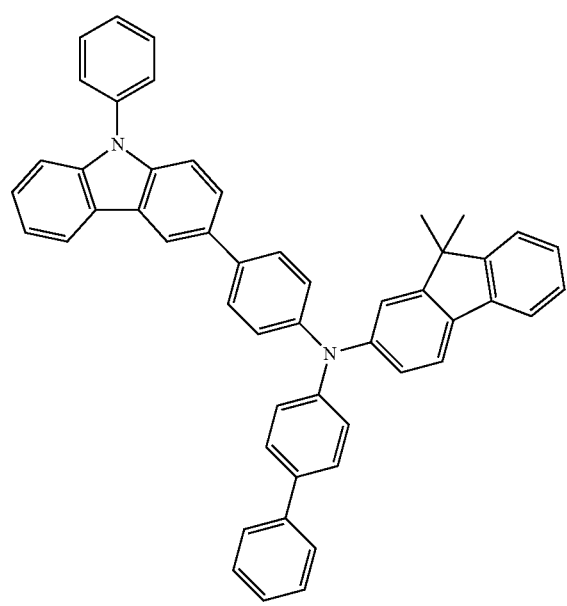
312
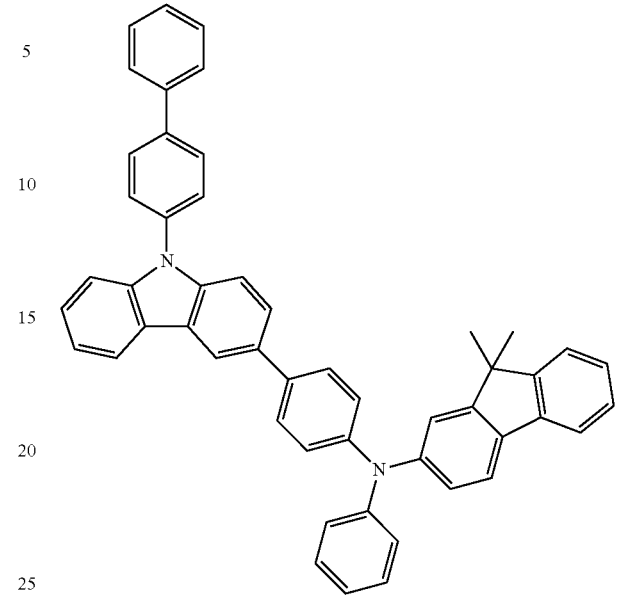
313
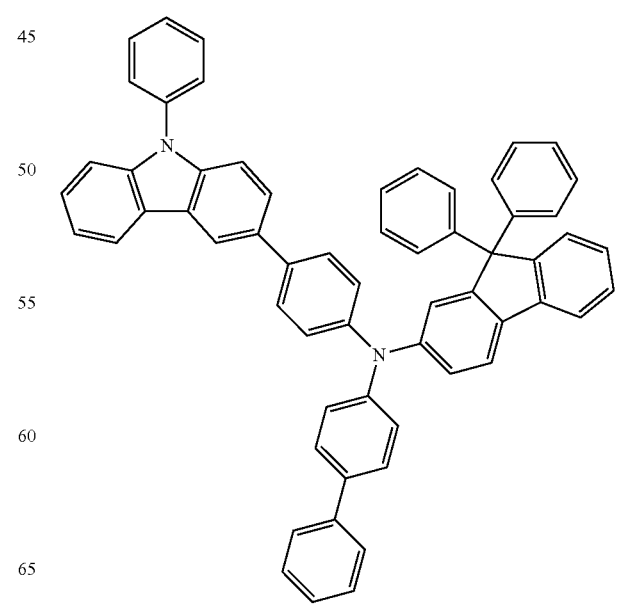

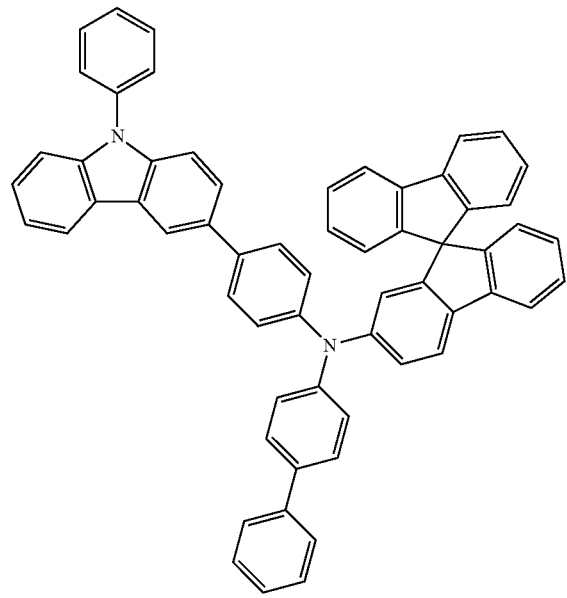
314
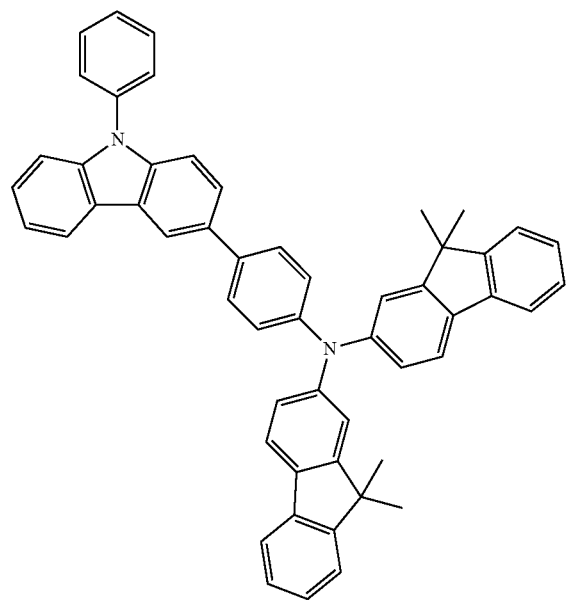
315
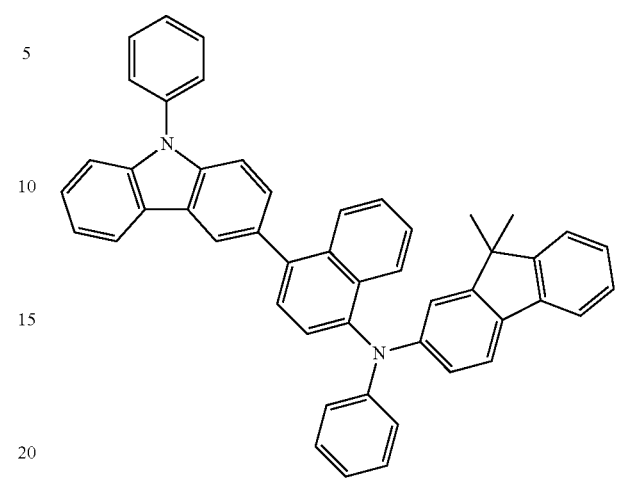
316
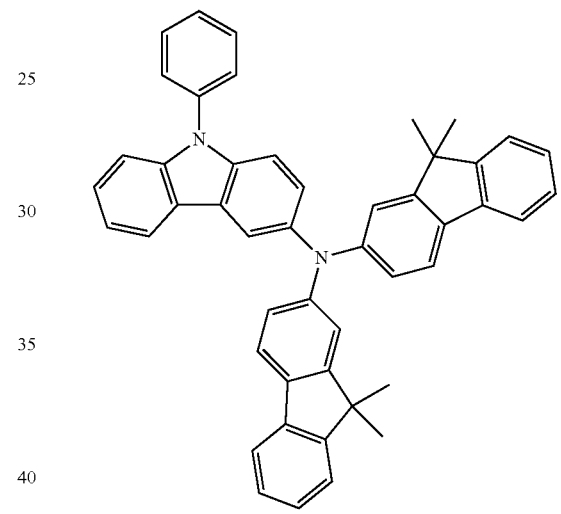
317
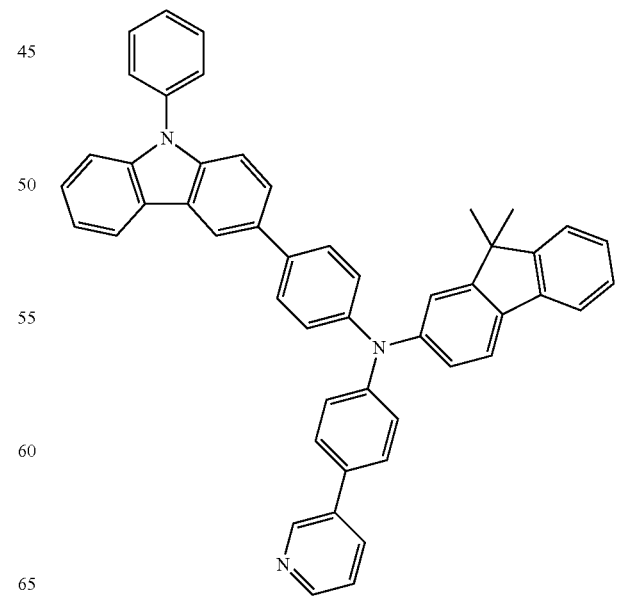
318

-continued

319

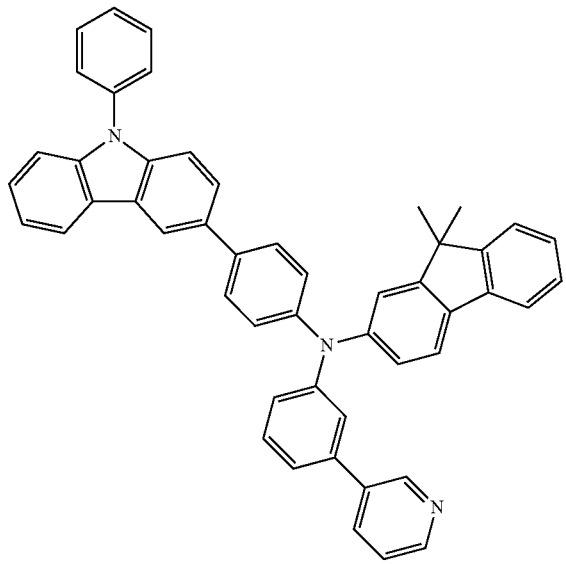

<Compound 200>

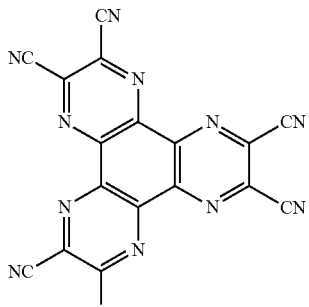

<F4-TCNQ>

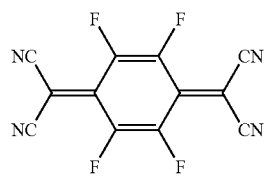

320

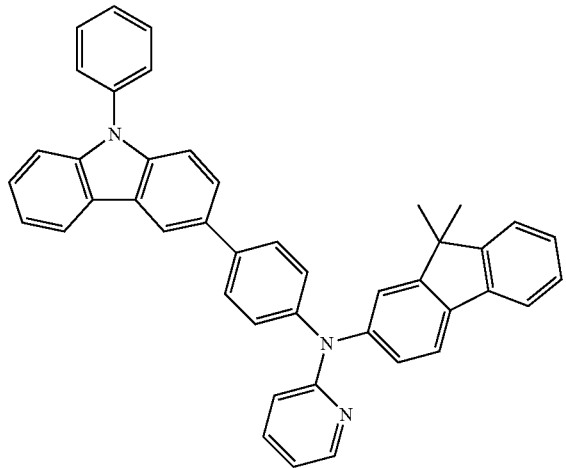

At least one layer of the HIL, the HTL, or the H-functional layer may further include a charge-generation material to help increase conductivity of a layer, in addition to other hole injection materials, hole transport materials, and/or materials having both hole injection and hole transport capabilities.

The charge-generation material may be, e.g., a p-dopant. The p-dopant may include one of, e.g., a quinone derivative, a metal oxide, a cyano group-containing compound, or the like. Examples of the p-dopant may include a quinone derivative, such as tetracyanoquinodimethane (TCNQ) or 2,3,5,6-tetrafluoro-tetracyano-1,4-benzoqinodimethane (F4-TCNQ); a metal oxide, such as tungsten oxide or molybdenum oxide; a cyano group-containing compound, such as Compound 200 below, and the like.

When the HIL, the HTL, or the H-functional layer further includes a charge-generation material, the charge-generation material may be homogeneously dispersed or non-homogeneously distributed in the HIL, the HTL, or the H-functional layer.

A buffer layer may be disposed between at least one layer of the HIL, the HTL, and the H-functional layer, and the emission layer. The buffer layer may help compensate for an optical resonance distance according to a wavelength of light emitted from the emission layer. Thus, efficiency of a formed organic light-emitting device may be improved. The buffer layer may include a suitable hole injection material and/or hole transport material. In an implementation, the buffer layer may include a material that is identical to one of materials included in the HIL, the HTL, and the H-functional layer formed under the buffer layer.

Subsequently, an emission layer (EML) may be formed on the HIL, the H-functional layer, or the buffer layer by using various methods, such as vacuum deposition, spin coating, casting, or an LB method. When the EML is formed using vacuum deposition and/or spin coating, the deposition and coating conditions may be similar to those applied to form the HIL, although the deposition and coating conditions may vary according to the material that is used to form the EML.

The EML may include the compound according to an embodiment. For example, the compound represented by Formula 1 may be used as a host. In addition to the compound of Formula 1, the EML may be formed using a variety of suitable luminescent materials, e.g., a suitable host and/or a suitable dopant. When a dopant is used, both a suitable fluorescent dopant and a suitable phosphorescent dopant may be used.

Examples of the host may include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (see the following chemical structure), Compounds 501 to 509 illustrated below, and the like.

TPBI
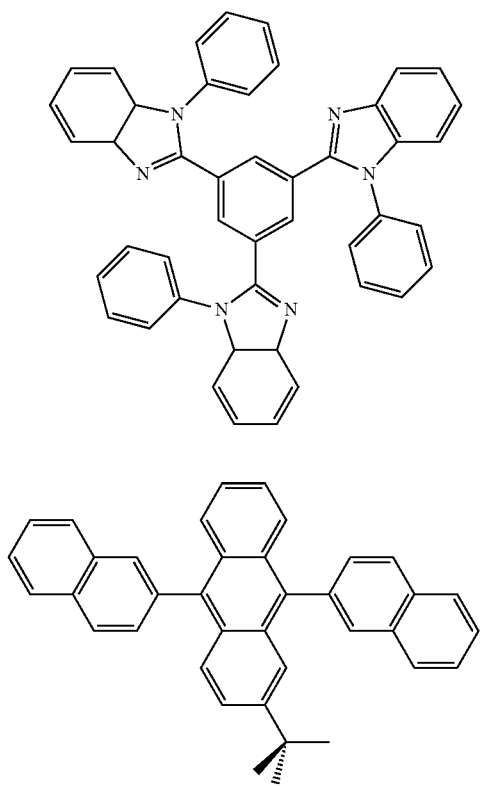
TBADN
dmCBP
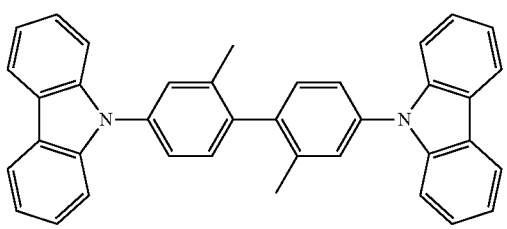
501
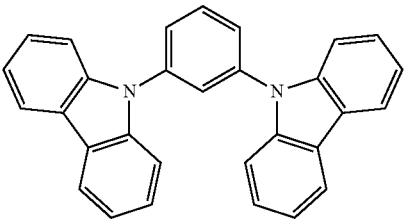
E3
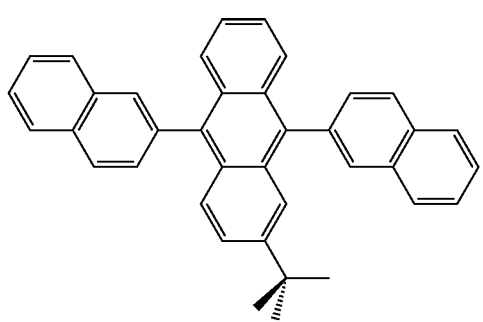
PVK
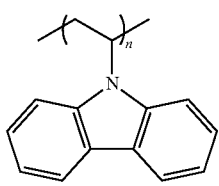
502
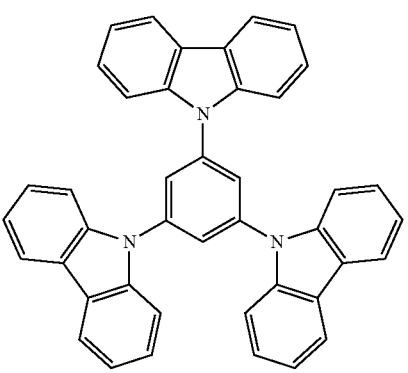
ADN
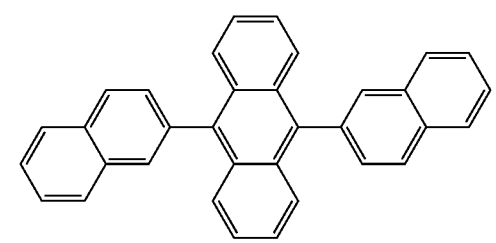
CBP
503
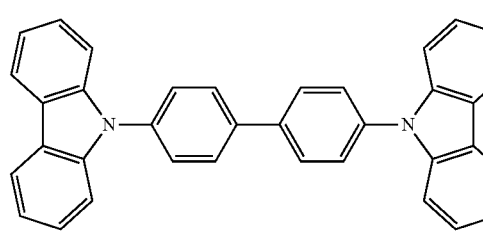
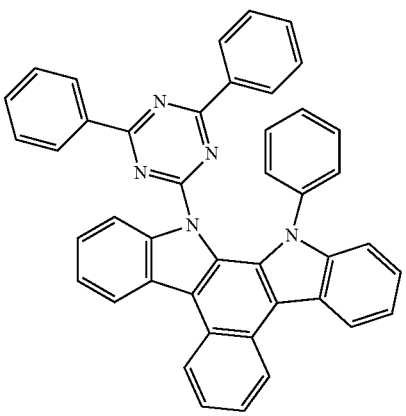

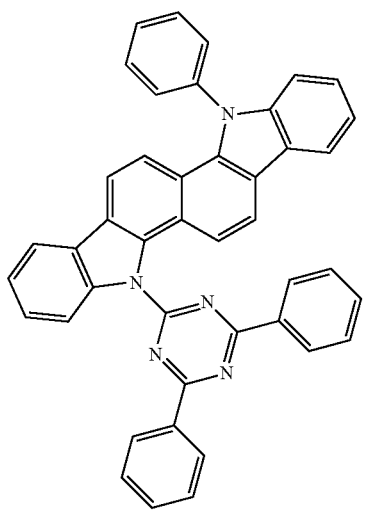
504
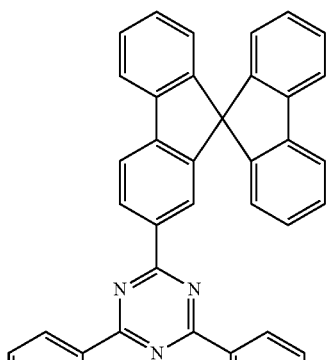
507
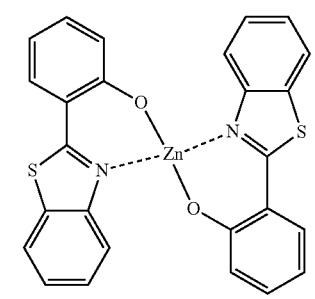
508
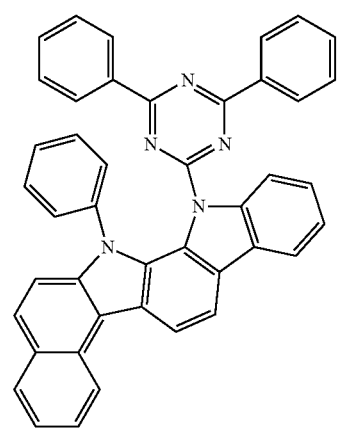
505
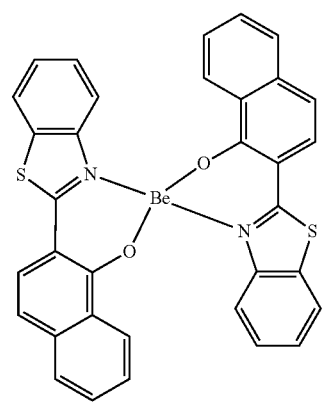
509
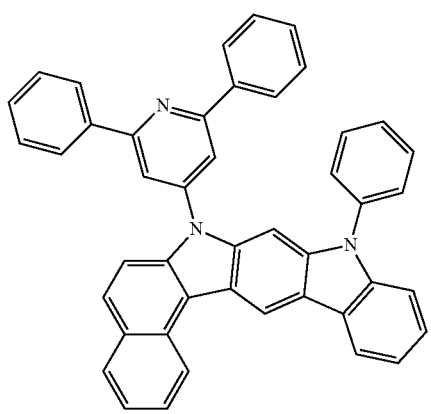
506
An example of the host may include an anthracene-based compound represented by Formula 400, below.
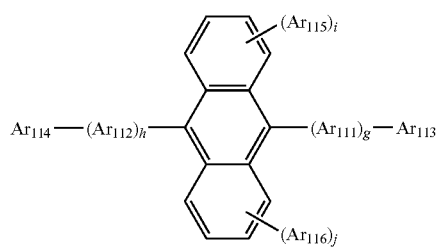
<Formula 400>
In Formula 400, $Ar_{111}$ and $Ar_{112}$ may be each independently a substituted or unsubstituted $C_5$-$C_{60}$ arylene group; $Ar_{113}$ to $Ar_{116}$ may be each independently a substituted or unsubstituted $C_1$-$C_{10}$ alkyl group or a substituted or unsubstituted $C_5$-$C_{60}$ aryl group; g, h, I, and j may be each independently an integer of 0 to 4.

For example, $Ar_{111}$ and $Ar_{112}$ in Formula 400 may be each independently a phenylene group, a naphthylene group, a phenanthrenyl group, or pyrenylene group; or a phenylene group, a naphthylene group, a phenanthrenyl group, a fluorenyl group, or a pyrenylene group, each substituted with at least one of a phenyl group, a naphthyl group, or an anthryl group.

g, h, i, and j in Formula 400 may each be independently 0, 1, or 2.

$Ar_{113}$ to $Ar_{116}$ in Formula 400 may be each independently one selected from a $C_1$-$C_{10}$ alkyl group substituted with at least one of a phenyl group, a naphthyl group, or an anthryl group; a phenyl group; a naphtyl group; an anthryl group; a pyrenyl group; a phenanthrenyl group; a fluorenyl group; a phenyl group, a naphthyl group, an anthryl group, a pyrenyl group, a phenanthrenyl group, or a fluorenyl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphtyl group, an anthryl group, a pyrenyl group, a phenanthrenyl group, and a fluorenyl group; and

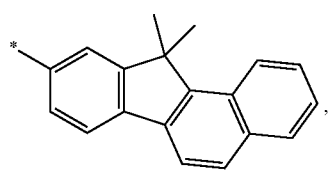 [SMILES: *c1ccc2c(c1)C(C)(C)c1c-2ccc2ccccc12]

or the like.

For example, the anthracene-based compound represented by Formula 400 may be one of the following compounds.

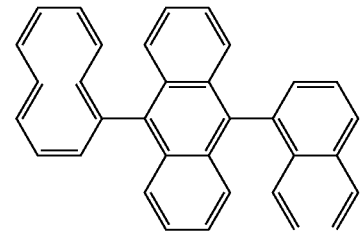

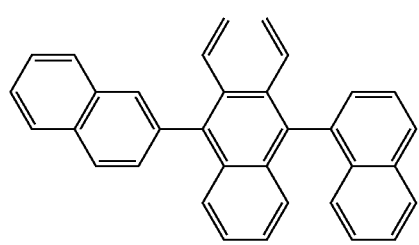

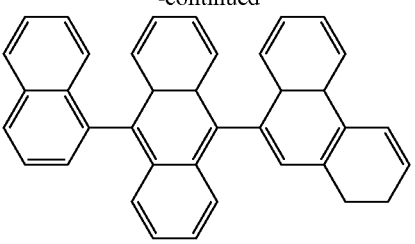

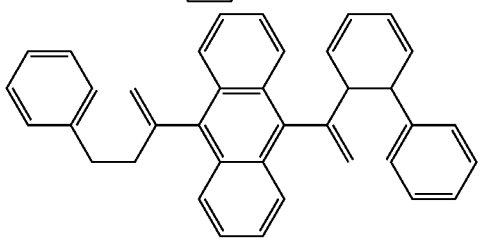

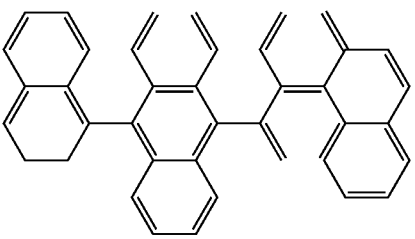

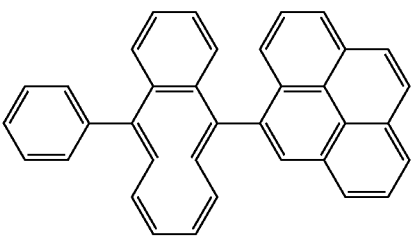

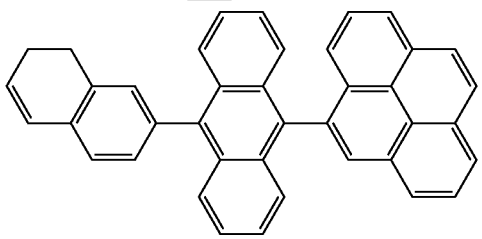

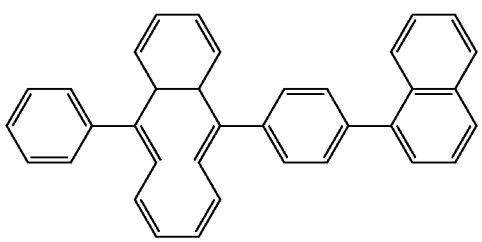

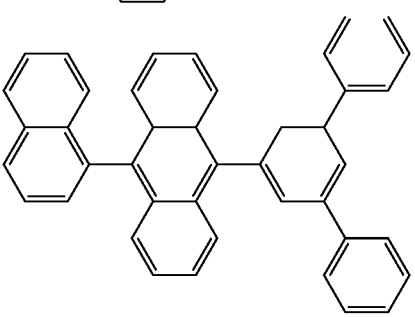

-continued
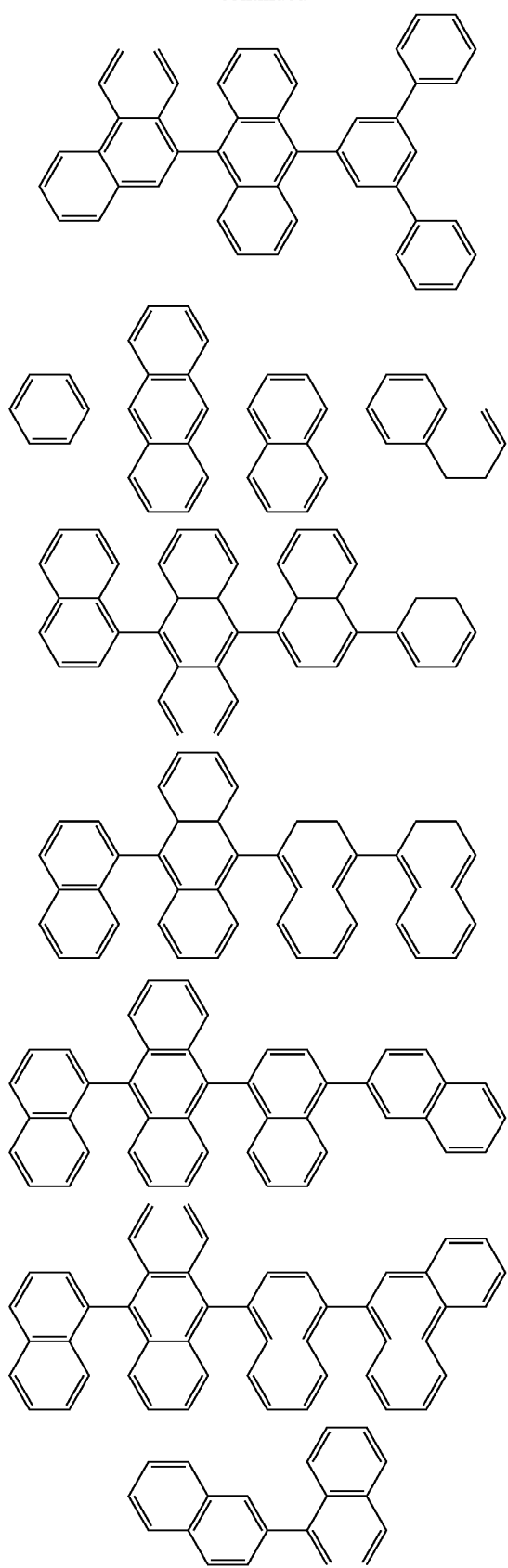
-continued
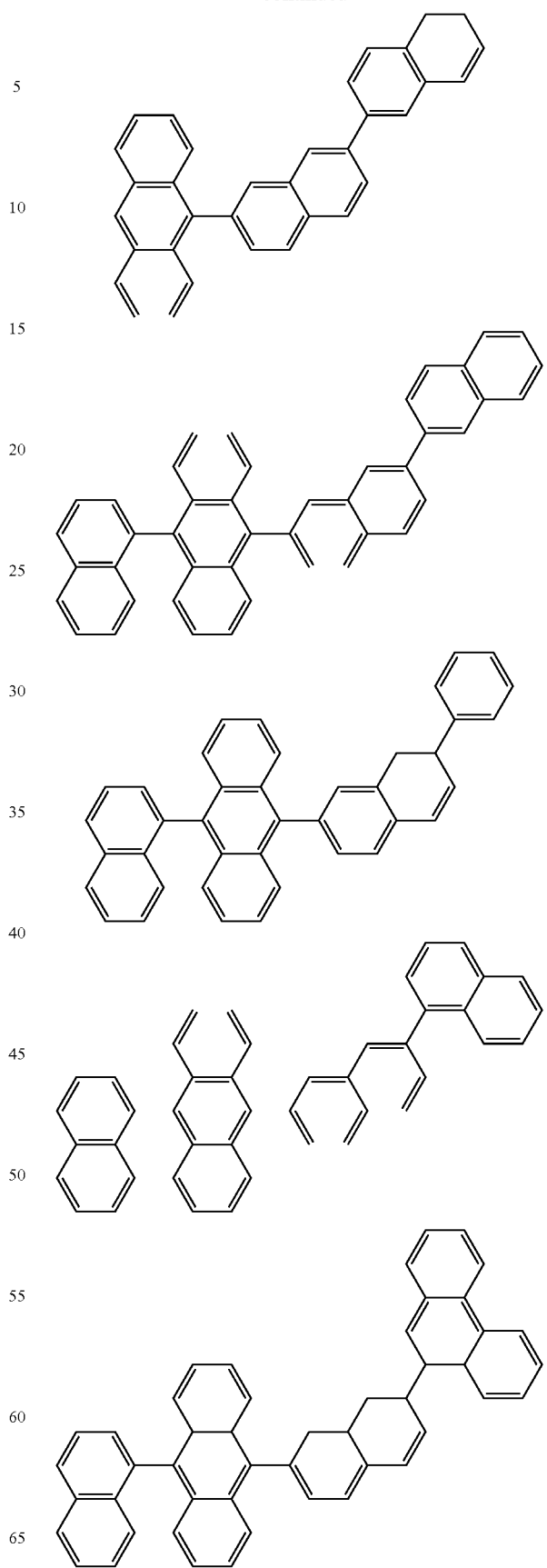

-continued
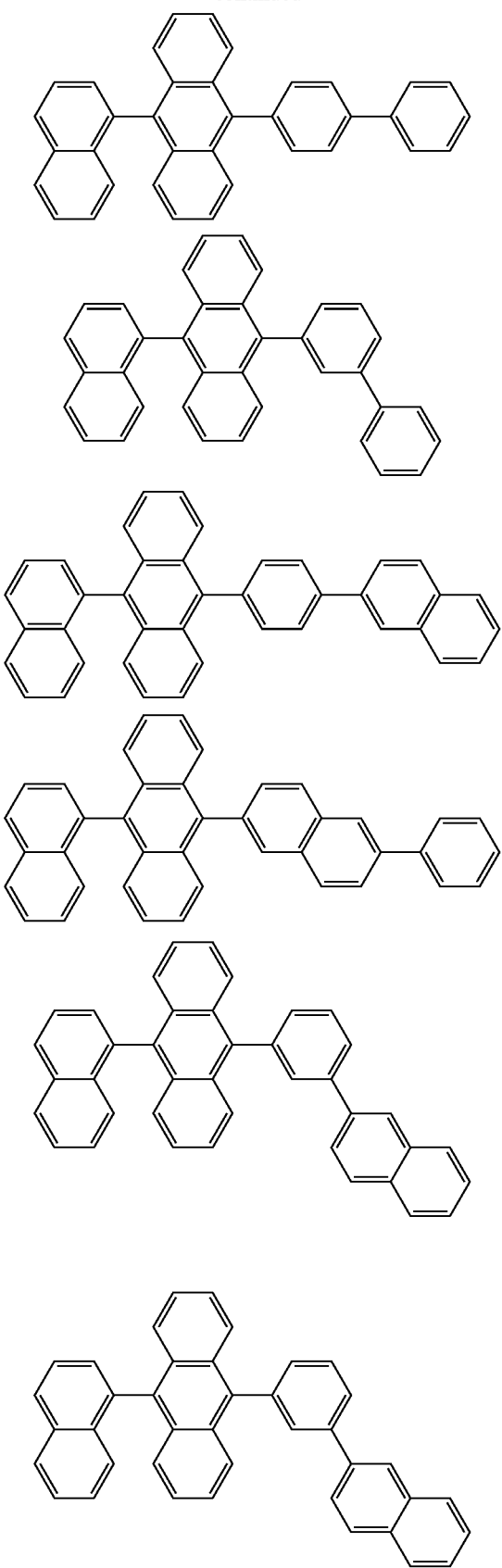
-continued
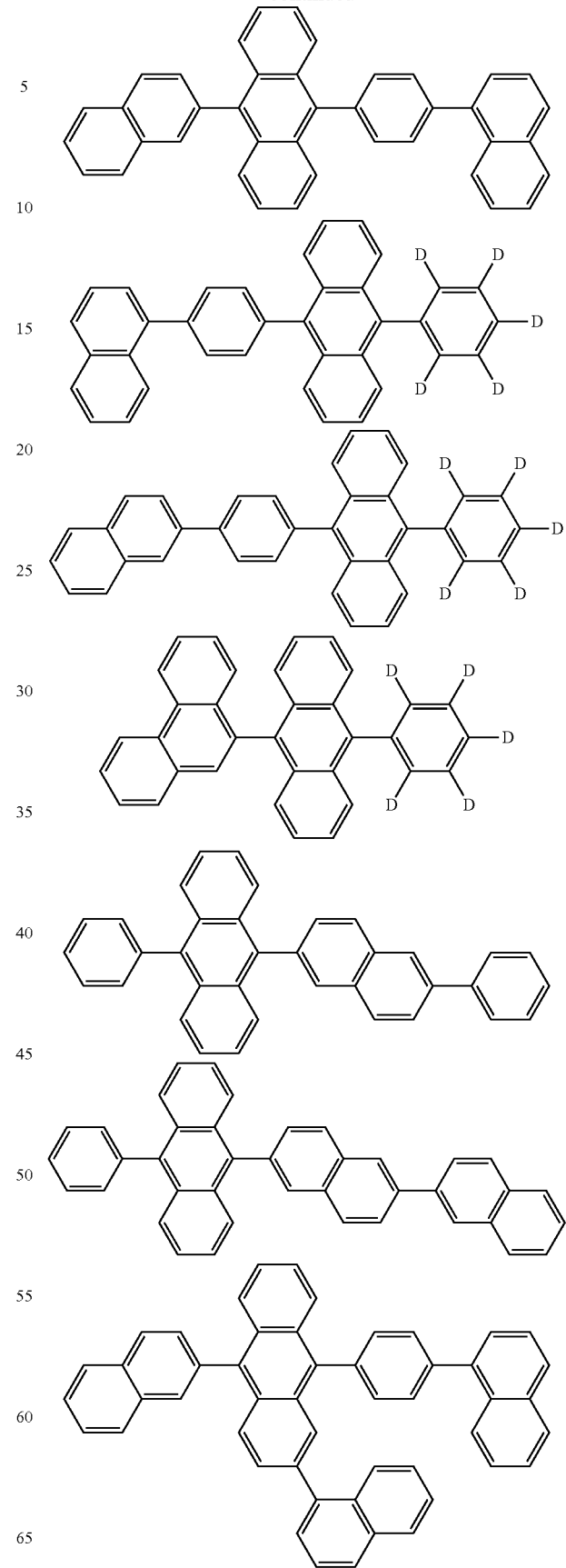

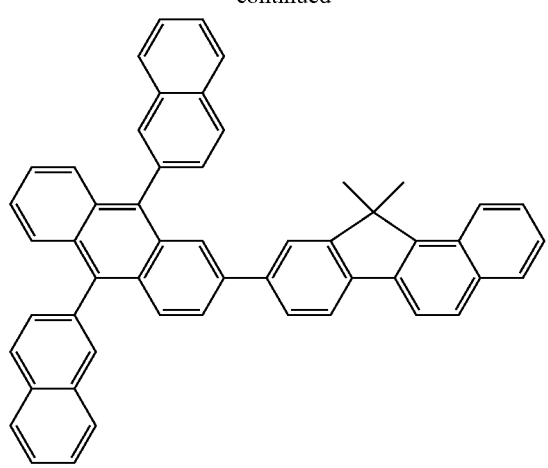

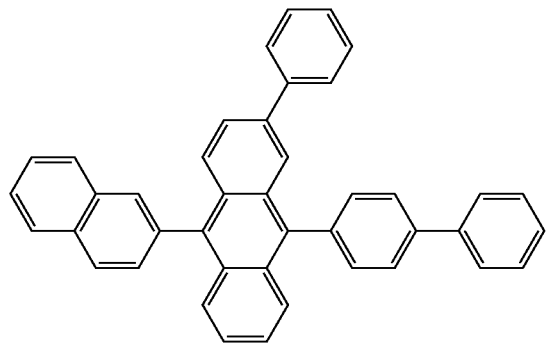

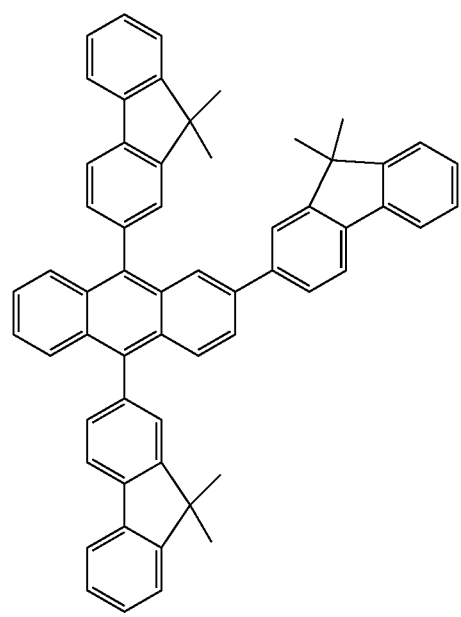

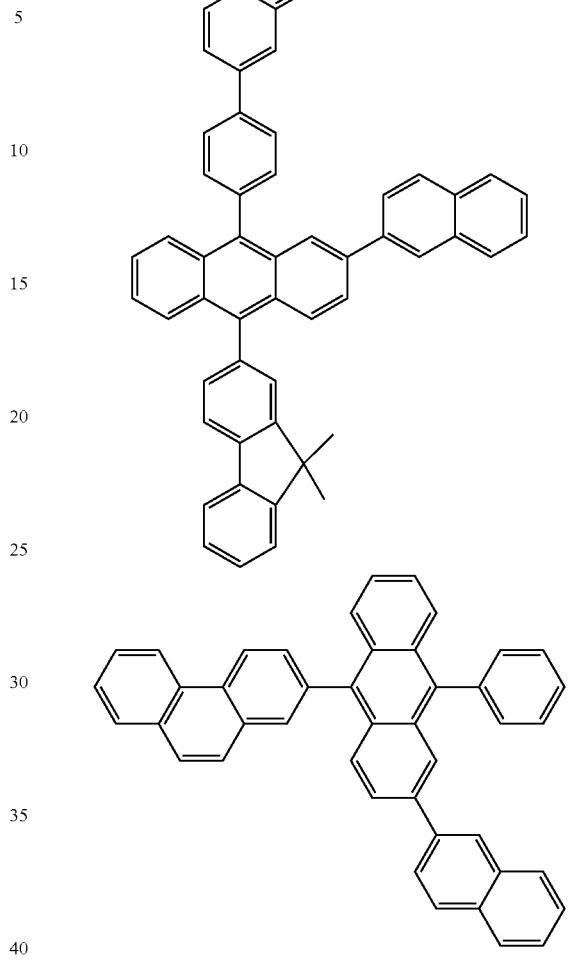

In an implementation, the host may be or may include an anthracene-based compound represented by Formula 401, below.

<Formula 401>

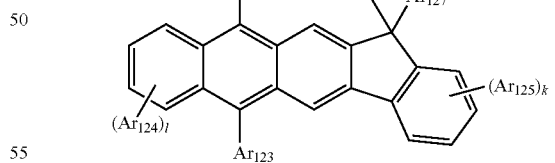

$Ar_{122}$ to $Ar_{125}$ in Formula 401 may be the same as described above in connection with $Ar_{113}$ in Formula 400.

$Ar_{126}$ and $Ar_{127}$ in Formula 401 may be each independently a $C_1$-$C_{10}$ alkyl group (e.g., a methyl group, an ethyl group, or a propyl group).

k and l in Formula 401 may be each independently an integer of 0 to 4. For example, k and l may be 0, 1, or 2.

In an implementation, the anthracene-based compound represented by Formula 401 may be one of the following compounds.

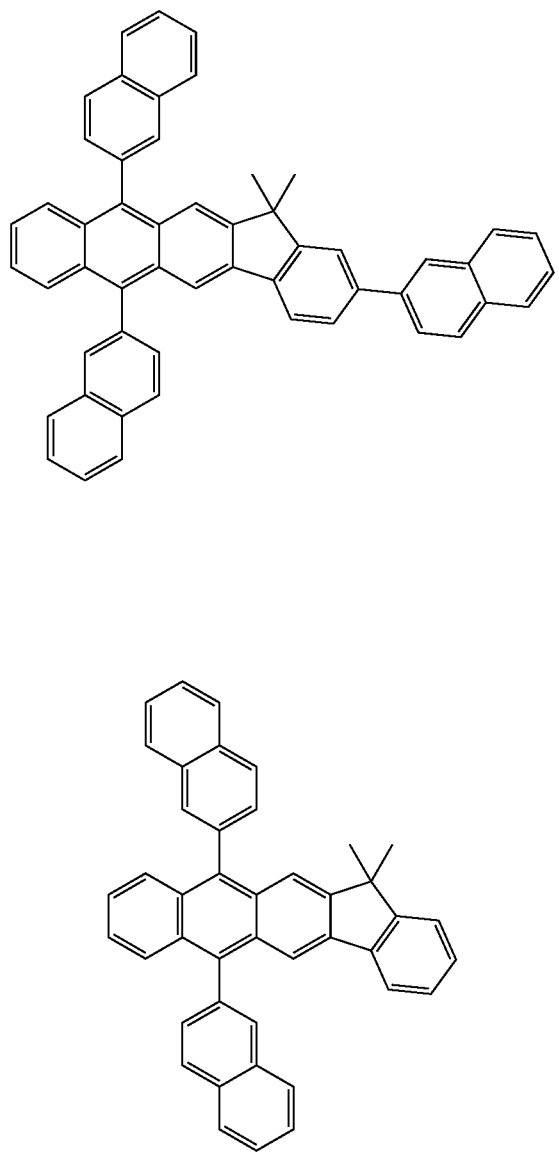
When the organic light-emitting device is a full color organic light-emitting device, the EML may be patterned into a red EML, a green EML, and a blue EML.
In an implementation, at least one of the red EML, the green EML, and the blue EML may include one of the following dopants (ppy=phenylpyridine).
For example, compounds illustrated below may be used as a blue dopant.

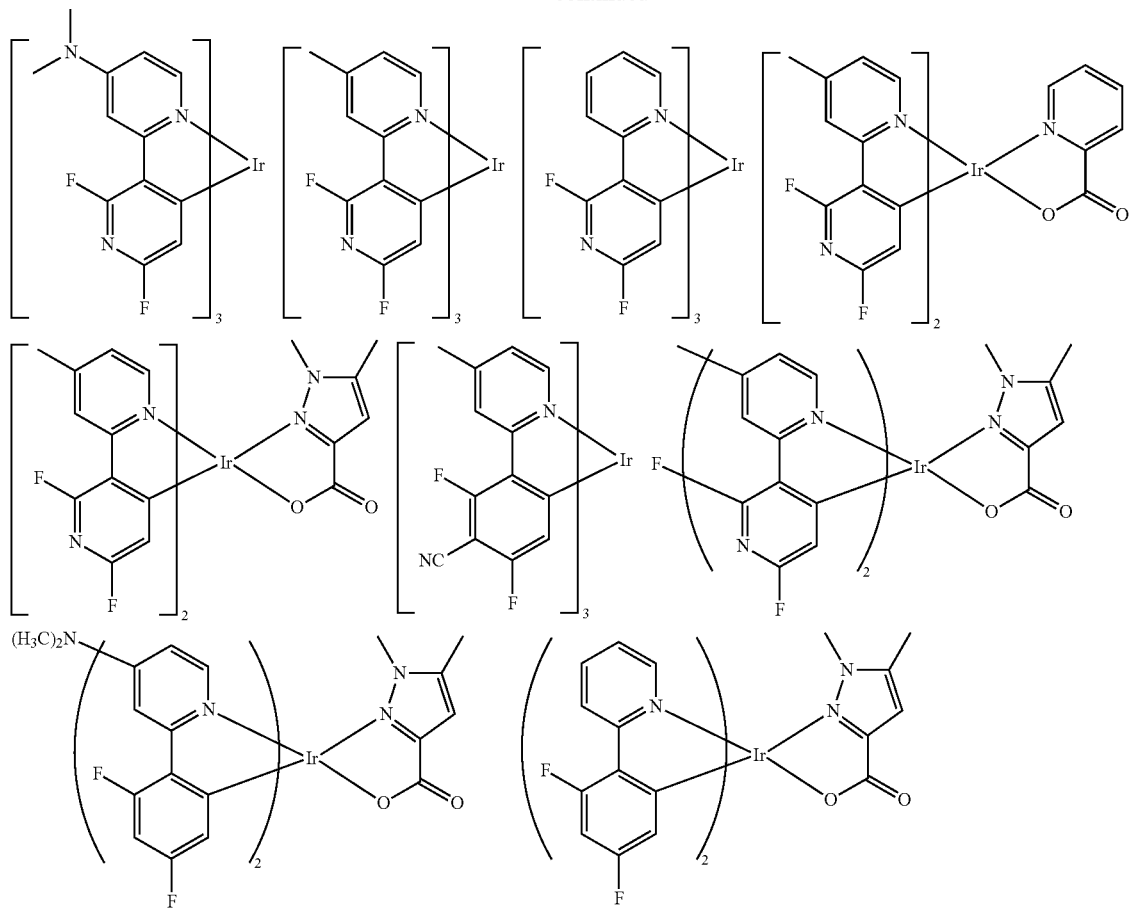
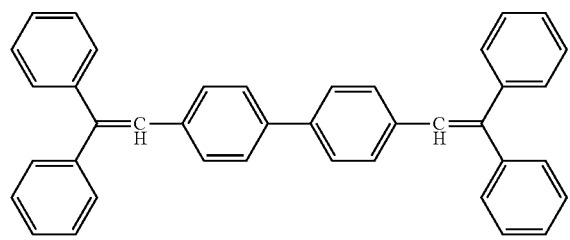
DPVBi
DPAVBi
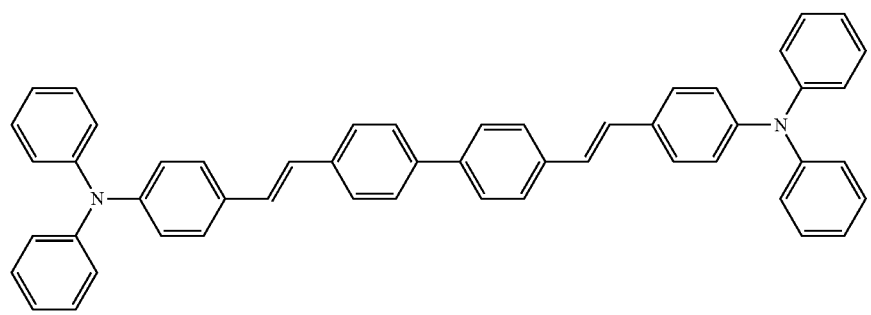

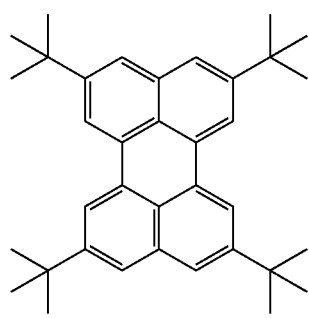
TBPe
For example, compounds illustrated below may be used as a red dopant.
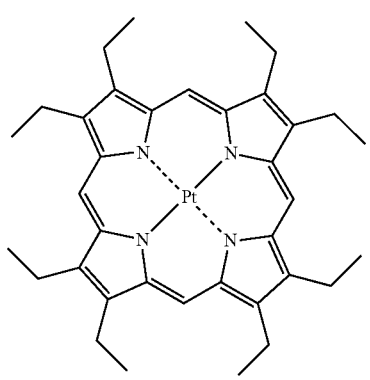
PtOEP
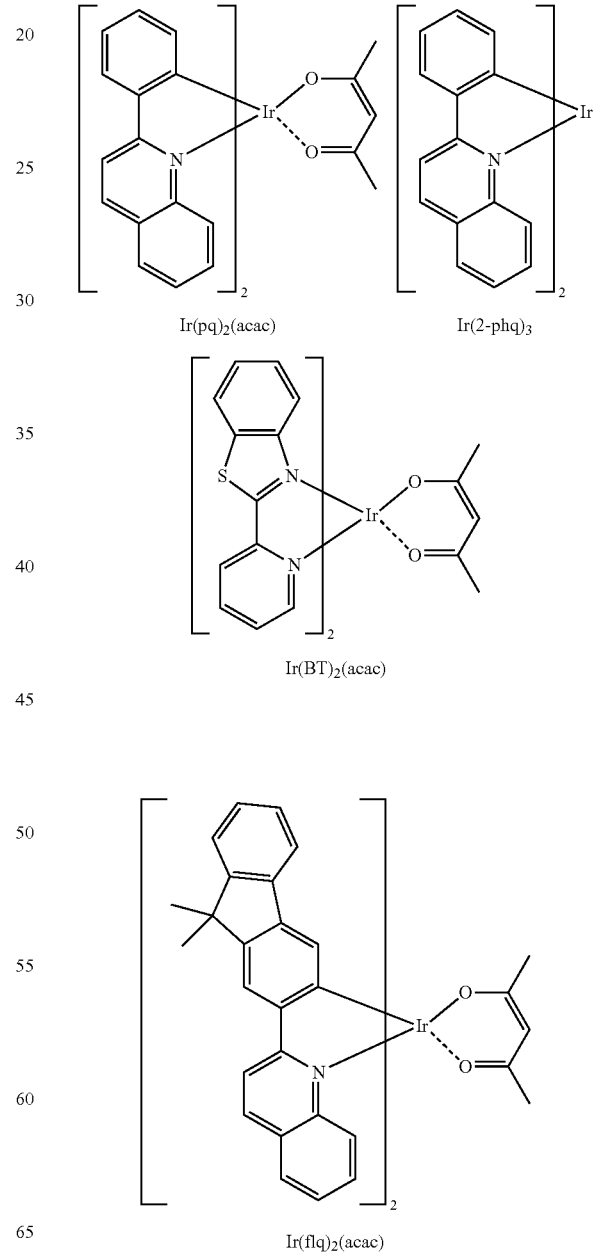
Ir(pq)₂(acac)　　Ir(2-phq)₃
Ir(BT)₂(acac)
Ir(piq)₃　　Btp₂Ir(acac)
Ir(flq)₂(acac)

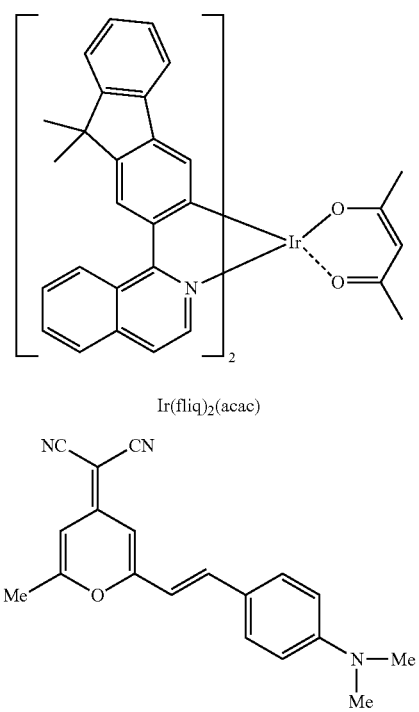
Ir(fliq)₂(acac)
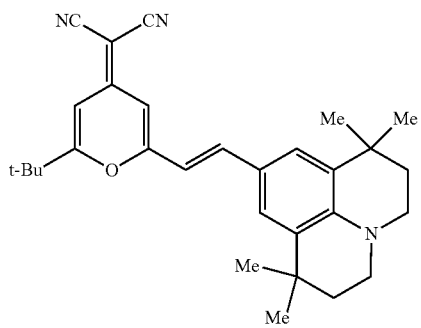
DCM
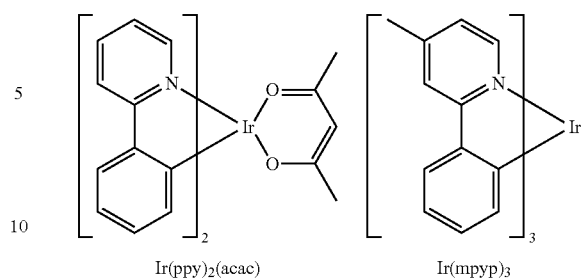
Ir(ppy)₂(acac)          Ir(mpyp)₃
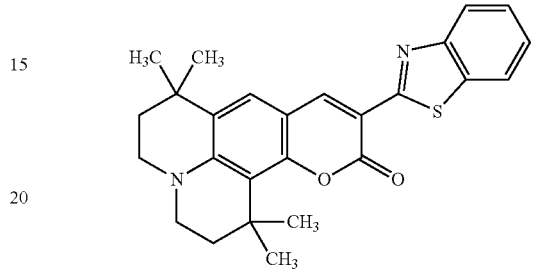
C545T
In an implementation, the dopant for use in the EML may be or may include a complex shown below.
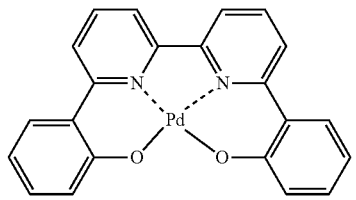
D1
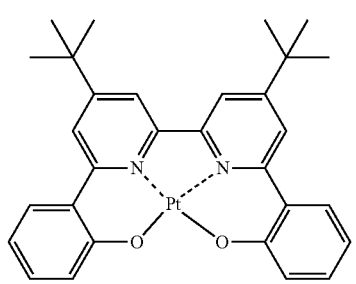
D2
DCJTB
For example, compounds illustrated below may be used as a green dopant.
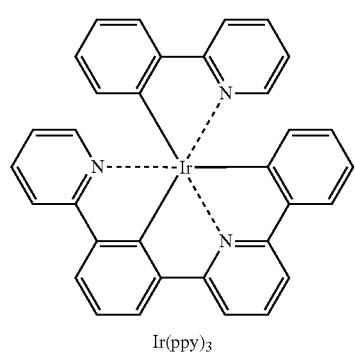
Ir(ppy)₃
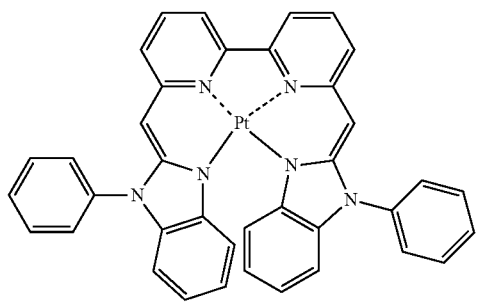
D3

| | |
|---|---|
| D4 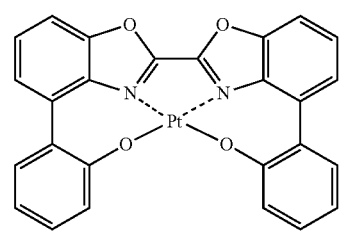 | D10 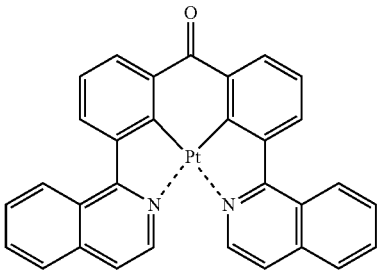 |
| D5 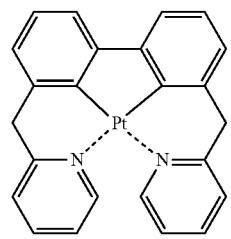 | D11 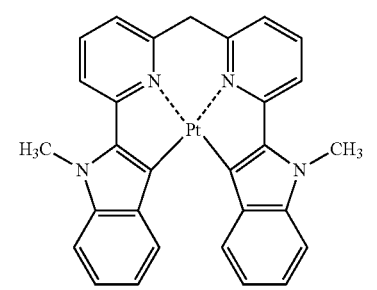 |
| D6 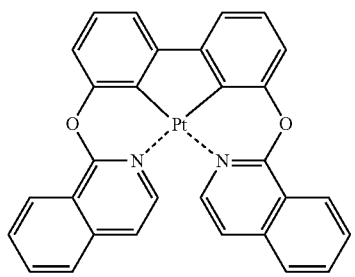 | D12 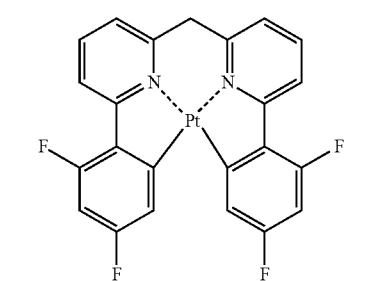 |
| D7 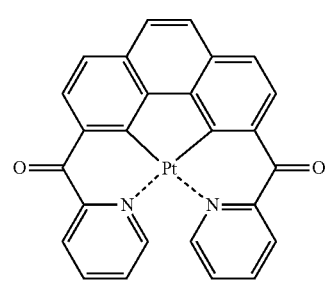 | D13 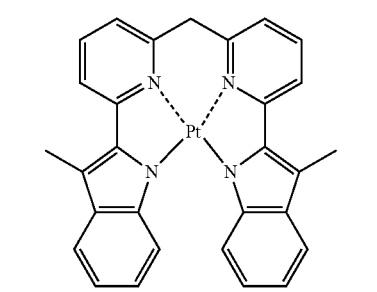 |
| D8 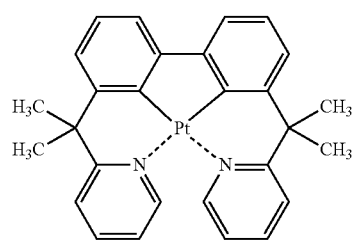 | D14 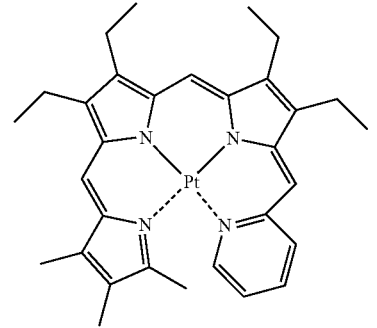 |
| D9 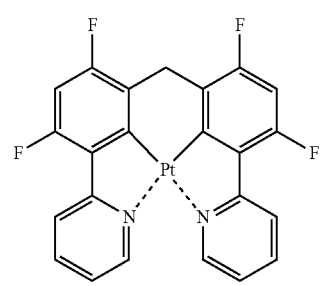 | |

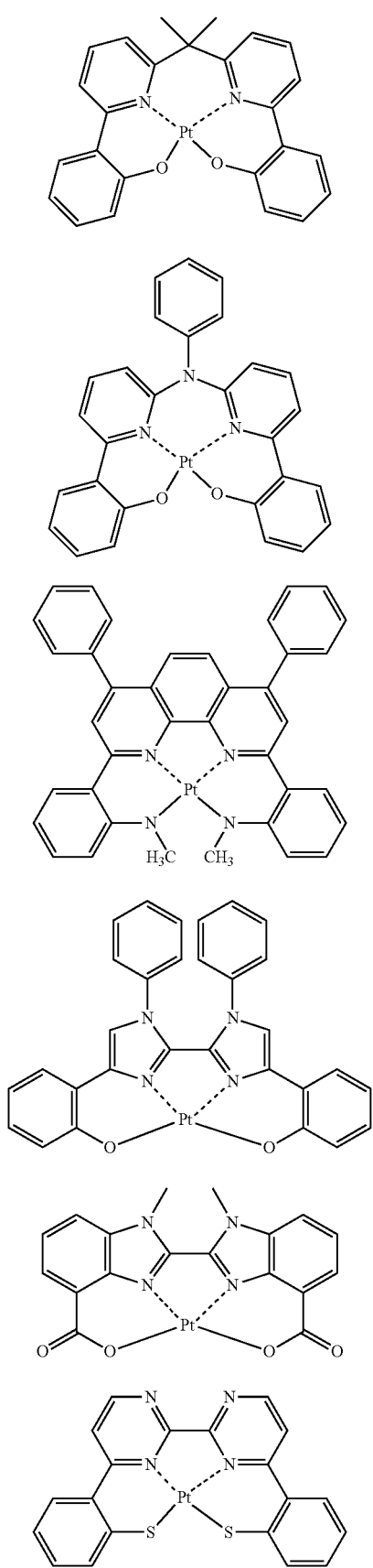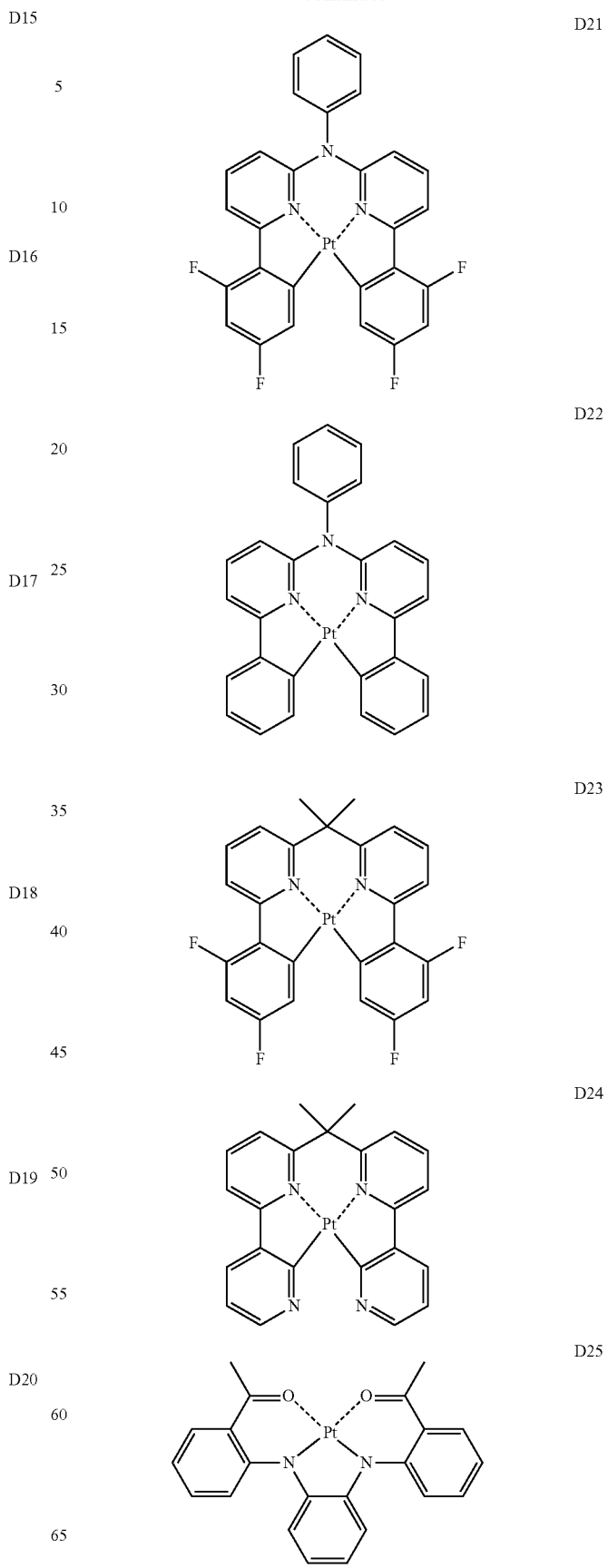

-continued
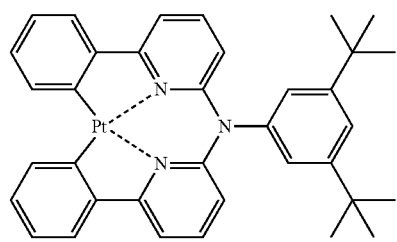
D26
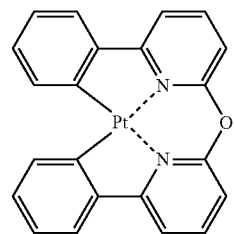
D27
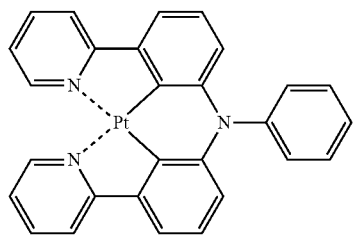
D28
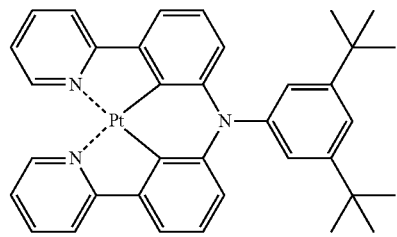
D29
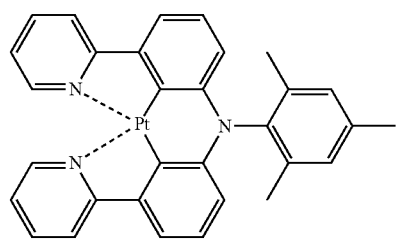
D30
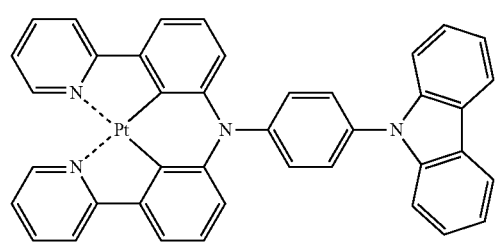
D31
-continued
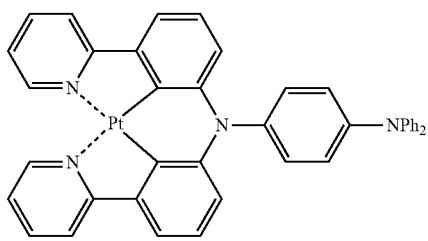
D32
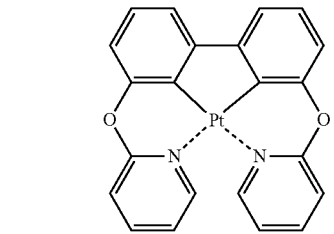
D33
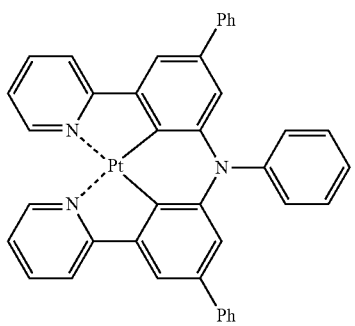
D34
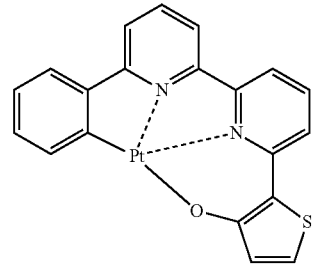
D35
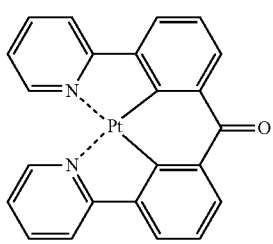
D36

-continued
D37
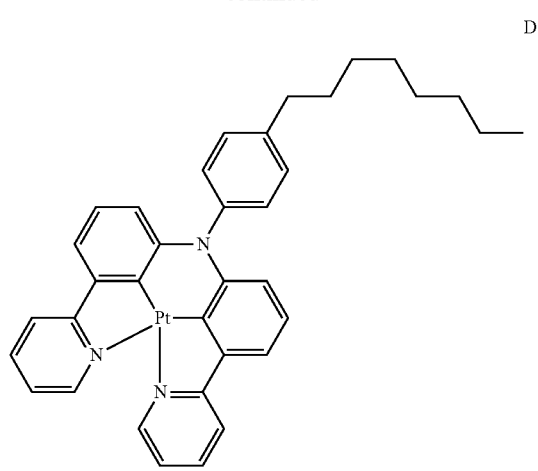
D38
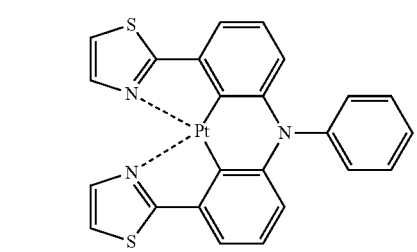
D39
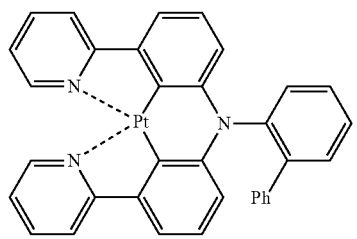
D40
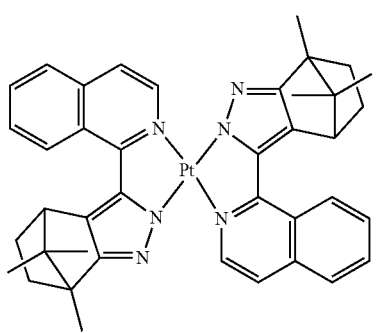
D41
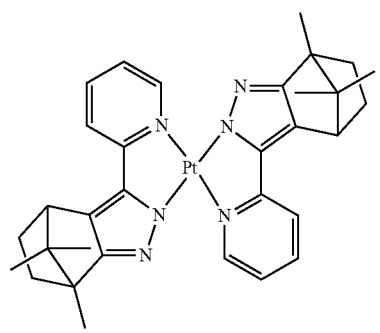
-continued
D42
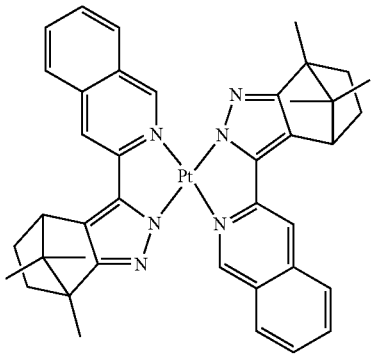
D43
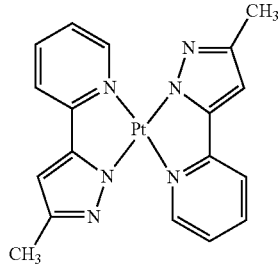
D44
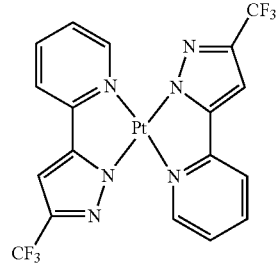
D45
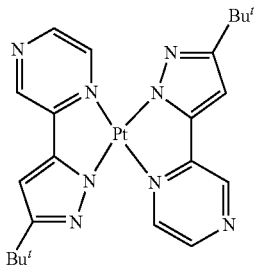
D46
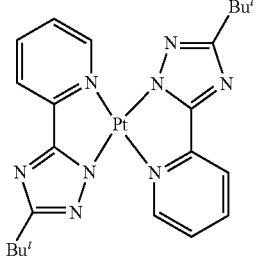

-continued

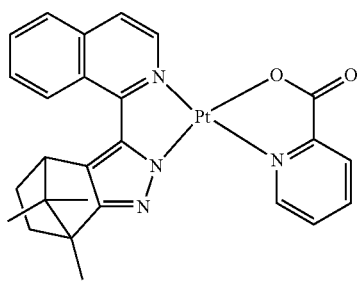
D47

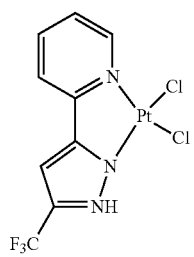
D48

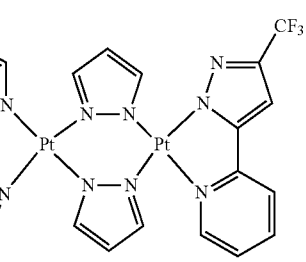
D49

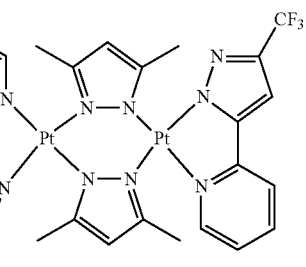
D50

In an implementation, the dopant for use in the EML may be or may include an Os-complex shown below.

Os(fppz)₂(CO)₂

-continued

Os(fppz)₂(PPh₂Me)₂

Os(bppz)₂(PPh₃)₂

Os(fptz)₂(PPh₂Me)₂

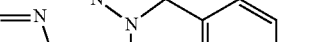
Os(hptz)₂(PPhMe₂)₂

When the EML includes a host and a dopant, an amount of the dopant may be, e.g., about 0.01 parts by weight to about 15 parts by weight, based on 100 parts by weight of the host.

A thickness of the EML may be about 100 Å to about 1,000 Å, e.g., about 200 Å to about 600 Å. When the thickness of the EML is within this range, excellent light-emission characteristics may be obtained without a substantial increase in driving voltage.

Next, an electron transport layer (ETL) may be formed on the EML by using various methods, e.g., vacuum deposition, spin coating, and/or casting. When the ETL is formed using vacuum deposition and spin coating, the deposition and coating conditions may be similar to those applied to form the HIL, although the deposition and coating conditions may vary according to the material that is used to form the ETL.

A material for forming the ETL may stably transport electrons injected from an electron injection electrode (cathode), and may include a suitable electron transportation material. Examples of the electron transport materials may include a quinoline derivative, such as tris(8-quinolinolate) aluminum (Alq3), TAZ, Balq, beryllium bis(benzoquinolin-10-olate) (Bebq$_2$), ADN, Compound 201, Compound 202, and the like.

TAZ
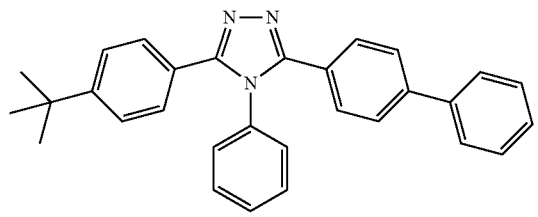

BAlq
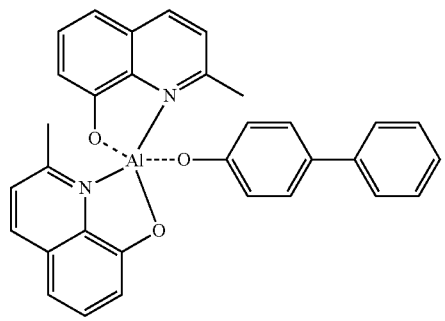

<Compound 201>
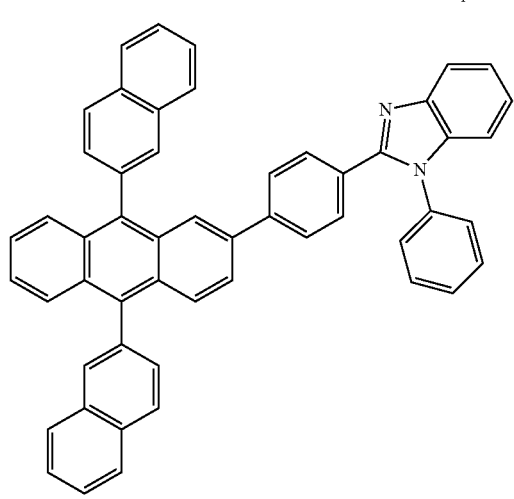

<Compound 202>
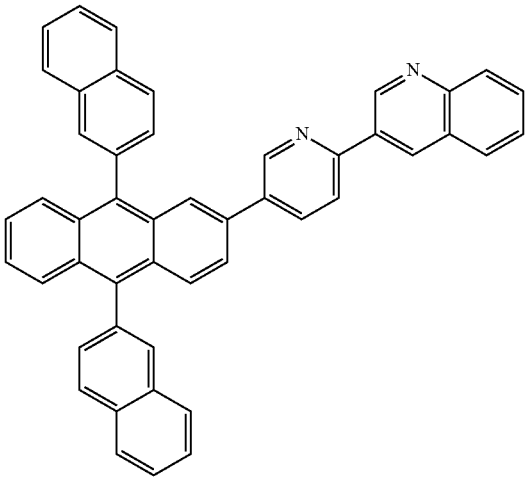

BCP
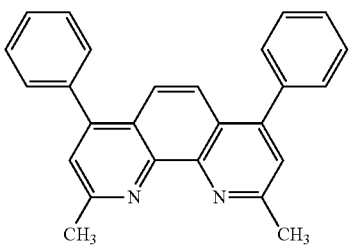

A thickness of the ETL may be about 100 Å to about 1,000 Å, e.g., about 150 Å to about 500 Å. When the thickness of the ETL is within these ranges, satisfactory electron transport characteristics may be obtained without a substantial increase in driving voltage.

In an implementation, the ETL may include, in addition to an electron transport organic compound, a metal complex.

The metal complex may include, e.g., a Li complex. Examples of the Li complex may include lithium quinolate (LiQ) and Compound 203 illustrated below.

<Compound 203>
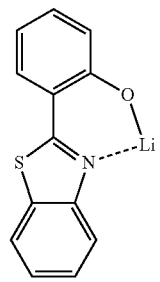

Then, an electron injection layer (EIL), which facilitates injection of electrons from the cathode, may be formed on the ETL. A suitable electron injection material may be used to form the EIL.

Examples of electron injection materials may include LiF, NaCl, CsF, Li$_2$O, and BaO. Deposition conditions of the EIL may be similar to those applied to form the HIL.

A thickness of the EIL may be about 1 Å to about 100 Å, e.g., about 3 Å to about 90 Å. When the thickness of the EIL is within these ranges, satisfactory electron injection characteristics may be obtained without a substantial increase in driving voltage.

A second electrode may be disposed on the organic layer. The second electrode may be a cathode that is an electron injection electrode, and in this regard, a metal for forming the second electrode may be a material having a low work function. Such a material may be metal, alloy, an electrically conductive compound, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film to obtain a transmissive electrode. Also, to manufacture a top emission type light-emitting device, a transmissive electrode formed using ITO or IZO may be formed.

In addition, when a phosphorescent dopant is used in the EML, a triplet exciton or a hole may diffuse to the ETL. To help reduce and/or prevent such diffusion, a hole blocking layer (HBL) may be formed between HTL and the EML or between the H-functional layer and the EML by using various methods, such as vacuum deposition, spin coating, casting, and/or a LB method. When the HBL is formed using vacuum deposition and spin coating, the deposition or coating conditions may be similar to those applied to form HIL, although the deposition or coating conditions may vary according to the material that is used to form the HBL. A hole blocking material may include suitable hole blocking materials, and examples thereof may include an oxadiazole derivative, a triazole derivative, or a phenanthroline derivative. For example, BCP (illustrated below) may be used as the hole-blocking material.

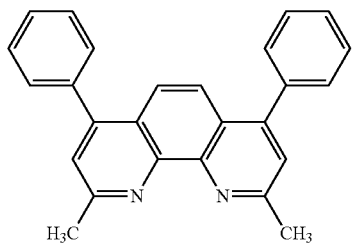

BCP

A thickness of the HBL may be about 20 Å to about 1,000 Å, e.g., about 30 Å to about 300 Å. When the thickness of the hole blocking layer is within these ranges, excellent hole blocking characteristics may be obtained without a substantial increase in driving voltage.

An organic light-emitting device according to an embodiment may be used in various flat panel display apparatuses, e.g., a passive matrix organic light-emitting display apparatus or an active matrix organic light-emitting display apparatus. For example, when the organic light-emitting device is included in an active matrix organic light-emitting display apparatus, a first electrode disposed on a substrate may act as a pixel and may be electrically connected to a source electrode or a drain electrode of a thin film transistor. In addition, the organic light-emitting device may be included in a flat panel display apparatus that emits light in opposite directions.

Also, an organic layer according to an embodiment may be formed by depositing the compound according to an embodiment, or may be formed by using a wet method in which the compound according to an embodiment is prepared in the form of solution and then the solution of the compound is used for coating.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example

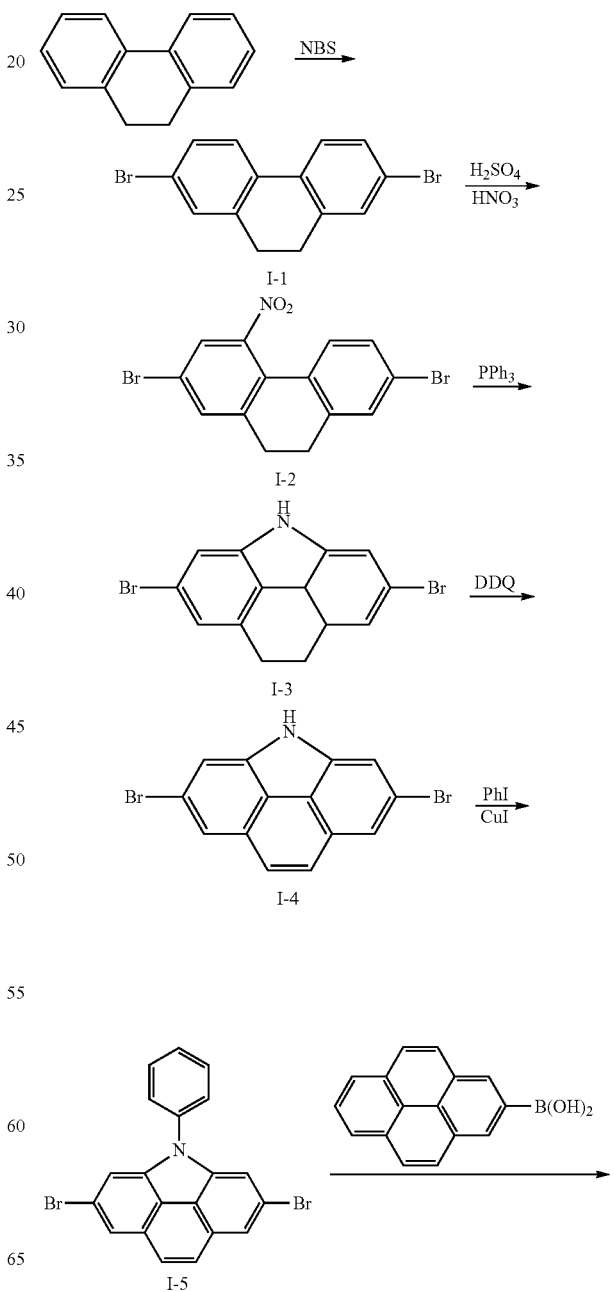

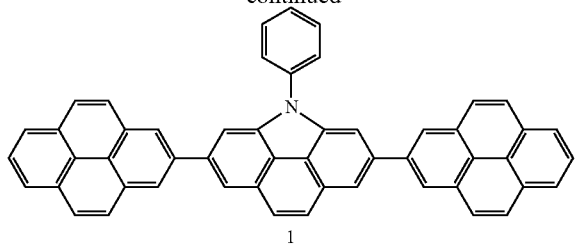

1

Synthesis of Intermediate I-1

10.0 g (55.4 mmol) of 9,10-dihydrophenanthrene, 21.8 g (121.0 mmol) of N-bromosuccinimide, and 0.5 g (2.7 mmol) of p-TsOH were dissolved in 30 mL of acetonitrile, and then, stirred at a temperature of 50° C. for 12 hours. The reaction solution was cooled to room temperature, and then, stirred for 30 minutes to precipitate crystals. The crystals obtained by a vacuum filter were washed with methanol to obtain 8.4 g of Intermediate I-1 (yield=45%). The obtained compound was identified by LC-MS. $C_{14}H_{10}Br_2$ M⁺ 335.9

Synthesis of Intermediate I-2

5.0 g (15.0 mmol) of Intermediate I-1 was completely dissolved in 50 mL of dichloromethane, and 1.7 g (30.0 mmol) of nitric acid was added thereto at room temperature. 1.5 g (15.0 mmol) of sulfuric acid was slowly dropped to the mixture, and the resultant mixture was stirred at a temperature of 30° C. for 6 hours. After the completion of the reaction, 50 mL of methanol was added thereto, and then, stirred for 2 hours to precipitate crystals. The crystals obtained by a vacuum filter were washed with methanol to obtain 5.2 g of yellow crystals of Intermediate I-2 (yield=90%). The obtained compound was identified by LC-MS. $C_{14}H_9Br_2NO_2$ M⁺ 380.9

Synthesis of Intermediate I-3

4.6 g (12.0 mmol) of Intermediate I-2 was dissolved in 30 mL of o-dichlorobenzene, and then, completely dissolved by heating the mixture. 4.7 g (18.0 mmol) of triphenylphosphine was added thereto, and then, stirred at a temperature of 180° C. for 3 hours. After the reaction solution was cooled to room temperature, the residual obtained by evaporating a solvent was separation-purified by silica gel column chromatography and washed with methanol to obtain 2.9 g (yield=70%) of white crystals of Intermediate I-3. The obtained compound was identified by LC-MS. $C_{14}H_{11}Br_2N$ M⁺ 350.9

Synthesis of Intermediate I-4

In an oxygen atmosphere, 10 g (10.0 mmol) of Intermediate I-3 was dissolved in 100 mL of toluene, and 0.6 g (0.3 mmol) of 2,3-dichloro-5,6-dicyano-1,4-benzoquinone and 0.2 g (0.3 mmol) of $NaNO_2$ were added thereto at room temperature, and then, stirred at a temperature of 110° C. for 6 hours. After the completion of the reaction, the reaction solution was cooled to room temperature, and the residual obtained by evaporating a solvent was separation-purified by silica gel column chromatography to obtain 3.1 g (yield=90%) of Intermediate I-4. The obtained compound was identified by LC-MS. $C_{14}H_7Br_2N$ M⁺ 346.8

Synthesis of Intermediate I-5

3.4 g (10.0 mmol) of Intermediate I-4, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then, stirred at a temperature of 80° C. for 24 hours. The reaction solution was cooled to room temperature, and then, extracted three times by using 30 mL of water and 40 mL of diethyl ether. An organic layer obtained therefrom was dried by using magnesium sulfate, and the residual obtained by evaporating a solvent was separation-purified by silica gel column chromatography to obtain 3.8 g (yield=89%) of Intermediate I-5. The obtained compound was identified by LC-MS. $C_{20}H_{11}Br_2N$ M⁺ 422.9

Synthesis of Compound 1

2.5 g (5.0 mmol) of Intermediate I-5, 2.7 g (11.0 mmol) of pyrene boronic acid, 0.58 g (0.5 mmol) of $Pd(PPh_3)_4$, and 2.1 g (15.0 mmol) of $K_2CO_3$ were dissolved in 40 mL of a mixed solution including $THF/H_2O$ (2:1), and then, stirred at a temperature of 80° C. for 5 hours. The reaction solution was cooled to room temperature, and then, extracted three times by using 30 mL of water and 30 mL of diethyl ether. An organic layer obtained therefrom was dried by using magnesium sulfate, and the residual obtained by evaporating a solvent was separation-purified by silica gel column chromatography to obtain 2.3 g (yield=67%) of Compound 1. The obtained compound was identified by MS/FAB and ¹H NMR. $C_{52}H_{29}N$ cal. 667.23. found 668.23

¹H NMR (CDCl₃, 400 MHz) δ=8.54 (m, 4H), 8.32 (m, 2H), 8.23-8.21 (d, 4H), 8.09-8.01 (m, 6H), 7.92-7.90 (m, 4H), 7.63-7.53 (m, 4H), 7.47-7.35 (m, 4H), 7.32 (d, 2H)

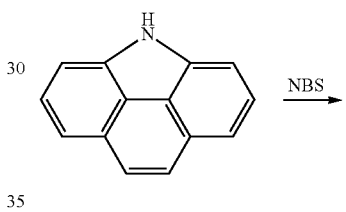

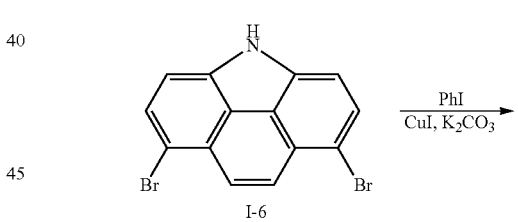

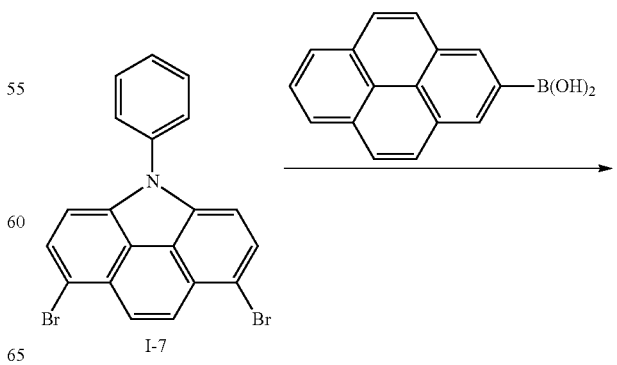

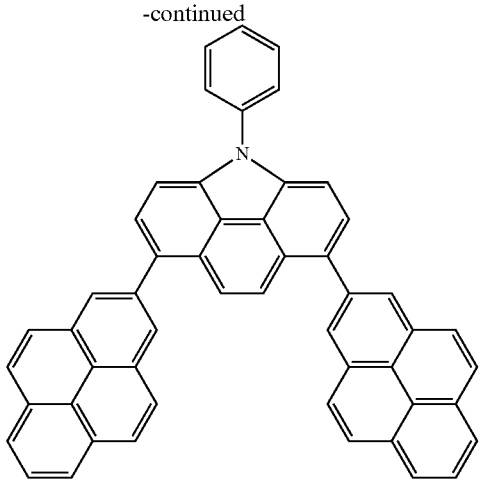

37

Synthesis of Intermediate I-6

1.91 g (10.0 mmol) of 6H-benzo[def]carbazole was completely dissolved in 60 mL of carbon tetrachloride ($CCl_4$), and 3.56 g (20.0 mmol) of N-bromosuccinimide was added thereto, and then, stirred at a temperature of 80° C. for 30 minutes. The reaction solution was cooled to room temperature and stirred for 30 minutes to precipitate crystals. The crystals obtained by a vacuum filter were washed with methanol to obtain 1.71 g (yield=49%) of white crystals of Intermediate I-6. The obtained compound was identified by LC-MS. $C_{14}H_7Br_2N$: $M^+$ 346.9

Synthesis of Intermediate I-7

Intermediate I-7 was synthesized in the same manner as in Synthesis of Intermediate I-5, except that Intermediate I-6 was used instead of Intermediate I-4. The obtained compound was identified by LC-MS. $C_{20}H_{12}Br_2N$: $M^+$ 422.9

Synthesis of Compound 37

Compound 37 was synthesized in the same manner as in Synthesis of Compound 1, except that Intermediate I-7 was used instead of Intermediate I-5. The obtained compound was identified by MS/FAB and $^1$HNMR. $C_{52}H_{29}N$ cal. 667.23. found 668.23

$^1$H NMR ($CDCl_3$, 400 MHz) δ=8.29 (s, 4H), 8.23-8.21 (d, 4H), 8.09-8.01 (m, 6H), 7.93-7.91 (m, 4H), 7.79-7.68 (m, 6H), 7.60-7.52 (m, 3H), 7.43 (s, 2H)

Compounds that are shown in Table 1 but are not described in detail with Synthesis Examples were synthesized according to an equivalent synthetic method by referring to the above-described synthetic methods using Intermediates (having —Br or —B(OH)$_2$ group) which correspond to each of the compounds.

TABLE 1

| Compound | $^1$H NMR ($CDCl_3$, 400 MHz) | MS/FAB found | calc. |
|---|---|---|---|
| 1 | δ = 8.54 (m, 4H), 8.32 (m, 2H), 8.23-8.21 (d, 4H), 8.09-8.01 (m, 6H), 7.92-7.90 (m, 4H), 7.63-7.53 (m, 4H), 7.47-7.35 (m, 4H), 7.32 (d, 2H) | 668.23 | 667.23 |
| 2 | δ = 8.54 (s, 4H), 8.32 (m, 2H), 8.23-8.21 (d, 4H), 8.09-8.01 (m, 6H), 7.92-7.90 (d, 4H), 7.82 (s, 2H), 7.53-7.52 (d, 2H), 7.40 (m, 2H), 7.03 (m, 1H), 2.35 (m, 6H) | 696.26 | 695.26 |
| 4 | δ = 8.54 (m, 4H), 8.32 (m, 2H), 8.23-8.21 (m, 4H), 8.09-8.01 (m, 6H), 7.92-7.90 (m, 4H), 7.72-7.68 (m, 4H), 7.48-7.45 (m, 2H), 7.41 (d, 2H), 0.28 (s, 9H) | 740.27 | 739.27 |
| 11 | δ = 8.54 (s, 4H), 8.32 (m, 2H), 8.23-8.21 (m, 8H), 8.09-8.01 (m, 6H), 7.92-7.90 (m, 5H), 7.80 (s, 2H), 7.72-7.69 (m, 4H), 7.42-7.41 (d, 2H) | 792.26 | 791.26 |
| 13 | δ = 8.30 (m, 4H), 8.23-8.21 (m, 4H), 8.09-8.01 (m, 8H), 7.94-7.81 (m, 12H), 7.83-7.76 (m, 4H), 7.67-7.55 (m, 3H), 7.50-7.49 (d, 2H) | 820.29 | 819.29 |
| 16 | δ = 8.29 (m, 4H), 8.23-8.21 (m, 5H), 8.08-8.01 (m, 9H), 7.94-7.81 (m, 13H), 7.69-7.65 (m, 1H), 7.58-7.56 (m, 3H), 7.50-7.48 (m, 1H), 7.41-7.37 (m, 1H), 7.25-7.24 (d, 2H) | 870.31 | 869.31 |
| 18 | δ = 8.78-8.77 (m, 2H), 8.49 (s, 3H), 8.43-8.41 (d, 4H), 8.33-8.21 (m, $_{10}$H), 8.14-8.01 (m, 12H), 7.95-7.88 (m, 2H), 7.76-7.69 (m, 3H), 7.52 (d, 2H) | 871.30 | 870.30 |
| 19 | δ = 8.54 (m, 2H), 8.42 (m, 1H), 8.39 (s, 2H), 8.33-8.31 (m, 4H), 8.19-8.11 (m, 7H), 8.04-8.91 (m, 8H), 7.73-7.65 (m, 4H), 7.57-7.45 (m, 3H), 7.43-7.42 (d, 1H), 7.40 (m, 1H) | 744.26 | 743.26 |
| 20 | δ = 8.21 (m, 2H), 8.15-7.99 (m, 16H), 7.95 (s, 1H), 7.92 (s, 1H), 7.83-7.78 (m, 4H), 7.67-7.63 (m, 2H), 7.60-7.55 (m, 3H) | 668.23 | 667.23 |
| 22 | δ = 8.21 (m, 2H), 8.15-7.99 (m, 16H), 7.95-7.92 (m, 2H), 7.80 (m, 2H), 7.74-7.70 (m, 2H), 7.56-7.55 (d, 2H), 7.48-7.45 (m, 2H), 1.33 (s, 9H) | 724.29 | 723.29 |
| 23 | δ = 8.21 (m, 2H), 8.15-7.99 (m, 17H), 7.95-7.92 (m, 2H), 7.65-7.62 (m, 1H), 7.76-7.70 (m, 4H), 7.64-7.61 (m, 1H), 7.54-7.50 (m, 2H), 7.45-7.44 (d, 2H) | 718.25 | 717.25 |
| 28 | δ = 8.21 (m, 2H), 8.15-7.99 (m, 16H), 7.95-7.92 (d, 2H), 7.87-7.85 (m, 1H), 7.78-7.74 (m, 1H), 7.60 (s, 2H), 7.47-7.41 (m, 4H), 7.31-7.29 (m, 2H), 7.23-7.19 (m, 1H), 7.11-7.09 (dd, 1H), 1.64 (s, 6H) | 784.29 | 783.29 |
| 30 | δ = 8.21 (m, 2H), 8.15-7.99 (m, 16H), 7.95-7.92 (m, 2H), 7.80-7.77 (m, 4H), 7.70 (m, 2H), 7.65-7.58 (m, 7H), 7.54-7.50 (m, 2H), 7.43 (d, 2H) | 820.29 | 819.29 |
| 32 | δ = 8.21 (m, 2H), 8.15-7.99 (m, 16H), 7.95-7.92 (m, 2H), 7.80 (s, 2H), 7.57-7.55 (d, 2H) | 673.26 | 672.26 |
| 35 | δ = 8.14-8.08 (m, 12H), 8.02-7.98 (m, 4H), 7.92-7.84 (m, $_{10}$H), 7.77-7.70 (m, 5H), 7.51-7.45 (m, 4H), 1.33 (s, 9H) | 876.36 | 875.36 |
| 36 | δ = 8.21 (m, 1H), 8.15-8.05 (m, 13H), 8.02-7.98 (m, 3H), 7.95-7.63 (m, 6H), 7.73-7.64 (m, 5H), 7.57-7.53 (m, 2H), 7.50-7.45 (m, 2H), 7.40 (m, 1H) | 744.26 | 743.26 |
| 37 | δ = 8.29 (s, 4H), 8.23-8.21 (d, 4H), 8.09-8.01 (m, 6H), 7.93-7.91 (m, 4H), 7.79-7.68 (m, 6H), 7.60-7.52 (m, 3H), 7.43 (s, 2H) | 668.23 | 667.23 |
| 39 | δ = 8.29 (s, 4H), 8.23-8.21 (d, 4H), 8.09-8.01 (m, 6H), 7.93-7.91 (m, 4H), 7.79-7.77 (m, 2H), 7.52-7.45 (m, 4H), 7.43 (s, 2H), 7.33-7.28 (m, 2H) | 686.22 | 685.22 |
| 42 | δ = 8.29 (m, 4H), 8.23-8.21 (m, 4H), 8.09-7.99 (m, 7H), 7.93-7.91 (m, 4H), 7.88-7.83 (m, 1H), 7.89-7.85 (m, 1H), 7.59-7.48 (m, 6H), 7.39 (s, 2H), 7.34-7.31 (m, 2H) | 718.25 | 717.25 |
| 47 | δ = 8.29 (s, 4H), 8.23-8.21 (d, 6H), 8.09-8.01 (m, 9H), 7.93-7.91 (m, 4H), 7.81-7.79 (s, 2H), 7.75 (s, 2H), 7.62-7.59 (d, 2H), 7.45-7.43 (ss, 2H), 7.33 (s, 2H) | 792.26 | 791.26 |
| 48 | δ = 8.64-8.63 (d, 1H), 8.50-8.49 (m, 1H), 8.29 (s, 4H), 8.23-8.21 (d, 4H), 8.09-8.01 (m, 6H), 7.93-7.91 (ss, 4H), 7.85-7.82 (m, 1H), 7.71-7.69 (ss, 2H), 7.54 (s, 1H), 7.52-7.45 (m, 2H), 7.33 (s, 2H) | 669.23 | 668.23 |
| 49 | δ = 8.29 (m, 4H), 8.23-8.21 (d, 4H), 8.09-8.01 (m, 6H), 7.90-7.81 (m, 12H), 7.77-7.75 (ss, 2H), 7.66-7.58 (m, 4H), 7.50-7.47 (m, 1H), 7.44-7.41 (ss, 2H), 7.19 (s, 2H) | 820.29 | 819.29 |
| 50 | δ = 8.29 (m, 4H), 8.23-8.21 (m, 4H), 8.09-8.01 (m, 6H), 7.90-7.81 (m, 12H), 7.67-7.65 (ss, | 892.33 | 891.33 |

TABLE 1-continued

| Compound | $^1$H NMR (CDCl$_3$, 400 MHz) | MS/FAB found | calc. |
|---|---|---|---|
|  | 2H), 7.62-7.58 (m, 2H), 7.51-7.48 (m, 2H), 7.42-7.40 (ss, 2H), 7.19 (s, 2H), 0.26 (s, 9H) | | |
| 51 | δ = 8.29 (m, 4H), 8.23-8.21 (ss, 4H), 8.09-8.01 (m, 6H), 7.93-7.81 (m, 8H), 7.67-7.65 (ss, 1H), 7.59-7.48 (m, 5H), 7.40-7.29 (m, 4H), 7.10-7.08 (ss, 1H) | 744.26 | 743.26 |
| 54 | δ = 8.48-8.44 (ss, 2H), 8.14-7.99 (m, 12H), 7.87-7.85 (ss, 2H), 7.71-7.64 (m, 4H), 7.41-7.35 (m, 4H), 7.23-7.17 (m, 2H), 6.97 (s, 2H) | 686.22 | 685.22 |
| 56 | δ = 8.48-8.44 (ss, 2H), 8.14-7.99 (m, 12H), 7.87-7.85 (ss, 2H), 7.71-7.64 (m, 4H), 7.43-7.40 (m, 2H), 7.37-7.35 (ss, 2H), 7.23-7.20 (m, 2H), 6.97 (s, 2H), 2.43 (s, 3H) | 682.25 | 681.25 |
| 57 | δ = 8.48-8.44 (ss, 2H), 8.14-7.99 (m, 13H), 7.87-7.84 (m, 3H), 7.70-7.64 (m, 7H), 7.69-7.57 (m, 2H), 7.46-7.41 (m, 2H), 7.15 (s, 2H) | 718.25 | 717.25 |
| 60 | δ = 8.46-8.44 (ss, 2H), 8.24-8.19 (m, 12H), 7.97-7.95 (ss, 2H), 7.91-7.88 (ss, 2H), 7.85-7.82 (m, 2H), 7.78-7.74 (m, 3H), 7.64-7.60 (m, 2H), 7.52-7.45 (m, 3H), 7.38-7.36 (ss, 2H), 7.32-7.28 (m, 1H), 6.97 (s, 2H) | 744.26 | 743.26 |
| 64 | δ = 8.64-8.59 (m, 4H), 8.48-8.44 (ss, 2H), 8.28-8.21 (m, 2H), 8.14-7.99 (m, 12H), 7.87-7.85 (ss, 2H), 7.87-7.79 (ss, 2H), 7.65-7.53 (m, 6H), 7.33-7.30 (m, 1H), 7.25-7.23 (ss, 2H), 6.87 (s, 2H) | 818.28 | 817.28 |
| 67 | δ = 9.06-9.05 (d, 1H), 8.49-8.48 (d, 4H), 8.43-8.40 (m, 5H), 8.30-8.21 (m, 8H), 8.14-8.01 (m, 9H), 7.88-7.76 (m, 5H), 7.67-7.55 (m, 3H), 7.50 (d, 1H) | 821.29 | 820.29 |
| 68 | δ = 8.29 (d, 4H), 8.23-8.21 (ss, 4H), 8.09-8.01 (m, 6H), 7.93-7.81 (m, 8H), 7.67-7.65 (ss, 1H), 7.59-7.57 (ss, 1H), 7.54-7.48 (m, 4H), 7.40-7.29 (m, 4H), 7.08-7.05 (ss, 1H) | 744.26 | 743.26 |

Example 1

An anode was prepared by cutting a Corning 15 Ωcm$^2$ (1,200 Å) ITO glass substrate to a size of 50 mm×50 mm×0.7 mm, ultrasonically cleaning the glass substrate by using isopropyl alcohol and pure water for 5 minutes each, and then, irradiating UV light for 30 minutes thereto, and exposing to ozone to clean. Then, the anode was loaded onto a vacuum deposition apparatus.

Then, 4,4',4''-Tris(N-(2-naphthyl)-N-phenyl-amino)-triphenylamine (hereinafter, 2-TNATA), which is a material for a HIL, was vacuum deposited on the substrate to form a HIL having a thickness of 600 Å. Then, 4,4'-bis[N-(1-naphthyl)-N-phenylamino]biphenyl (hereinafter, NPB), which is a material for a HTL, was vacuum deposited on the HIL to form a HTL having a thickness of 300 Å. Compound 1, above, (which is a compound represented by Formula 1), as a blue fluorescent host, and 4,4'-bis[2-(4-(N,N-diphenylamino)phenyl)vinyl]biphenyl (hereinafter, DPAVBi), which is a blue fluorescent dopant, were co-deposited on the HTL at a weight ratio of 98:2 to form an EML having a thickness of 300 Å.

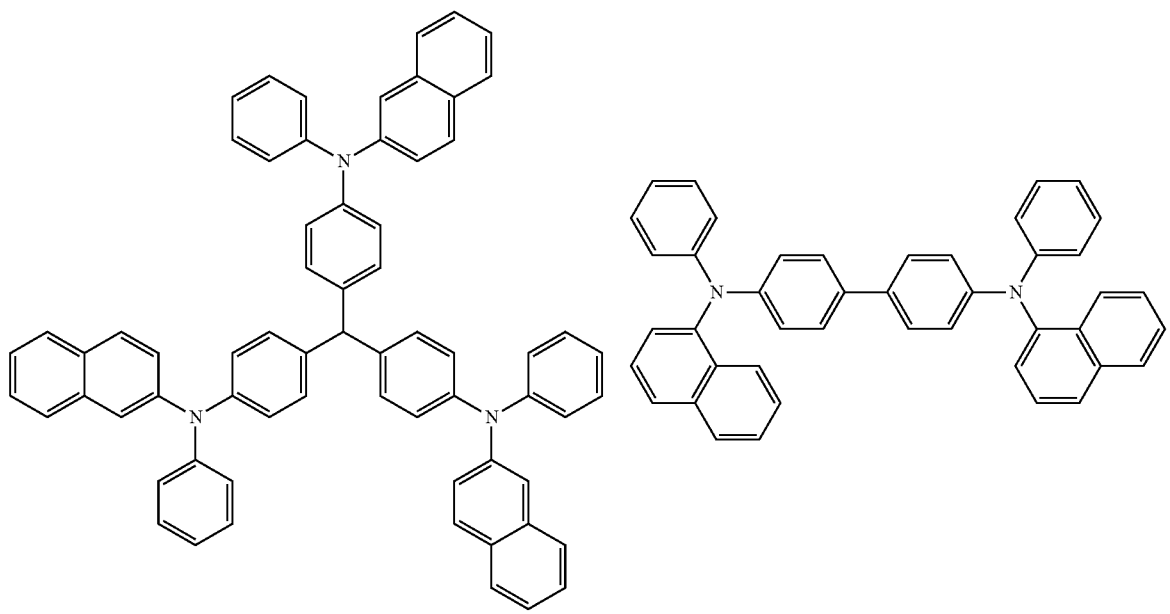

2-TNATA

NPB

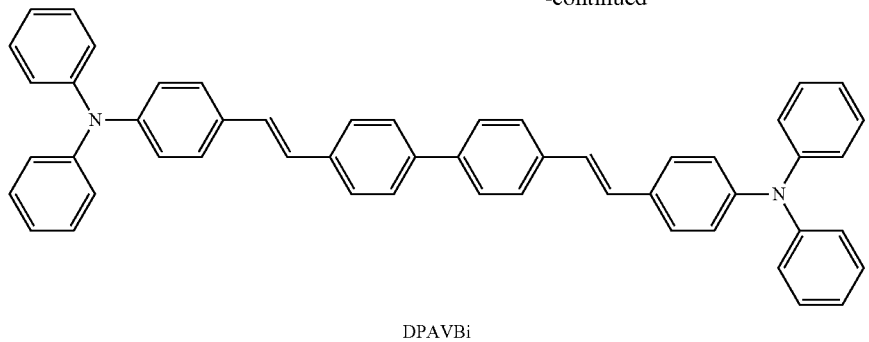

DPAVBi

Next, Alq3 was deposited on the EML to form an ETL having a thickness of 300 Å, and then, LiF, which is a halogenated alkali metal, was deposited on the ETL to form an EIL having a thickness of 10 Å. Then, Al was vacuum deposited to form a LiF/Al electrode having a thickness of 3,000 Å (cathode), thereby completing manufacturing of an organic light-emitting device.

The organic light-emitting device had a driving voltage of about 6.25 V at a current density of 50 mA/cm$^2$, a luminescent efficiency of 2,425 cd/m$^2$, an emission efficiency of 4.85 cd/A, and a half life-span (hr @100 mA/cm$^2$) of 215 hours.

Example 2

An organic light-emitting device was manufactured in the same manner as in Example 1, except that Compound 7 was used instead of Compound 1 to form the EML.

The organic light-emitting device had a driving voltage of about 6.36 V at a current density of 50 mA/cm$^2$, a luminescent efficiency of 2,280 cd/m$^2$, an emission efficiency of 4.56 cd/A, and a half life-span (hr @100 mA/cm$^2$) of 276 hours.

Example 3

An organic light-emitting device was manufactured in the same manner as in Example 1, except that Compound 15 was used instead of Compound 1 to form the EML.

The organic light-emitting device had a driving voltage of about 6.21 V at a current density of 50 mA/cm$^2$, a luminescent efficiency of 2,697 cd/m$^2$, an emission efficiency of 5.39 cd/A, and a half life-span (hr @100 mA/cm$^2$) of 302 hours.

Comparative Example 1

An organic light-emitting device was manufactured in the same manner as in Example 1, except that 9,10-di-naphthalene-2-yl-anthracene (ADN) was used instead of Compound 1 to form the EML.

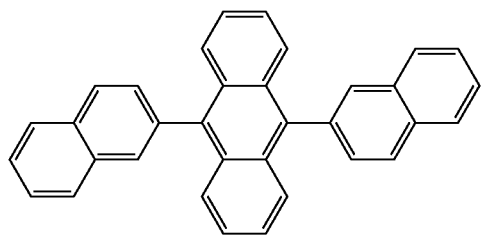

ADN

The organic light-emitting device had a driving voltage of about 7.35 V at a current density of 50 mA/cm$^2$, a luminescent efficiency of 2,065 cd/m$^2$, an emission efficiency of 4.13 cd/A, and a half life-span (hr @100 mA/cm$^2$) of 145 hours.

As described above, when compounds represented by Formula 1 according to the embodiments were used as materials for hosts in, e.g., a blue EML, they all provided improved driving voltage compared to ADN, and had high efficiency and excellent I-V-L characteristics. For example, lifespan improvement characteristics of the exemplary compounds improved, and accordingly the organic light-emitting devices manufactured according to embodiments had longer lifespans. Representative measurements and lifespans of the organic light-emitting devices are shown in Table 2, below.

TABLE 2

|  | Material | Driving voltage (V) | Current density (mA/cm$^2$) | Brightness (cd/m$^2$) | Efficiency (cd/A) | Luminescence color | Half-life lifetime (hr @ 100 mA/cm$^2$) |
|---|---|---|---|---|---|---|---|
| Example 1 | Compound 1 | 6.25 | 50 | 2,425 | 4.85 | Blue | 215 hr |
| Example 2 | Compound 7 | 6.36 | 50 | 2,280 | 4.56 | Blue | 276 hr |
| Example 3 | Compound 15 | 6.21 | 50 | 2,697 | 5.39 | Blue | 302 hr |

TABLE 2-continued

| | Material | Driving voltage (V) | Current density (mA/cm$^2$) | Brightness (cd/m$^2$) | Efficiency (cd/A) | Luminescence color | Half-life lifetime (hr @ 100 mA/cm$^2$) |
|---|---|---|---|---|---|---|---|
| Comparative Example 1 | DNA | 7.35 | 50 | 2,065 | 4.13 | Blue | 145 hr |

Compounds represented by Formula 1 may have excellent material stabilities and may be suitable for use as a luminescent material. An organic light-emitting device manufactured using the compound may have high efficiency, low voltage, high brightness, and a long lifespan By way of summation and review a material for an organic light emitting device may have excellent electric stability, high charge transporting capability or light-emitting capability, high glass transition temperature, and high crystallization-preventing capability.

The embodiments may provide a host compound that has excellent electric characteristics, high charge transporting capability, high light-emitting capability, high glass transition temperature, and crystallization-preventing capability. The compound according to an embodiment may be a suitable material for a blue fluorescent device. An organic light-emitting device according to an embodiment may have high efficiency, low voltage, high brightness, and long lifespan due to the inclusion of the material.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound represented by Formula 1, below:

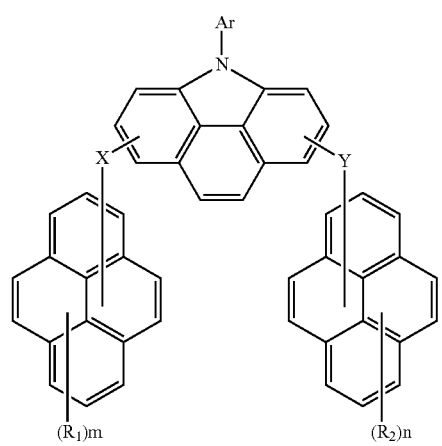

<Formula 1> wherein in Formula 1, $R_1$ and $R_2$ are each independently a hydrogen; a deuterium; a halogen; a cyano group; a substituted or unsubstituted $C_1$-$C_{60}$ alkyl group; a substituted or unsubstituted $C_2$-$C_{60}$ alkenyl group; a substituted or unsubstituted $C_2$-$C_{60}$ alkynyl group; a substituted or unsubstituted $C_3$-$C_{60}$ cycloalkyl group; a substituted or unsubstituted $C_3$-$C_{60}$ cycloalkenyl group; a substituted or unsubstituted $C_6$-$C_{60}$ aryl group; a substituted or unsubstituted $C_1$-$C_{60}$ heteroaryl group; an amino group substituted with a $C_6$-$C_{60}$ aryl group or a $C_1$-$C_{60}$ heteroaryl group; or a substituted or unsubstituted $C_6$-$C_{60}$ condensed polycyclic group, when a plurality of the $R_1$ groups are present, the $R_1$ groups are identical to or different from each other, when a plurality of the $R_2$ groups are present, the $R_2$ groups are identical to or different from each other, m and n are each independently an integer of 1 to 9, Ar is a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, and X and Y are each independently a direct bond, a substituted or unsubstituted $C_6$-$C_{60}$ arylene group, a substituted or unsubstituted $C_1$-$C_{60}$ heteroarylene group, or a substituted or unsubstituted $C_6$-$C_{60}$ condensed polycyclic group.

2. The compound as claimed in claim 1, wherein the compound represented by Formula 1 is represented by Formula 2:

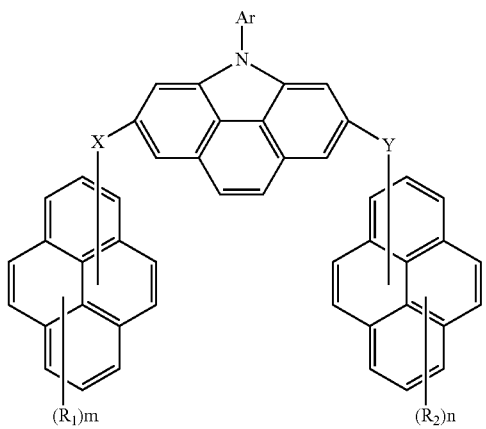

<Formula 2> in Formula 2, $R_1$, $R_2$, m, n, Ar, X, and Y are the same as defined with respect to Formula 1.

3. The compound as claimed in claim 1, wherein the compound represented by Formula 1 is represented by Formula 3:

<Formula 3>

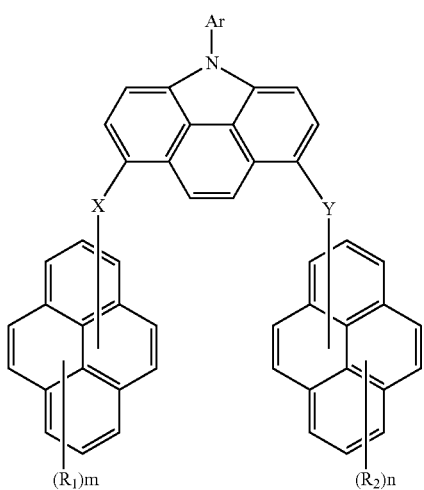

in Formula 3, $R_1$, $R_2$, m, n, Ar, X, and Y are the same as defined with respect to Formula 1.

4. The compound as claimed in claim 1, wherein $R_1$ and $R_2$ in Formula 1 are each independently a hydrogen or a deuterium.

5. The compound as claimed in claim 1, wherein Ar in Formula 1 is a group represented by one of Formulae 2a to 2h below:

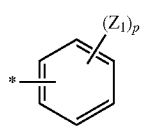 2a

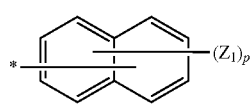 2b

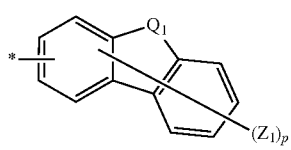 2c

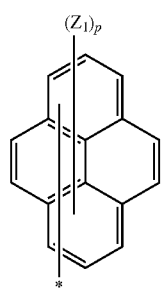 2d

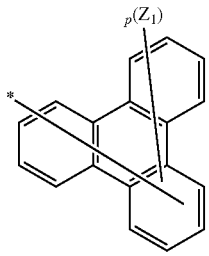 2e

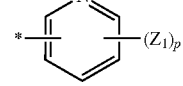 2f

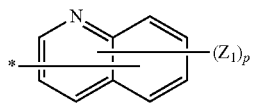 2g

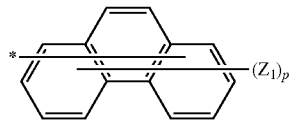 2h wherein in Formulae 2a to 2h,
$Q_1$ is —$C(R_{31})(R_{32})$—;
$Z_1$, $R_{31}$, and $R_{32}$ are each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, —$SiR_{41}R_{42}R_{43}$, a halogen atom, a cyano group, a nitro group, a hydroxyl group, or a carboxyl group;
$R_{41}$, $R_{42}$, and $R_{43}$ are each independently a substituted or unsubstituted $C_1$-$C_{20}$ alkyl group or a substituted or unsubstituted $C_6$-$C_{20}$ aryl group;
and
* indicates a binding sit,
wherein, in Formula 2a, p is an integer of 1 to 5,
wherein, in Formulae 2b and 2c, p is an integer of 1 to 7,
wherein, in Formulae 2d and 2h, p is an integer of 1 to 9,
wherein, in Formula 2e, p is an integer of 1 to 8,
wherein, in Formula 2f, p is an integer of 1 to 4, and
wherein, in Formula 2g, p is an integer of 1 to 6.

6. The compound as claimed in claim 1, wherein X and Y in Formula 1 are each independently a direct bond or a group represented by one of Formula 3a or Formula 3b, below:

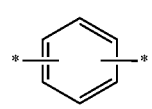 3a

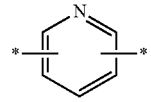 3b wherein in Formulae 3a and 3b, * indicates a binding site.

7. The compound as claimed in claim 1, wherein the compound represented by Formula 1 is any one of Compounds 1-68, below:

119 120
1
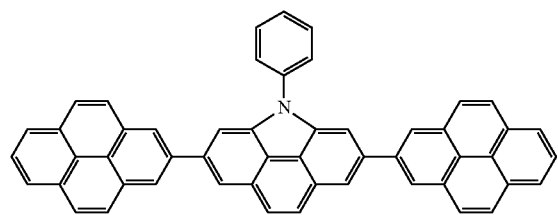
2
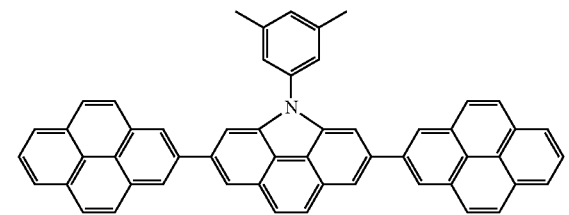
3
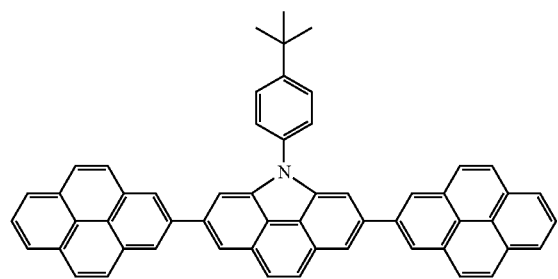
4
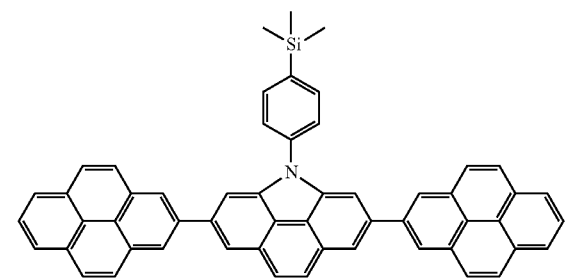
5
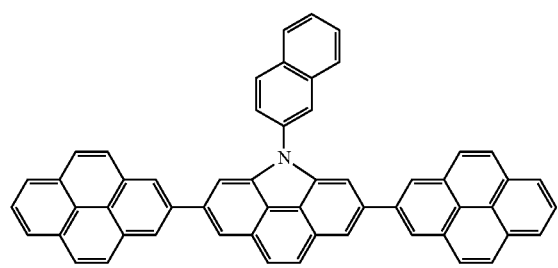
6
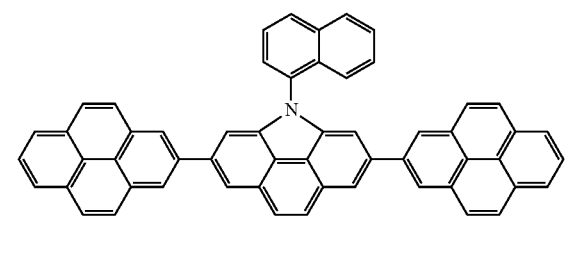
7
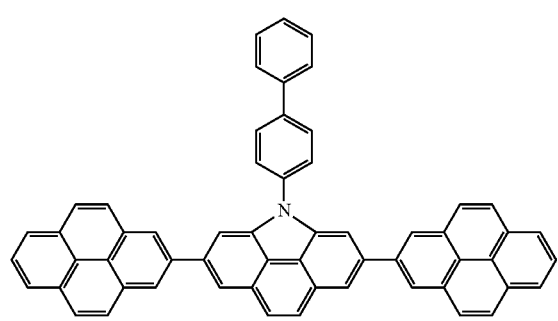
8
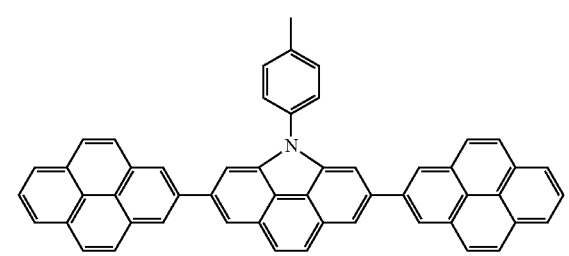
9
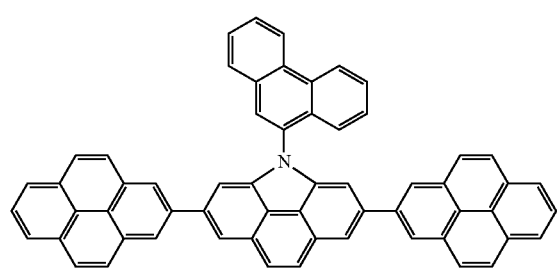
10
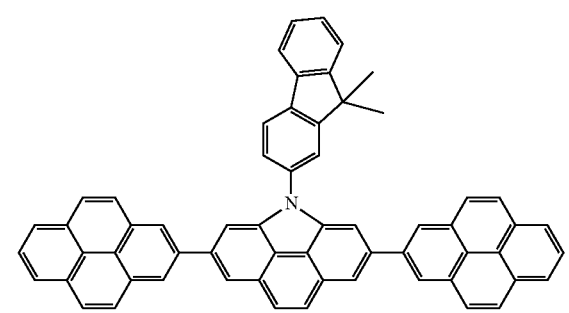

-continued
121
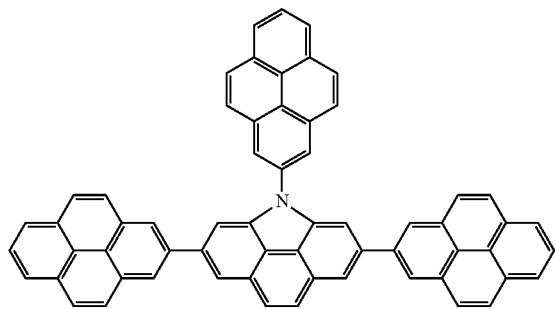
122
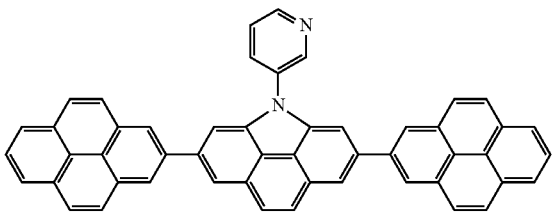
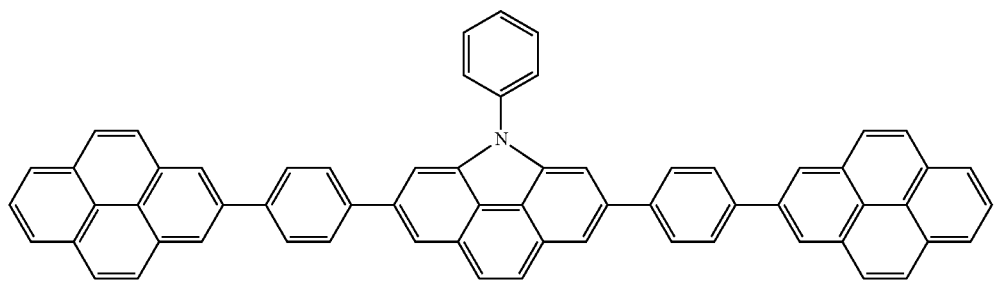
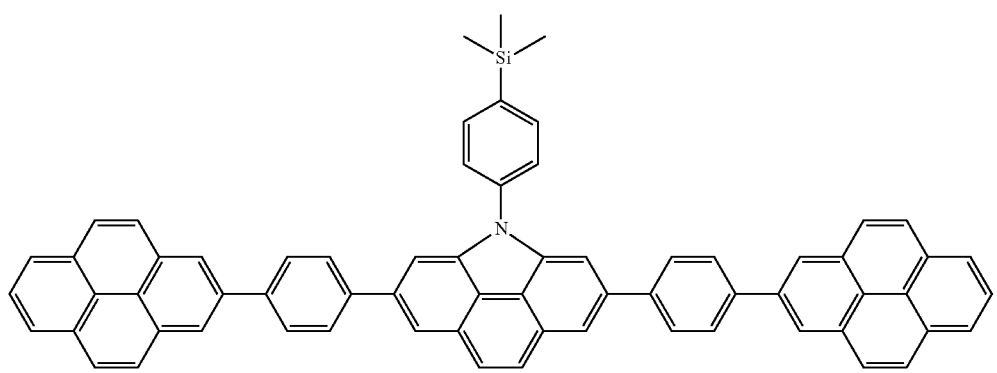
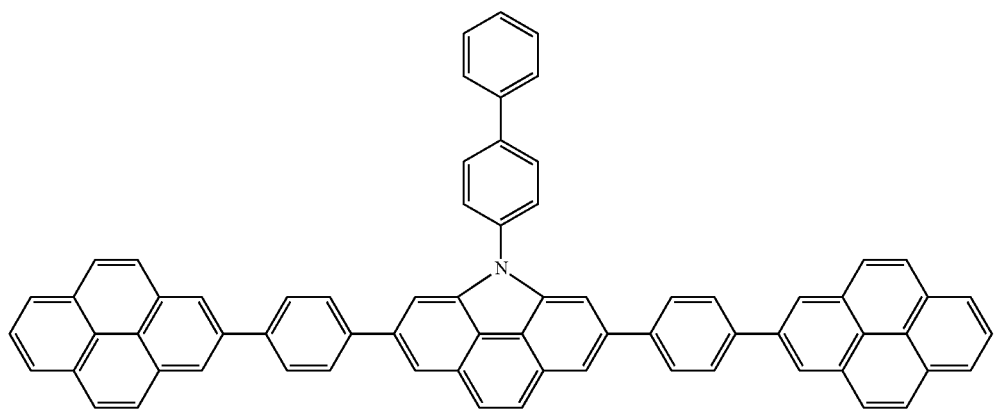

-continued
16
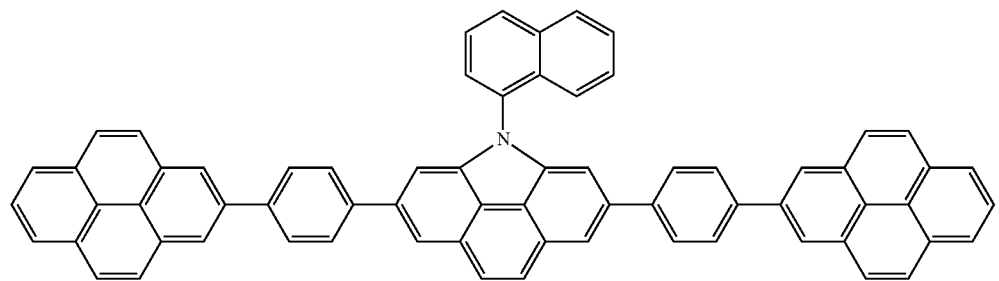
17
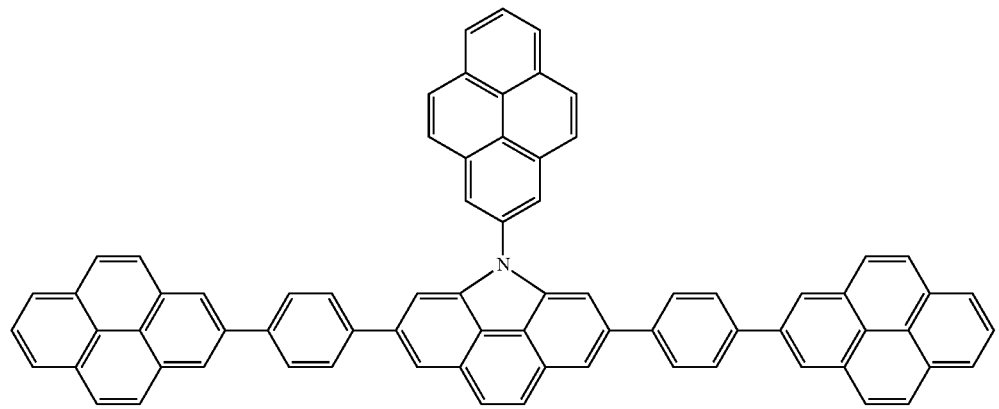
18
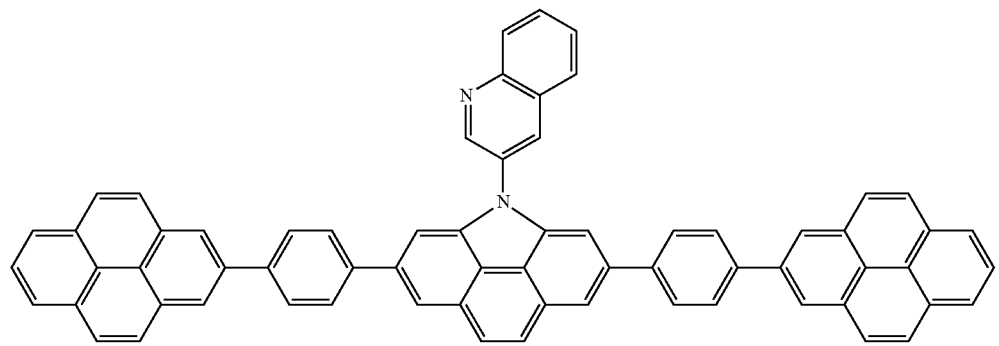
19
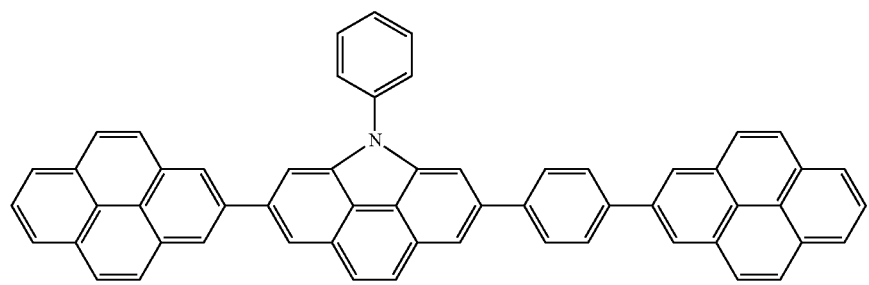

-continued
20
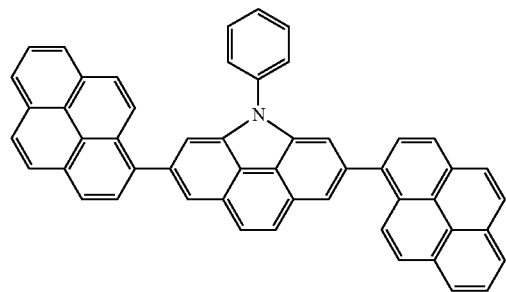
21
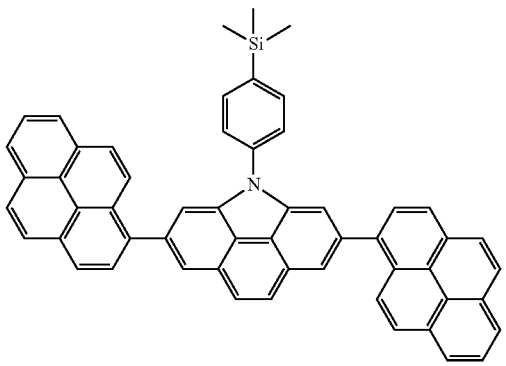
22
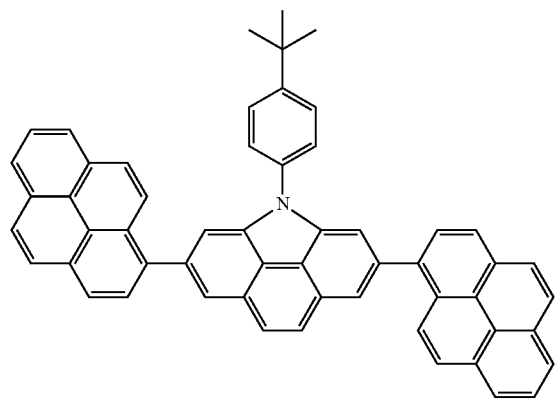
23
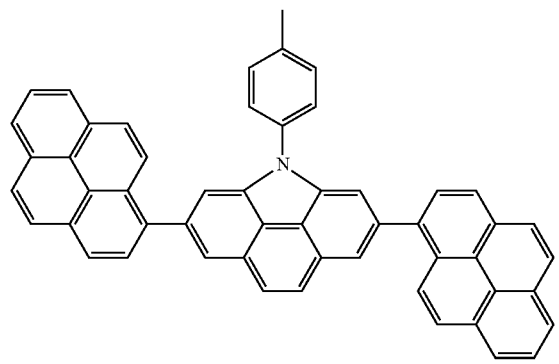
24
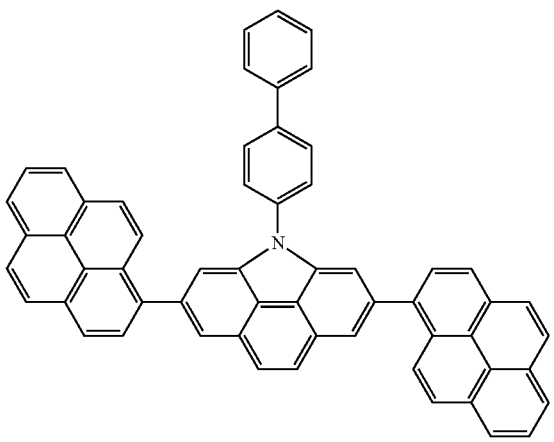
25
26
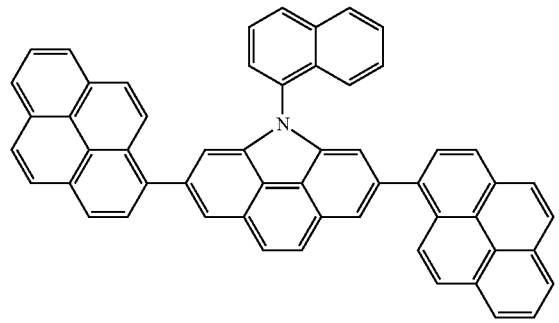
27
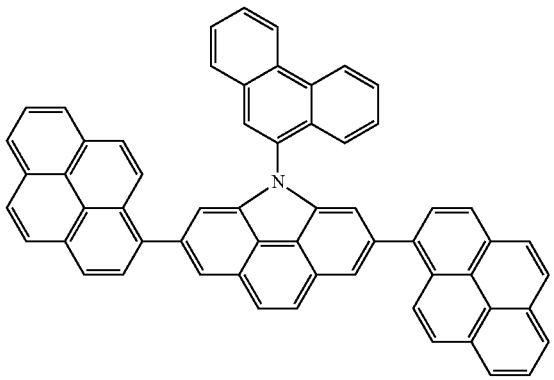

-continued
28
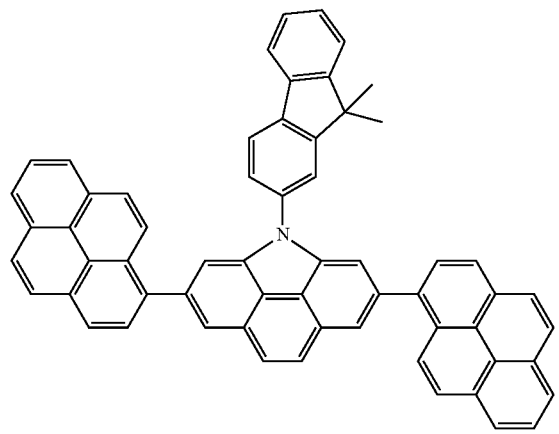
29
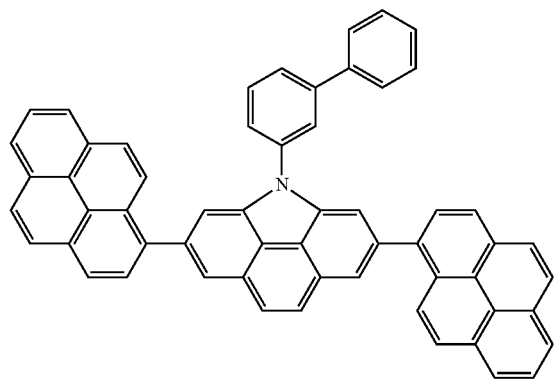
30
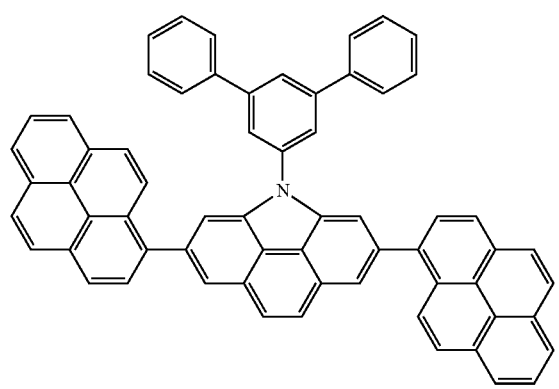
31
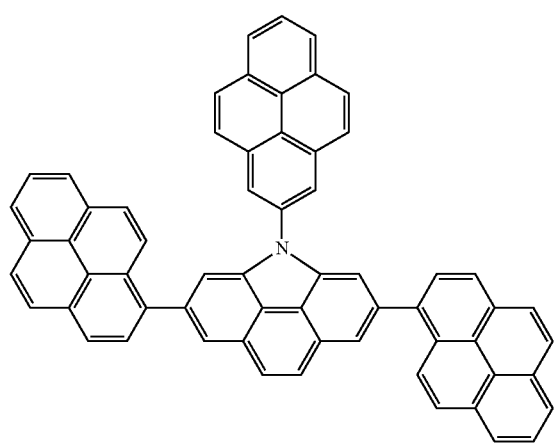
32
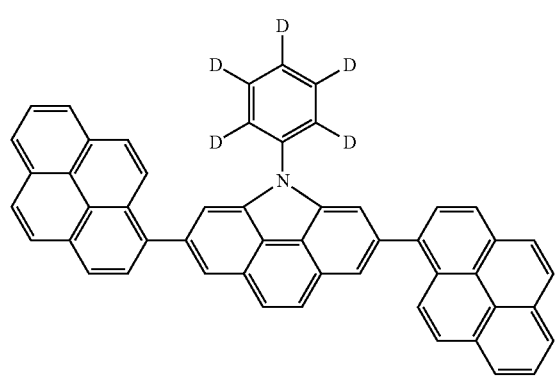
33
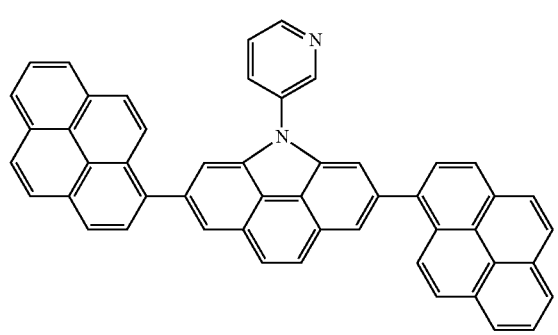
34
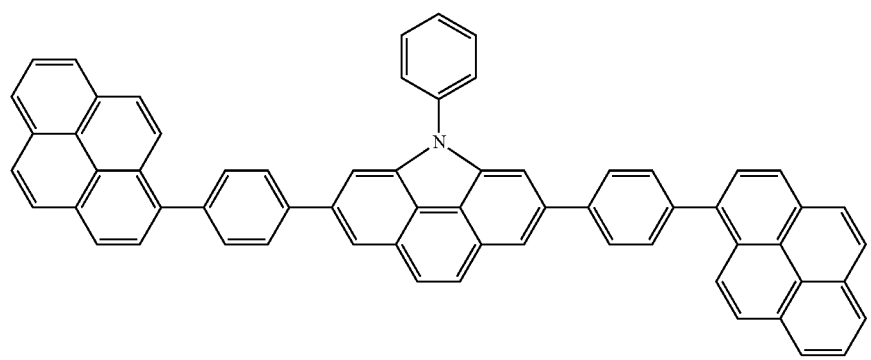

-continued
35
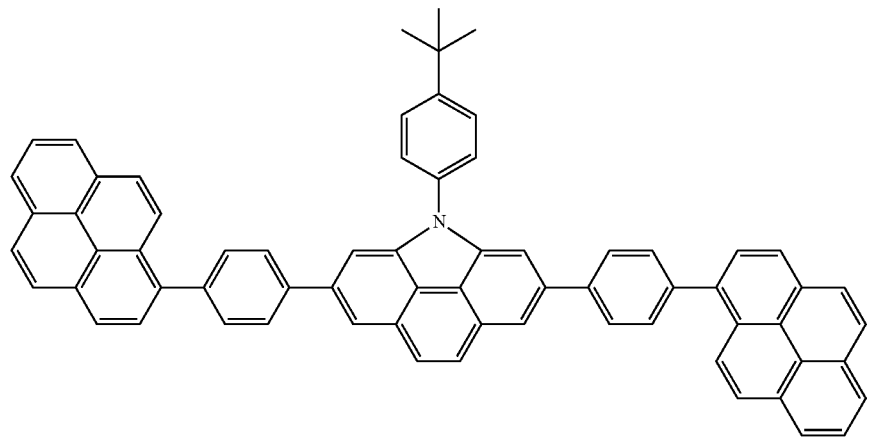
36
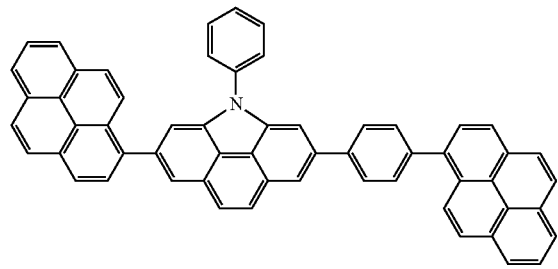
37
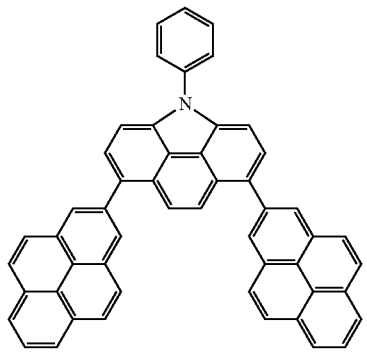
38
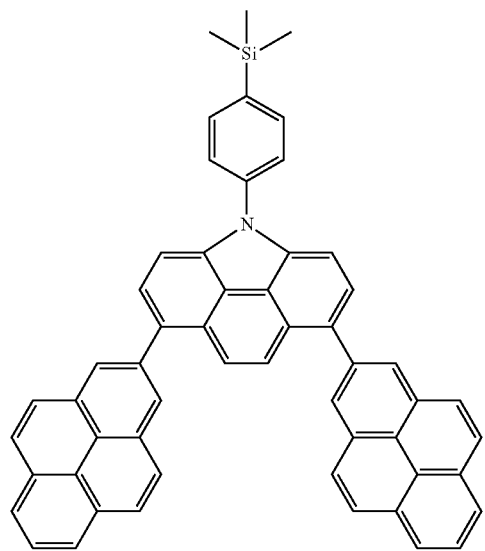
39
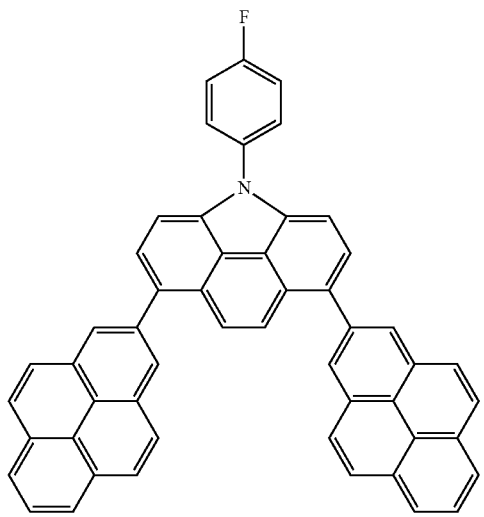

-continued
40
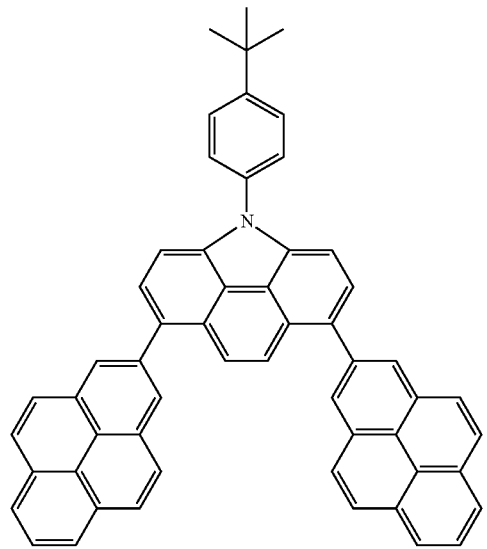
41
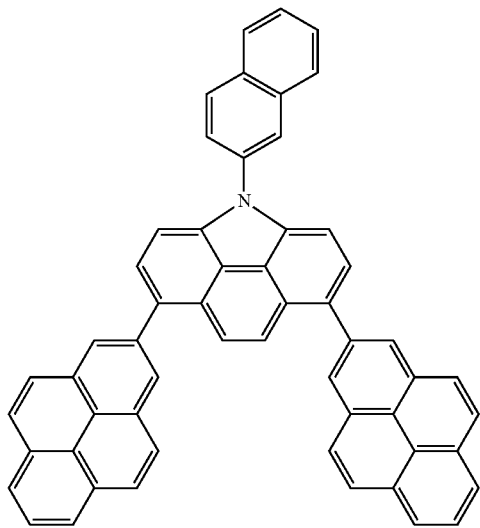
42
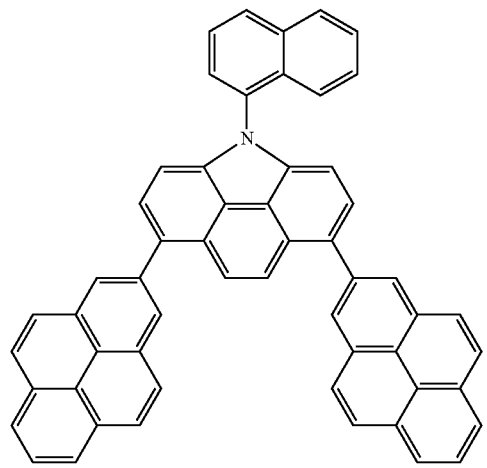
43
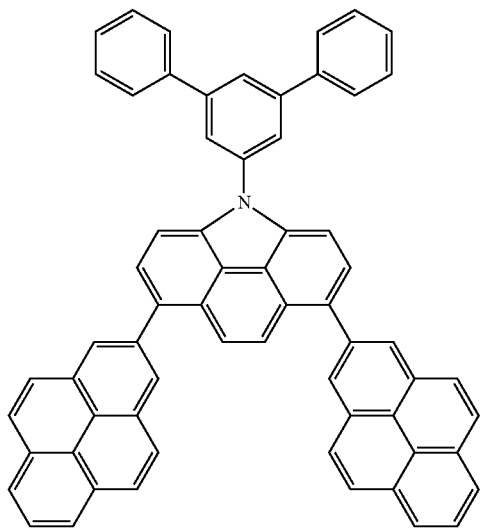
44
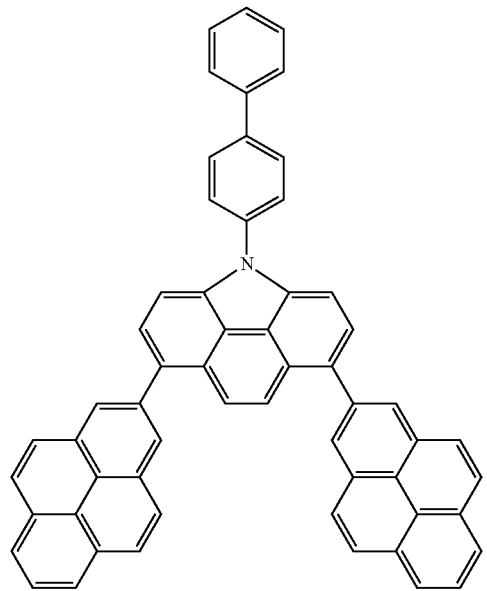
45
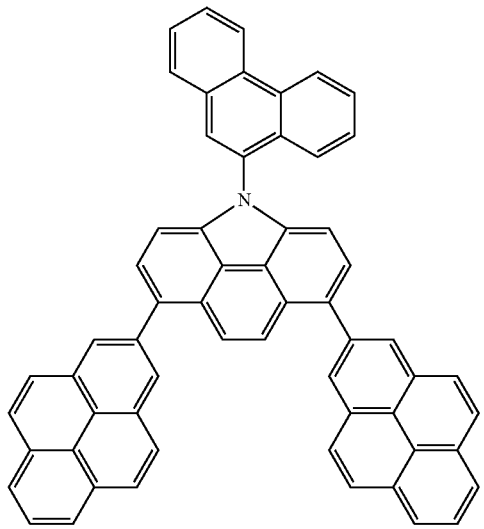

46
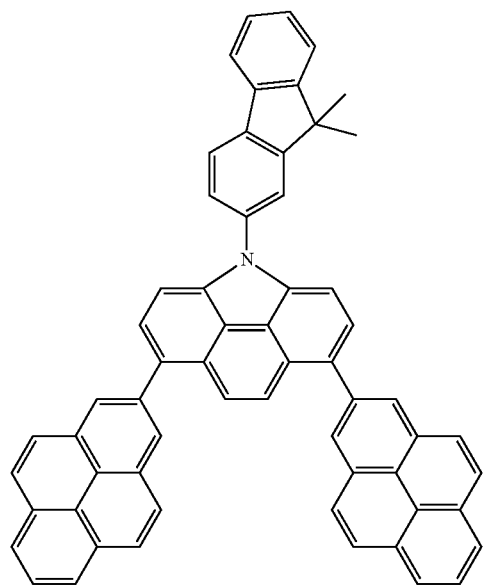
47
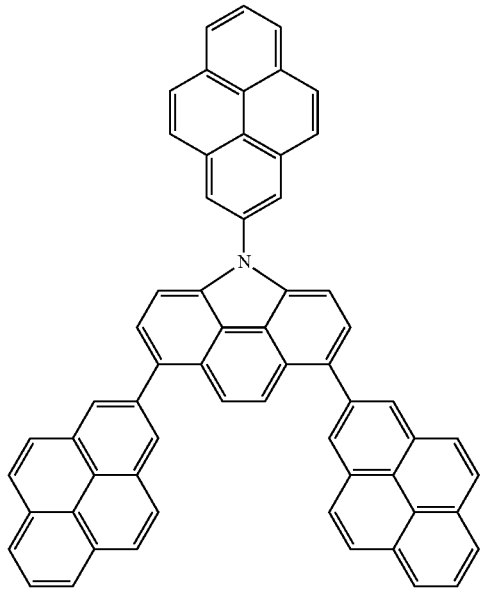
48
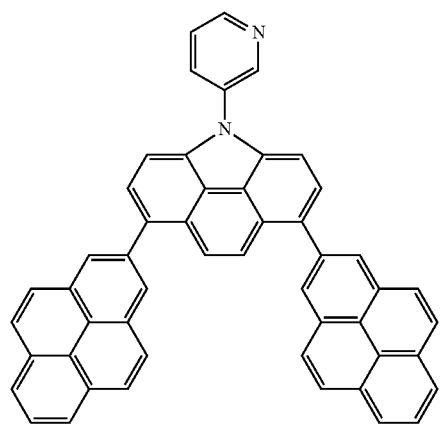
49
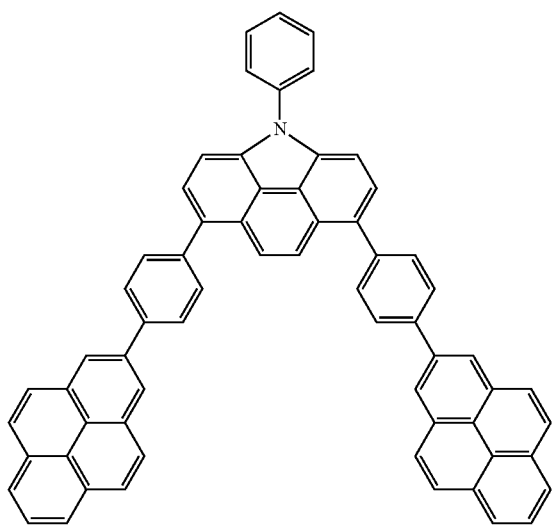

50
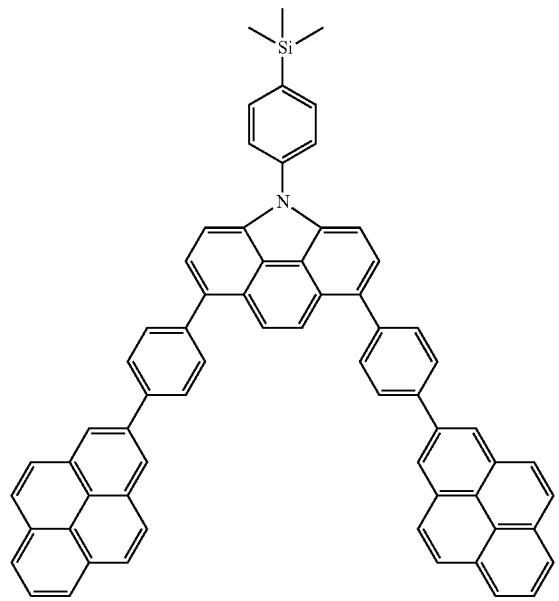
51
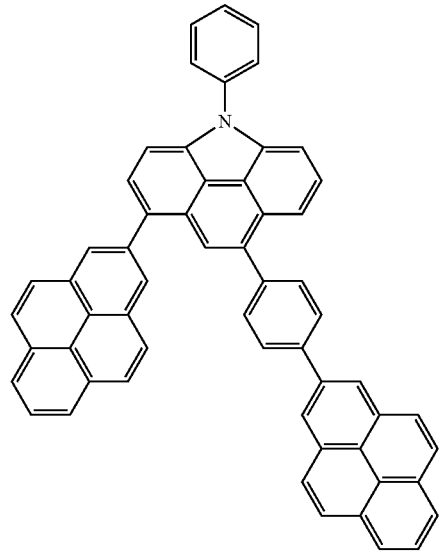
52
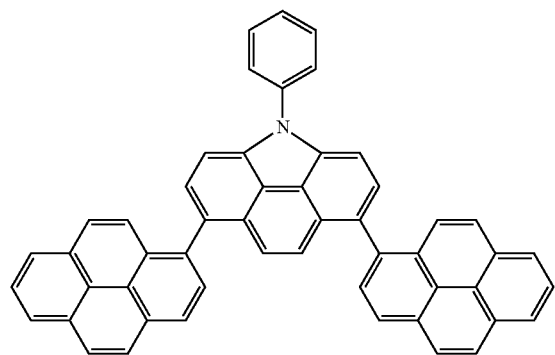
53
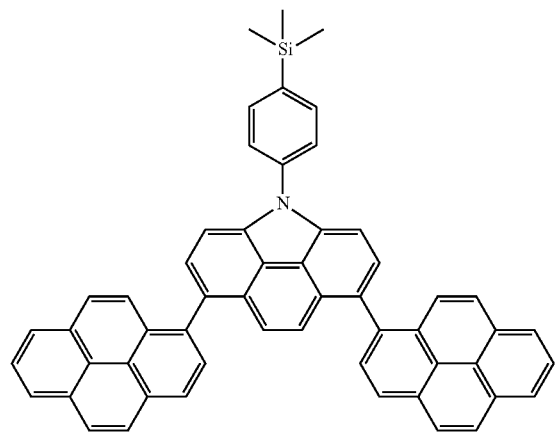
54
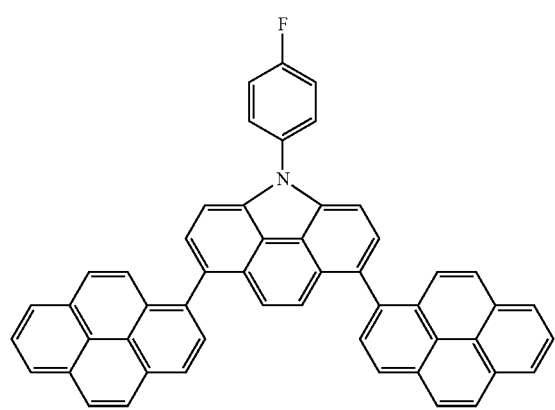
55
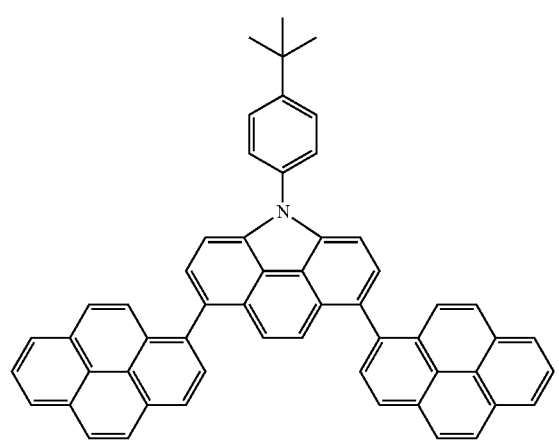

56
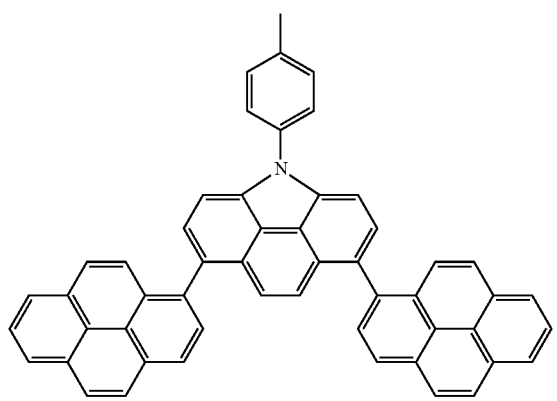
57
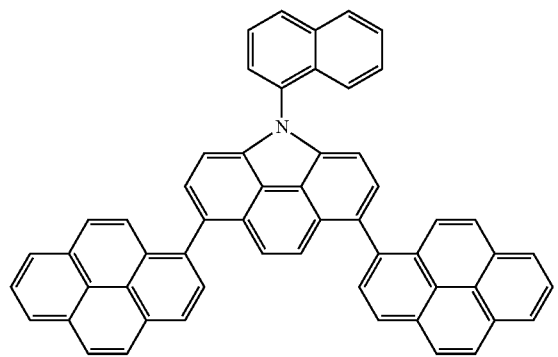
58
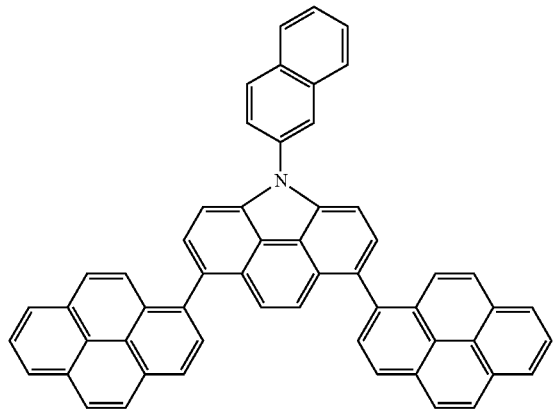
59
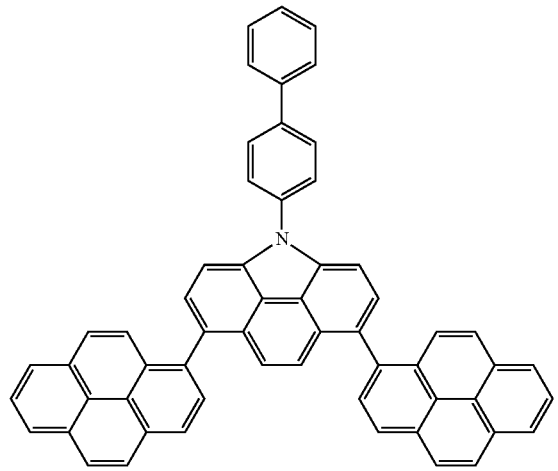
60
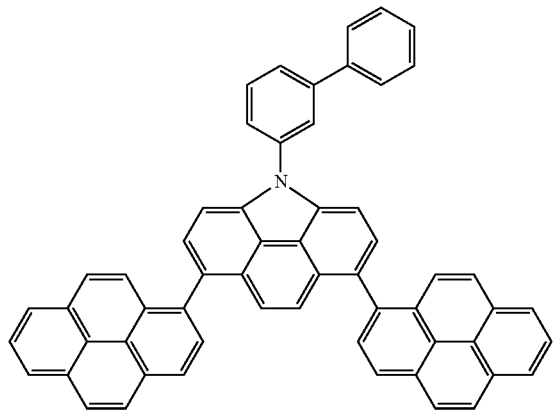
61
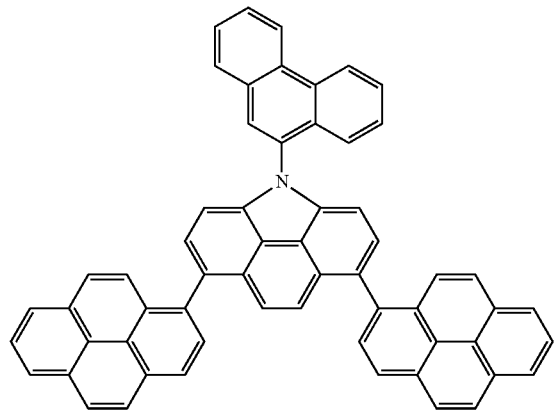

-continued
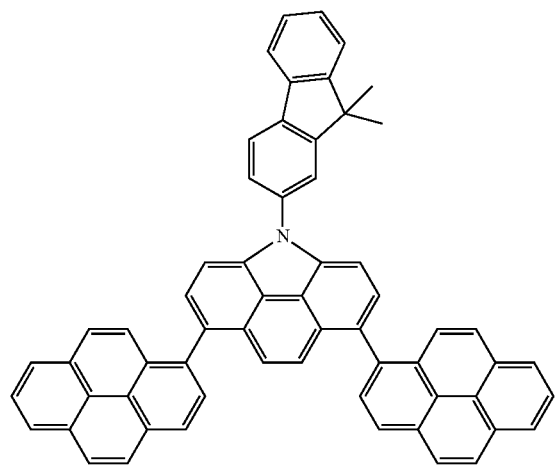
62
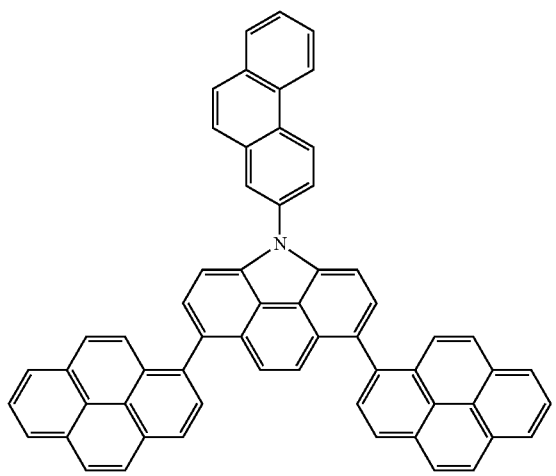
63
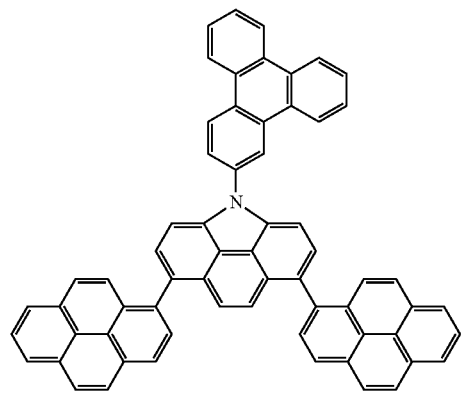
64
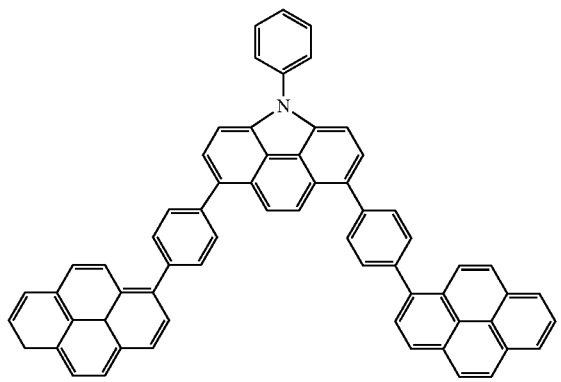
65
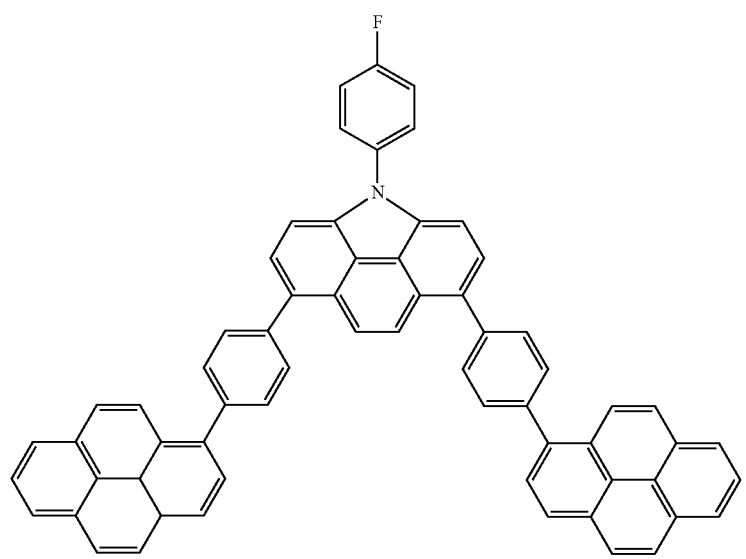
66

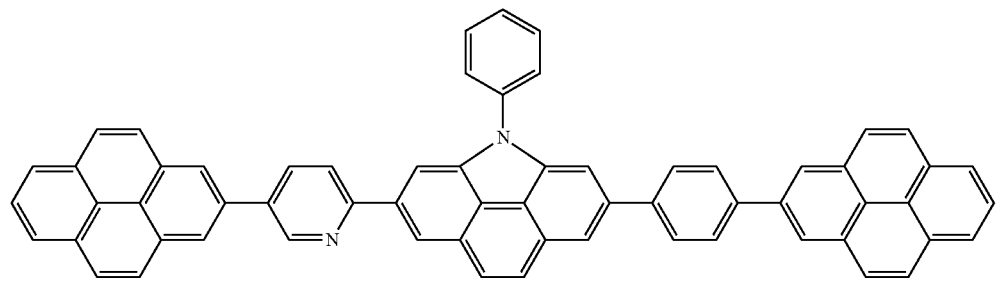

67

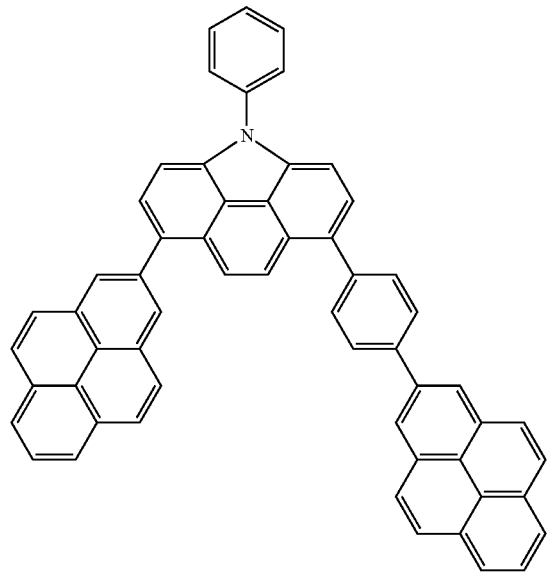

68

8. An organic light-emitting device, comprising:
a first electrode;
a second electrode; and
an organic layer between the first electrode and the second electrode,
wherein the organic layer includes the compound as claimed in claim 1.

9. The organic light-emitting device as claimed in claim 8, wherein the organic layer is an emission layer, and the compound is a host in the emission layer.

10. The organic light-emitting device as claimed in claim 8, wherein the organic layer is an emission layer, and the compound is a fluorescent host in the emission layer.

11. The organic light-emitting device as claimed in claim 8, wherein:
the organic layer includes an emission layer, and further includes one of an electron injection layer, an electron transport layer, a functional layer having both electron injection and electron transport capabilities, a hole injection layer, a hole transport layer, or a functional layer having both hole injection and hole transport capabilities, and
the emission layer includes an anthracene-based compound, an aryamine-based compound, or a styryl-based compound.

12. The organic light-emitting device as claimed in claim 8 wherein:
the organic layer includes an emission layer, and further includes one of an electron injection layer, an electron transport layer, a functional layer having both electron injection and electron transport capabilities, a hole injection layer, a hole transport layer, or a functional layer having both hole injection and hole transport capabilities,
the emission layer includes any one of a red emission layer, a green emission layer, a blue emission layer, or a white emission layer, and
the any one of the red emission layer, the green emission layer, the blue emission layer, and the white emission layer of the emission layer includes a phosphorescent compound.

13. The organic light-emitting device as claimed in claim 12, wherein:
the organic layer includes one of the hole injection layer, the hole transport layer, or the functional layer having both hole injection and hole transport capabilities, and
the one of the hole injection layer, the hole transport layer, or the functional layer having both hole injection and hole transport capabilities includes a charge-generation material.

14. The organic light-emitting device as claimed in claim 13, wherein the charge-generation material is a p-dopant.

15. The organic light-emitting device as claimed in claim 14, wherein the p-dopant is a quinone derivative.

16. The organic light-emitting device as claimed in claim 14, wherein the p-dopant is a metal oxide.

17. The organic light-emitting device as claimed in claim 14, wherein the p-dopant is a cyano group-containing compound.

18. The organic light-emitting device as claimed in claim 8, wherein the organic layer includes an electron transport layer, the electron transport layer including a metal complex.

19. The organic light-emitting device as claimed in claim 18, wherein the metal complex is a lithium (Li) complex.

20. The organic light-emitting device as claimed in claim 18, wherein the metal complex is lithium quinolate (LiQ).

21. The organic light-emitting device as claimed in claim 18, wherein the metal complex is Compound 203 below.

<Compound 203>

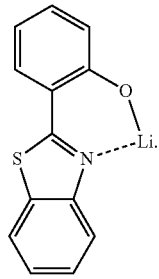

22. The organic light-emitting device as claimed in claim 8, wherein the organic layer is formed by a wet process.

23. A flat display apparatus comprising the organic light-emitting device as claimed in claim 8, wherein the first electrode of the organic light-emitting device is electrically connected to a source or a drain electrode of a thin film transistor.

* * * * *